US012802722B2

(12) United States Patent
Lee et al.

(10) Patent No.: US 12,802,722 B2
(45) Date of Patent: Nov. 17, 2026

(54) WORDLINE CONTACT FORMATION FOR NAND DEVICE

(71) Applicant: Applied Materials, Inc., Santa Clara, CA (US)

(72) Inventors: Hsiang Yu Lee, Cupertino, CA (US); Pradeep K. Subrahmanyan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 6 days.

(21) Appl. No.: 18/640,422

(22) Filed: Apr. 19, 2024

(65) Prior Publication Data

US 2024/0363150 A1 Oct. 31, 2024

Related U.S. Application Data

(60) Provisional application No. 63/498,203, filed on Apr. 25, 2023.

(51) Int. Cl.
*G11C 5/06* (2006.01)
*G11C 16/04* (2006.01)
(Continued)

(52) U.S. Cl.
CPC .......... *G11C 5/063* (2013.01); *G11C 16/0483* (2013.01); *H10B 41/10* (2023.02);
(Continued)

(58) Field of Classification Search
CPC ..... G11C 16/0483; G11C 16/08; G11C 5/063; H01L 21/0274; H01L 21/31144;
(Continued)

(56) References Cited

U.S. PATENT DOCUMENTS 11,171,050 B2 11/2021 Yatsuda
2016/0064281 A1 3/2016 Izumi
(Continued)

FOREIGN PATENT DOCUMENTS

CN 111755459 A 10/2020
TW 202017150 A 5/2020
TW 202306045 A 2/2023

OTHER PUBLICATIONS

International Search Report and Written Opinion for International Application No. PCT/US2024/025416, mailed Aug. 8, 2024, 9 Pages.
(Continued)

*Primary Examiner* — Wael M Fahmy
(74) *Attorney, Agent, or Firm* — KDW Firm PLLC

(57) ABSTRACT

Disclosed are approaches for wordline contact formation for 3D NAND devices. Methods may include providing a film stack of alternating first layers and second layers, forming a first lithography mask over the film stack, and performing a first series of alternating lithography and etch processes to form an array of contact opening pairs in the film stack, wherein an opening through the first lithography mask is expanded in a first direction following each etch process, and wherein a depth of the array of contact opening pairs varies in the first direction. The method may further include forming a second lithography mask over the film stack, and performing a second series of alternating lithography and etch processes, wherein an opening through the second lithography mask is expanded in a second direction following each etch process, and wherein the depth of the array of contact opening pairs varies in the second direction.

20 Claims, 69 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10P 76/20*** | (2026.01) |

(52) U.S. Cl.
CPC ............. *H10B 41/27* (2023.02); *H10B 41/35* (2023.02); *H10B 43/10* (2023.02); *H10B 43/27* (2023.02); *H10B 43/35* (2023.02); *H10P 76/2041* (2026.01)

(58) Field of Classification Search
CPC ........... H01L 21/3212; H01L 21/76805; H01L 21/76816; H01L 21/76831; H01L 21/7684; H01L 21/76843; H01L 21/76895; H01L 23/535; H10B 41/27; H10B 41/35; H10B 43/10; H10B 43/27; H10B 43/35; H10B 43/50; H10B 41/10; H10B 41/50
See application file for complete search history.

(56) References Cited

U.S. PATENT DOCUMENTS

| | | | | |
|---|---|---|---|---|
| 2018/0166384 | A1 | 6/2018 | Lee | |
| 2019/0067299 | A1 | 2/2019 | Huang | |
| 2019/0074249 | A1 | 3/2019 | Sasaki | |
| 2021/0125861 | A1 | 4/2021 | Hopkins | |
| 2021/0265378 | A1 | 8/2021 | Takeshita | |
| 2021/0287991 | A1 | 9/2021 | Sun | |
| 2024/0365545 | A1 * | 10/2024 | Lee ........................ | H10B 43/27 |

OTHER PUBLICATIONS

International Search Report and Written Opinion for International Application No. PCT/US2024/025247, mailed on Aug. 20, 2024, 10 pages.

* cited by examiner

WORDLINE CONTACT FORMATION FOR NAND DEVICE

RELATED APPLICATION

This application claims priority to U.S. provisional patent application Ser. No. 63/498,203, filed on Apr. 25, 2023, entitled "Wordline Contact Formation for NAND Device," which is incorporated herein by reference in its entirety.

FIELD

The present embodiments relate to processing of NAND devices and, more particularly, to approaches for wordline contact formation for 3D NAND devices.

BACKGROUND

In accordance with current substrate (e.g., wafer) manufacturing approaches, etch speed, etch profile, and etch selectivity are optimized to lower manufacturing cost and increase circuit element density on a substrate. Etch features, such as memory holes, continue to shrink in size and/or increase in aspect ratio (e.g., ratio of depth to width of a feature), however. For example, in three dimensional (3D) NAND device manufacturing, substrates can include up to 96 layers and can extend up to 128 layers. Additionally, an aspect ratio of a memory hole, for example, can be between 100 to 200 with a memory hole depth ranging from about 6 μm to 8 μm, thus making memory hole etching one of the most critical and challenging steps when manufacturing 3D NAND devices. For example, such high aspect ratio etching not only requires high etching speed and high etching selectivity, e.g., to mask material on a substrate, but it also requires a straight profile without bowing and twisting, no under-etch and minimum micro-loading, minimum aspect ratio dependent etching (ARDE), and uniformity across the entire substrate (e.g., critical dimension (CD) variation of $3\sigma<1\%$).

When manufacturing 3D NAND devices having a staircase arrangement of layers, wordline landing pad formation may be defined first through staircase formation (e.g., lithography and etch steps) and/or a chop process in which multiple layers are etched down, followed by a staircase area gap fill. However, selectivity margin during wordline contact etching remains a challenge, as contact holes with different height are formed in a same etch step. Furthermore, using higher dry etch-process temperatures to increase selectivity is constrained by hardware limits.

Direct wordline contact formation is one approach used to form wordline contacts, as it can skip the landing pad formation steps. However, lithography cost scales upwards due to the multiple lithography and etch steps needed to form all wordline contacts, especially for contact first approaches. Furthermore, endpoint control is challenging because ARDE plays an important role in dry etching.

It is with respect to these and other considerations that the present disclosure is provided.

SUMMARY OF THE DISCLOSURE

In view of the foregoing, a method may include providing a film stack of alternating first layers and second layers, forming a first lithography mask over the film stack, and performing a first series of alternating lithography and etch processes to form an array of contact opening pairs in the film stack, wherein an opening through the first lithography mask is expanded in a first direction following each etch process, and wherein a depth of the array of contact opening pairs varies in the first direction. The method may further include forming a second lithography mask over the film stack, and performing a second series of alternating lithography and etch processes, wherein an opening through the second lithography mask is expanded in a second direction following each etch process, and wherein the depth of the array of contact opening pairs varies in the second direction.

In some approaches, a method of forming a 3D NAND device may include forming a patterned hardmask and a first lithography mask over a film stack, wherein the film stack comprises a plurality of alternating first layers and second layers, forming an opening through the first lithography mask, and etching the film stack, through the opening of the first lithography mask, to form a first plurality of contact openings in the film stack. The method may further include processing the first lithography mask to expand the opening of the first lithography mask in a first direction, and etching the film stack, through the opening of the first lithography mask, to form a second plurality of contact openings in the film stack, wherein a depth of the first plurality of contact openings increases as the second plurality of contact openings are formed. The method may further include forming a second lithography mask over the film stack, forming an opening through the second lithography mask, and etching the film stack, through the opening of the second lithography mask, to increase a depth of a subset of the first plurality of contact openings and a subset of the second plurality of contact openings. The method may further include processing the second lithography mask to expand the opening of the second lithography mask in a second direction, wherein the second direction is orthogonal to the first direction, and etching the film stack, through the opening of the second lithography mask, to increase a depth of a second subset of the first plurality of contact openings and a second subset of the second plurality of contact openings, wherein the depth of the first and second plurality of contact openings varies in the first direction and the second direction.

In some approaches, a system may include a processor, and a memory storing instructions executable by the processor to form a patterned hardmask and a first lithography mask over a film stack, wherein the film stack comprises a plurality of alternating first layers and second layers, form an opening through the first lithography mask, and etch the film stack, through the opening of the first lithography mask, to form a first plurality of contact openings in the film stack. The memory may further store instructions executable by the processor to process the first lithography mask to expand the opening of the first lithography mask in a first direction, and to etch the film stack, through the opening of the first lithography mask, to form a second plurality of contact openings in the film stack, wherein a depth of the first plurality of contact openings increases as the second plurality of contact openings are formed. The memory may further store instructions executable by the processor to form a second lithography mask over the film stack, form an opening through the second lithography mask, etch the film stack, through the opening of the second lithography mask, to increase a depth of a subset of the first plurality of contact openings and a subset of the second plurality of contact openings, and process the second lithography mask to expand the opening of the second lithography mask in a second direction, wherein the second direction is orthogonal to the first direction. The memory may further store instructions executable by the processor to etch the film stack, through the opening of the second lithography mask, to increase a depth of a second subset of the first plurality of contact openings and a second subset of the second plurality of contact openings, wherein the depth of the first and second plurality of contact openings varies in the first direction and the second direction.

BRIEF DESCRIPTION OF THE DRAWINGS

The accompanying drawings illustrate exemplary approaches of the disclosure, including the practical application of the principles thereof, as follows.

Figure 1A:
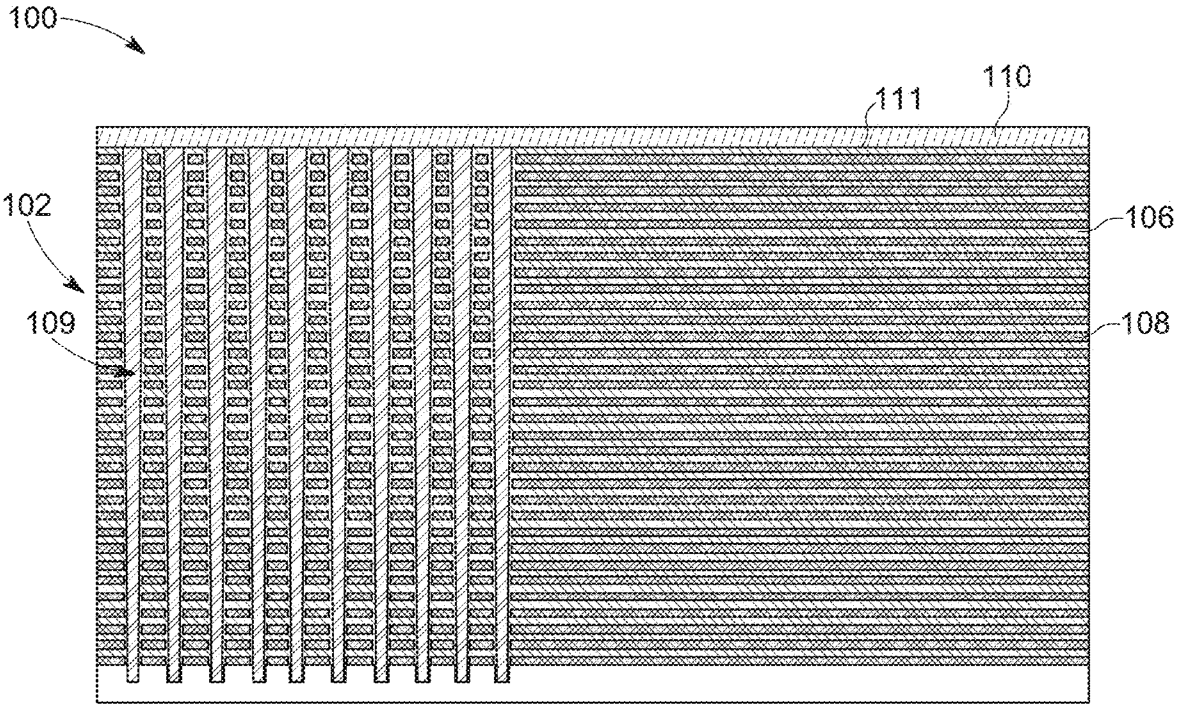
FIGS. 1A-1H illustrate side cross-sectional views of an example approach for forming a plurality of contact openings in a film stack of a device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein are directed to 3D NAND wordline contact formation approaches wherein a first series of alternating lithography and etch processes are performed on a film stack and lithography mask to form an array of contact opening pairs in the film stack. An opening through a first lithography mask may be expanded in a first direction following each etch process to cause a depth of the array of contact opening pairs to vary in the first direction. The method may further include forming a second lithography mask (or masks) over the film stack, and performing a second series of alternating lithography and etch processes, wherein an opening through the second lithography mask is expanded in a second direction following each etch process to cause the depth of the array of contact opening pairs to vary in the second direction.

As a result, embodiments of the present disclosure may utilize a staircase and chop approach to group multiple direct wordline contact holes in a stadium fashion to advantageously reduce the number of photolithography steps, reduce the maximum delta ON pairs for better dry etching endpoint control, and to reduce wordline contact length to minimize impact on bit density.

FIG. 1A illustrates a side cross-sectional view of a memory device (hereinafter "device") 100 at an early stage of processing, according to one or more embodiments described herein. The device 100 may include a film stack 102 having a plurality of alternating horizontal first layers 106 and second layers 108 stacked atop one another. The film stack 102 may be a part of a memory cell device, such as a three-dimensional (3D) memory device (e.g., NAND). Although non-limiting, the first layers 106 may be a dielectric material, such as silicon oxide (SiO), and the second layers 108 may be a second dielectric material, such as silicon nitride. In other embodiments, suitable dielectric materials for the first layers 106 and/or the second layers 108 may include silicon oxynitride, silicon carbide, silicon oxycarbide, titanium nitride, composite of oxide and nitride, at least one or more oxide layers sandwiching a nitride layer, and combinations thereof, among others.

As further shown, the film stack 102 may include a plurality of bottom tier channel holes 109, which are formed by etching and gap filling. The device 100 may include a hardmask 110 formed over the film stack 102. In some embodiments, the hardmask 110 is a layer of tungsten (W) formed directly atop an upper surface 111 of the film stack 102.

Figure 1B:
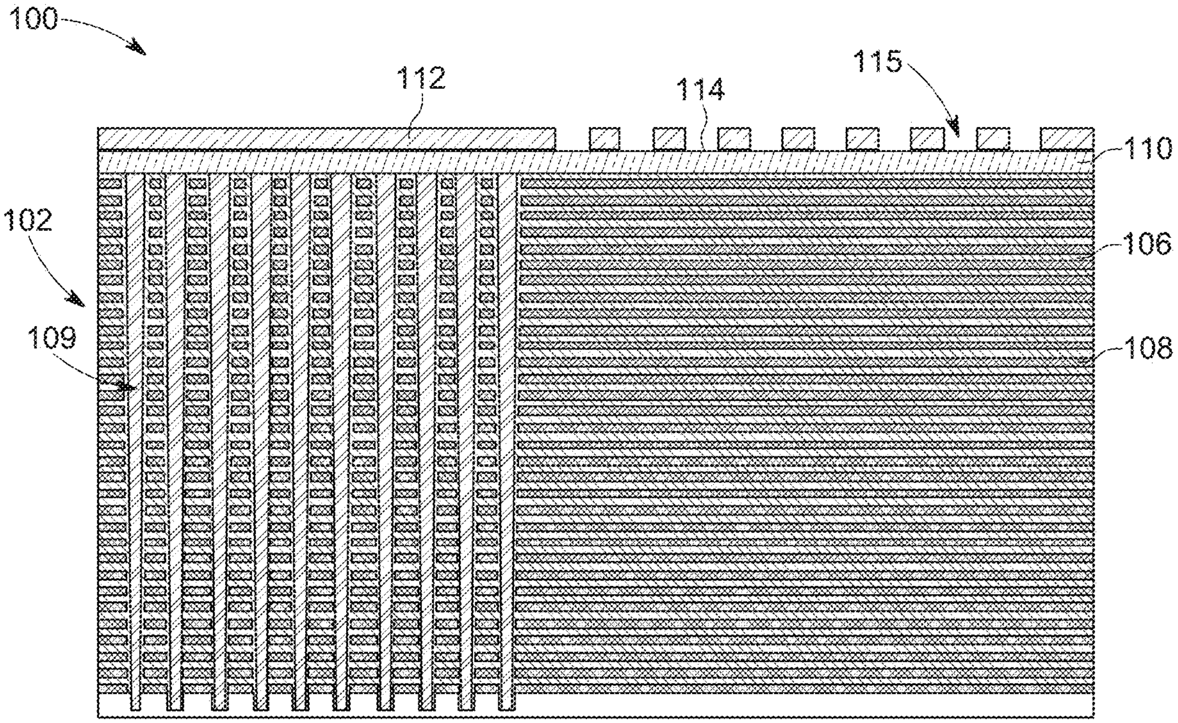

As shown in FIG. 1B, a photoresist mask 112 may then be formed over the hardmask 110, and a plurality of hardmask openings 115 may be patterned (etched) though the photoresist mask 112 to expose an upper surface 114 of the hardmask 110.

Figure 1C:
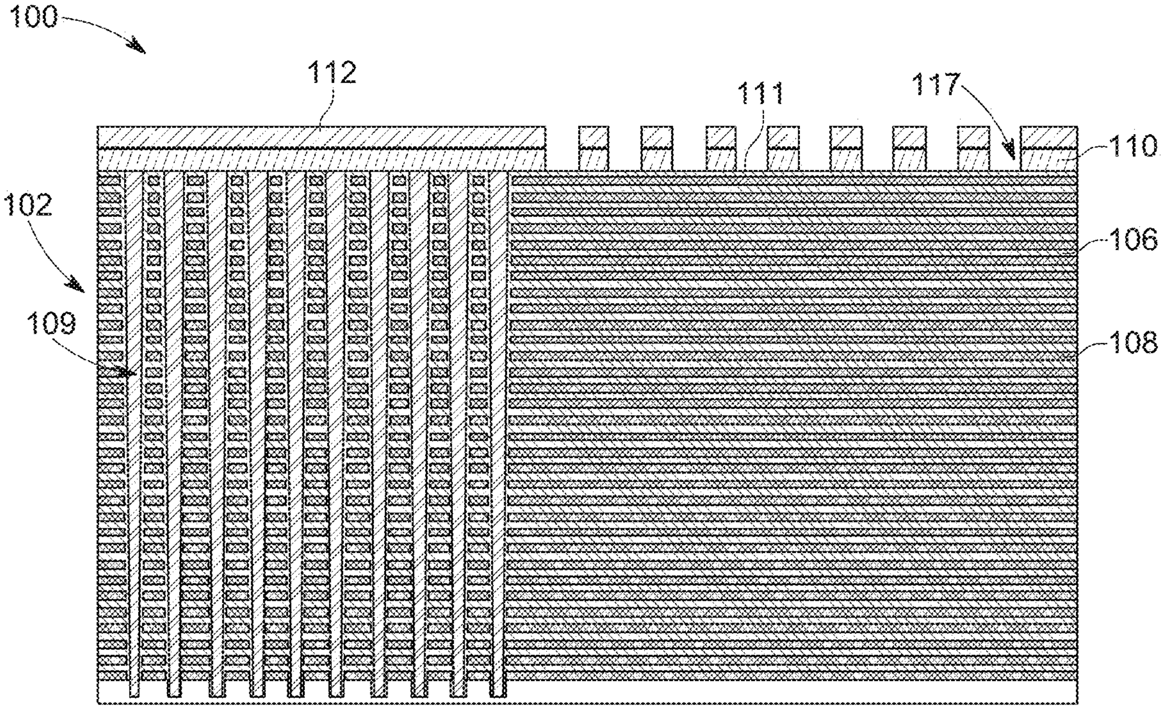

As shown in FIG. 1C, the hardmask 110 may be etched through the hardmask openings 115 of the photoresist mask 112 to form a plurality of openings 117 therethrough. As shown, the plurality of openings 117 may be formed selective to the upper surface 111 of the film stack 102.

Figure 1D:
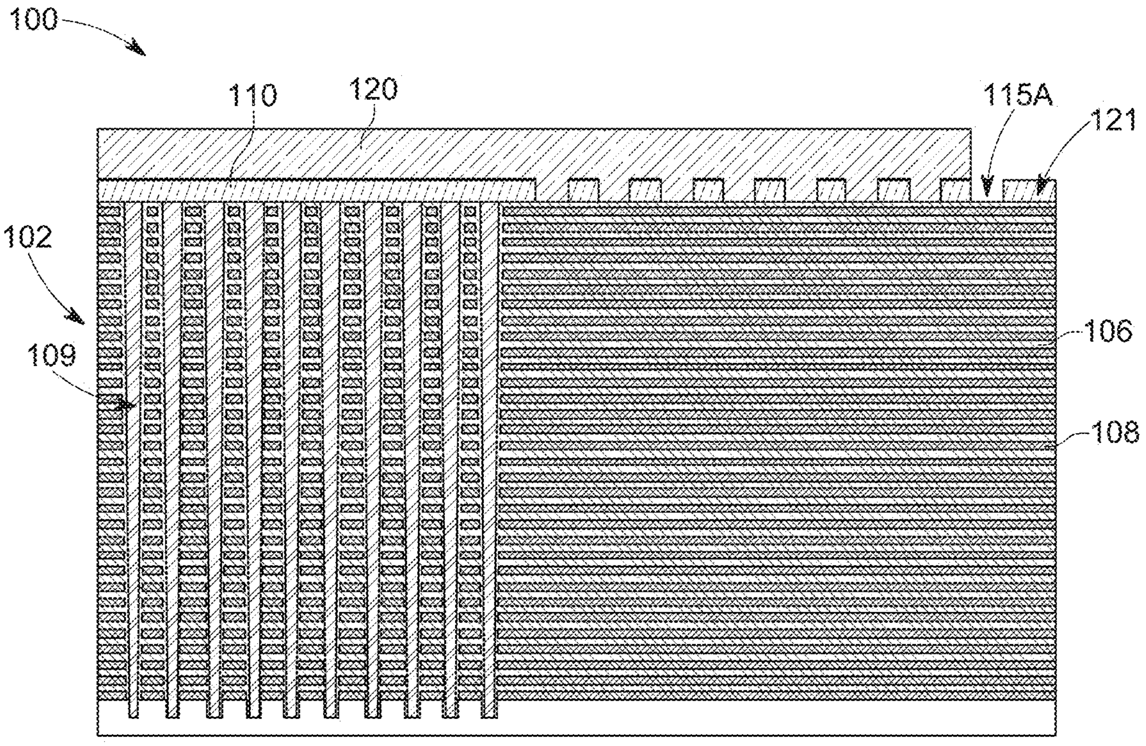

As shown in FIG. 1D, a first photoresist mask 120 may then be formed over the device 100 without being formed over a portion 121 of the hardmask 110 or over opening 115A.

Figure 1E:
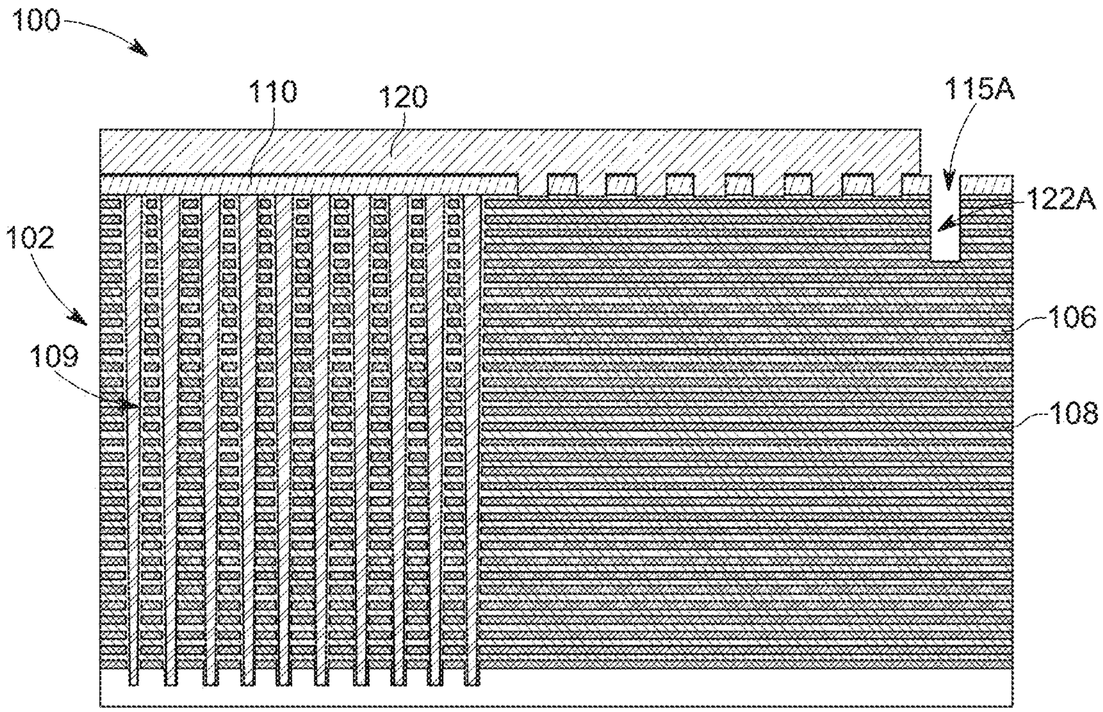

As shown in FIG. 1E, the device 100 may then be processed (e.g., etched) to form a first contact opening 122A in the film stack 102. The first contact opening 122A may be formed beneath opening 115A of the hardmask 110.

Figure 1F:
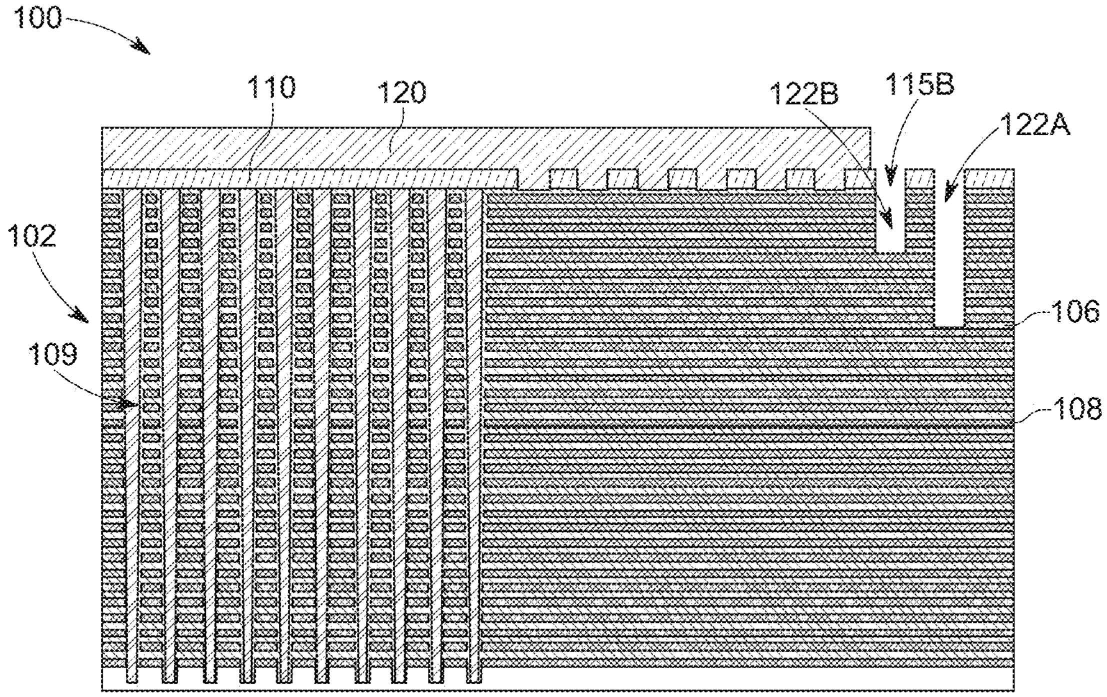
Figure 1G:
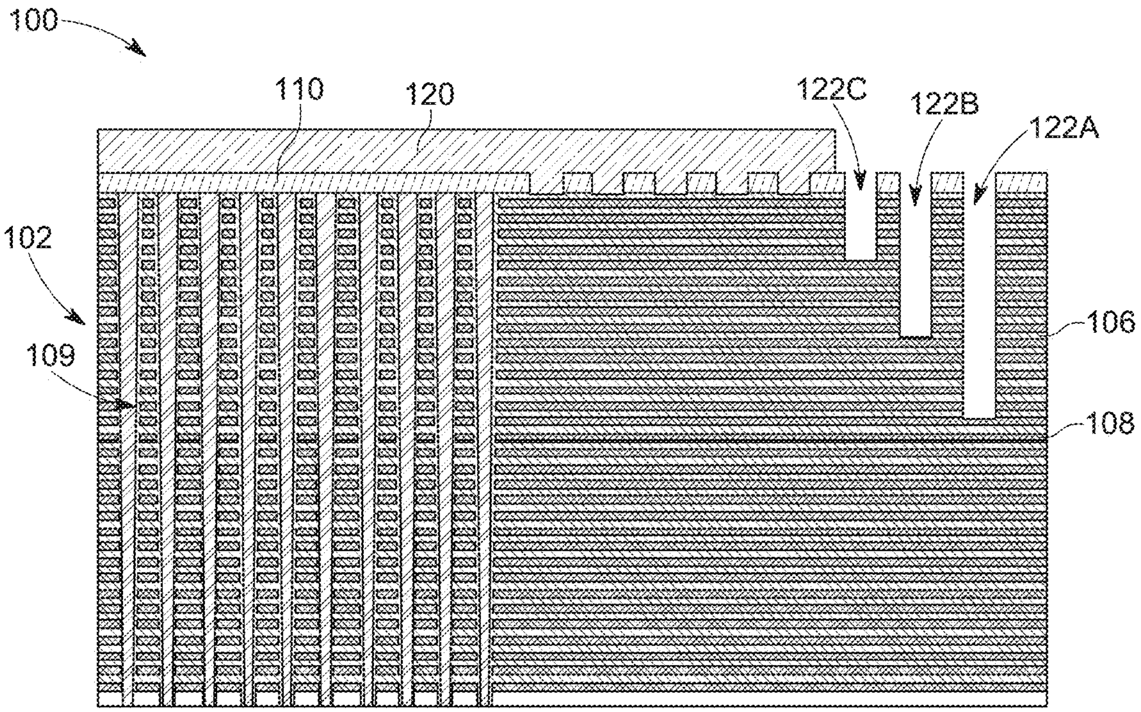
Figure 1H:
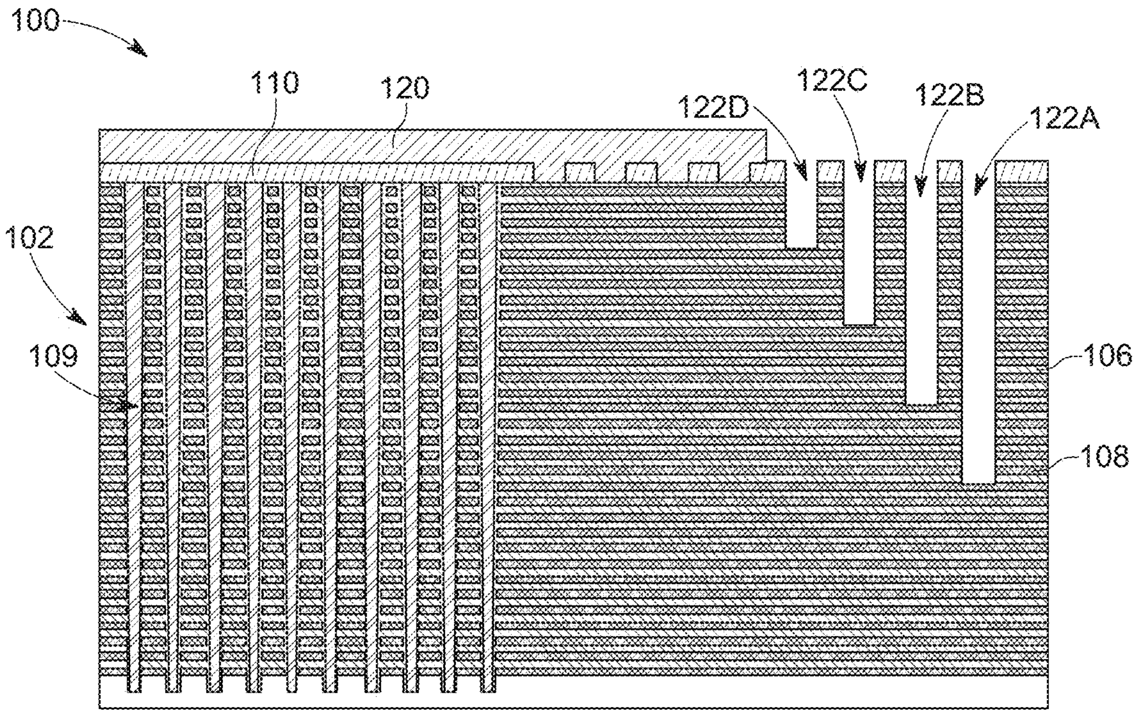

As shown in FIG. 1F, the first photoresist mask 120 may then be recessed laterally (e.g., horizontally) to expose opening 115B of the hardmask 110, and a second contact opening 122B may be formed in the film stack 102. As demonstrated, the first contact opening 122A is further etched at the same time as the second contact opening 122B, thus increasing an etch depth thereof. This "staircase" process is continued, as demonstrated in FIGS. 1G-1H, to form additional contact openings 122C, 122D in the film stack 102. It will be appreciated that the number contact openings is not dispositive, and may be increased or decreased, as desired, depending on the number of first and second layers 106, 108 in the film stack 102.

Figure 2A:
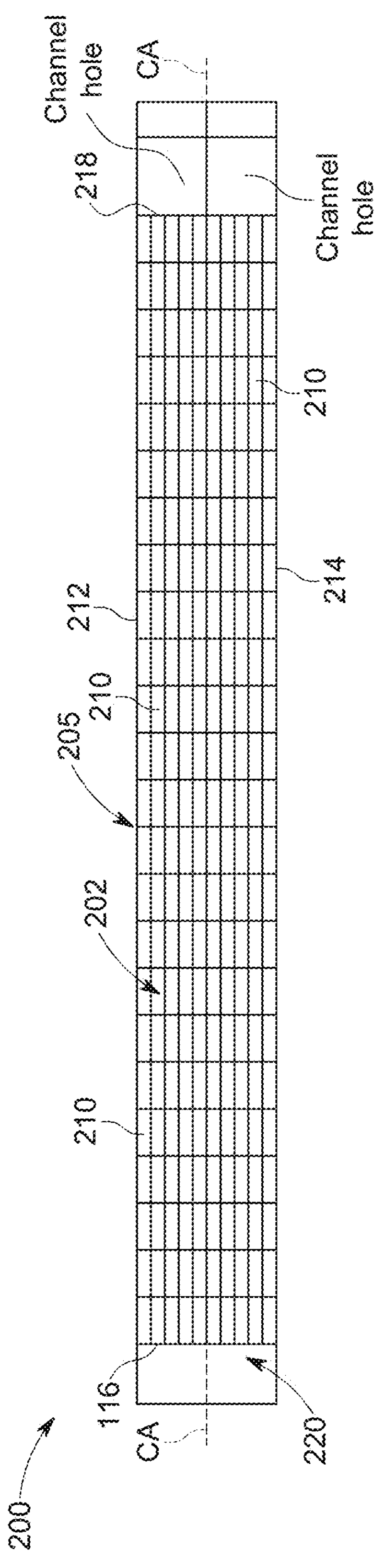
FIG. 2A illustrates a top view of a lithography mask formed over a film stack, according to embodiments of the present disclosure.

FIG. 2A illustrates a top view of another device 200 at an early stage of processing, according to one or more embodiments described herein. As will be described, the device 200 may be processed using a similar staircase approach as described above with respect to FIGS. 1A-1H. The device 200 may include a film stack 202 having a plurality of alternating horizontal first layers and second layers stacked atop one another. The film stack 202 may be a part of a memory cell device, such as a three-dimensional (3D) memory device (e.g., NAND).

The device 200 is depicted as a grid or array 205 of landing pads 210. In the non-limiting embodiment shown, the array 205 contains 10 rows and 24 columns for a total of 240 landing pads (120 landing pad pairs). As shown, the array 205 may be defined by a perimeter including first main side 212 opposite a second main side 214, and a first end 216 opposite a second end 218. A central axis 'CA' may extend between the first end 216 and the second end 218, and generally divides the array 205 into a first side and a second side.

As shown, a first lithography mask 220 may be formed over the array 205. Although not shown, the first lithography mask 220 may be formed over a patterned hardmask, similar to the hardmask 110 described above. The patterned hardmask may define a target etch area for a plurality of subsequently formed contact openings.

Figure 2B:
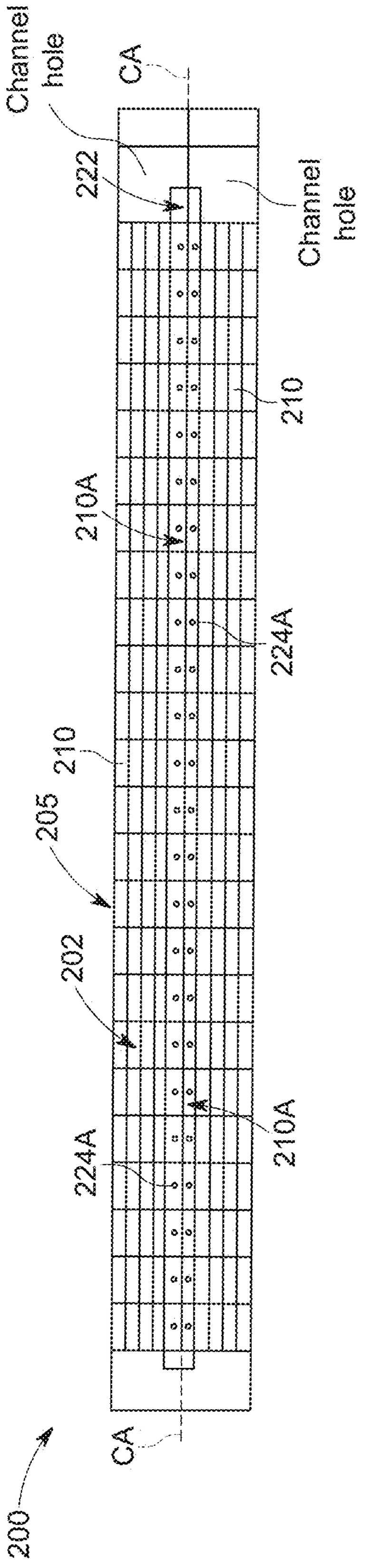
FIG. 2B illustrates a top view of a first plurality of contact openings formed in a film stack through an opening of a lithography mask, according to embodiments of the present disclosure.

In FIG. 2B, an opening 222 may be formed through the first lithography mask 220. Although non-limiting, the opening 222 may extend between the first and second ends 216, 218 of the array 205, and may be formed on opposite sides of the central axis. The opening 222 may expose a first plurality of landing pads 210A. An etch process may then be performed, through the opening 222, to form a first plurality of contact openings 224A in the film stack 202. In the example shown, 48 contact openings (24 pairs) are formed, wherein each contact opening pair is divided by the central axis. In some embodiments, each of the first plurality of contact openings 224A may be formed to a same depth.

Figure 2C:
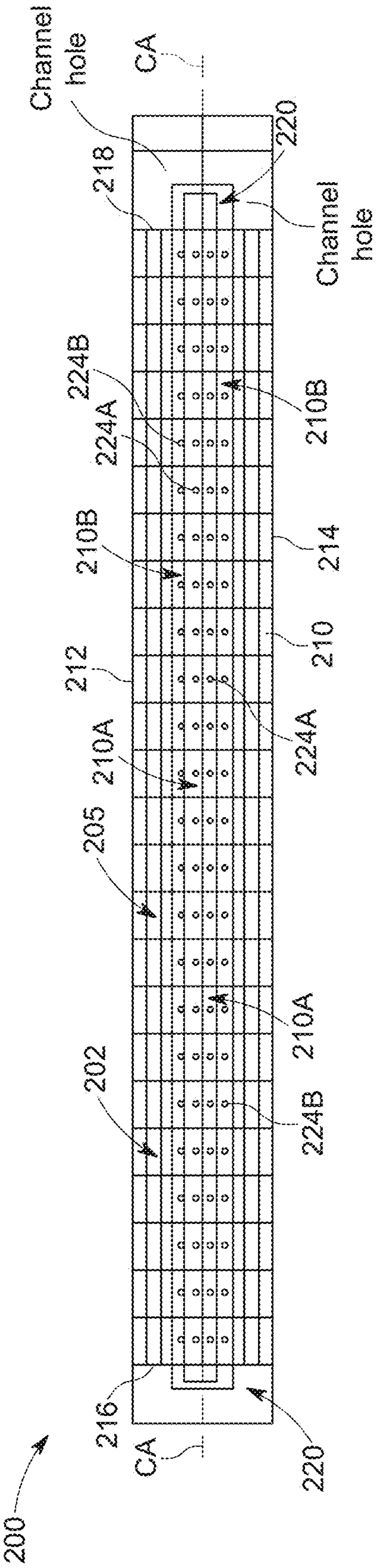
FIG. 2C illustrates a top view of a second plurality of contact openings formed in a film stack through an opening of a lithography mask, according to embodiments of the present disclosure.

As shown in FIG. 2C, the opening 222 may then be expanded (e.g., etched) in a first direction (e.g., a direction perpendicular to the central axis), to expose a second plurality of landing pads 210B. The second plurality of landing pads 210B may be directly adjacent the first plurality of landing pads 210A. More specifically, a first row of the second plurality of landing pads 210B may be located along a first side of the first plurality of landing pads 210A, while a second row of the second plurality of landing pads 210B may be located along a second side of the first plurality of landing pads 210A. Another etch process may then be performed, through the expanded opening 222, to form a second plurality of contact openings 224B in the film stack 202. In the example shown, 48 contact openings (24 pairs) are formed, wherein each contact opening pair of the second plurality of contact openings 224B is divided by the central axis and by the first plurality of contact openings 224A. In some embodiments, each of the second plurality of contact openings 224B may be formed to a same depth. As the second plurality of contact openings 224B are being formed, the first plurality of contact openings 224A may be further etched, thus making the etch depth of the first plurality of contact openings 224A greater than the etch depth of the second plurality of contact openings 224B.

Figure 2D:
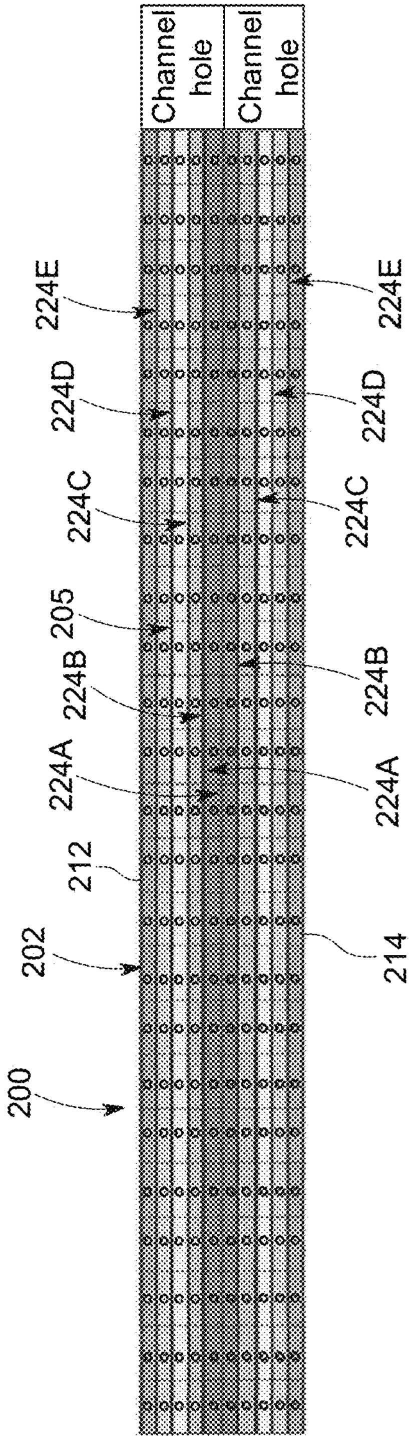
FIG. 2D illustrates a top view of an array of contact openings formed in a film stack, according to embodiments of the present disclosure.

This series of lithography and etch processes is repeated until a desired number of rows of contact openings is formed, resulting in the device 200 shown in FIG. 2D, for example. The array 205 may include the first plurality of contact openings 224A, the second plurality of contact openings 224B, a third plurality of contact openings 224C, a fourth plurality of contact openings 224D, and a fifth plurality of contact openings 224E. A depth of each contact opening of the third plurality of contact openings 224D may be the same, a depth of each contact opening of the fourth plurality of contact openings 224D may be the same, and a depth of each contact opening of the fifth plurality of contact openings 224E may be the same. In the embodiment shown, a depth of the contact openings of the array 205 varies along the first direction. More specifically, a contact opening depth may be greatest directly adjacent the central axis, and decrease towards the first main side 212 and the second main side 214, respectively. For example, a first etch depth of the first plurality of contact openings 224A is greater than a second etch depth of the second plurality of contact openings 224B, which is greater than a third etch depth of the third plurality of contact openings 224C, which is greater than a fourth etch depth of the fourth plurality of contact openings 224D, which is greater than a fifth etch depth of the fifth plurality of contact openings 224E.

FIGS. 2E-2H demonstrate an approach for performing a second series of alternating lithography and etch processes to a second lithography mask 230 and to the film stack 202 according to embodiments of the present disclosure. As will be described, an opening through the second lithography mask 230 is incrementally expanded in a second direction (e.g., along the central axis) following each etch step.

Figure 2E:
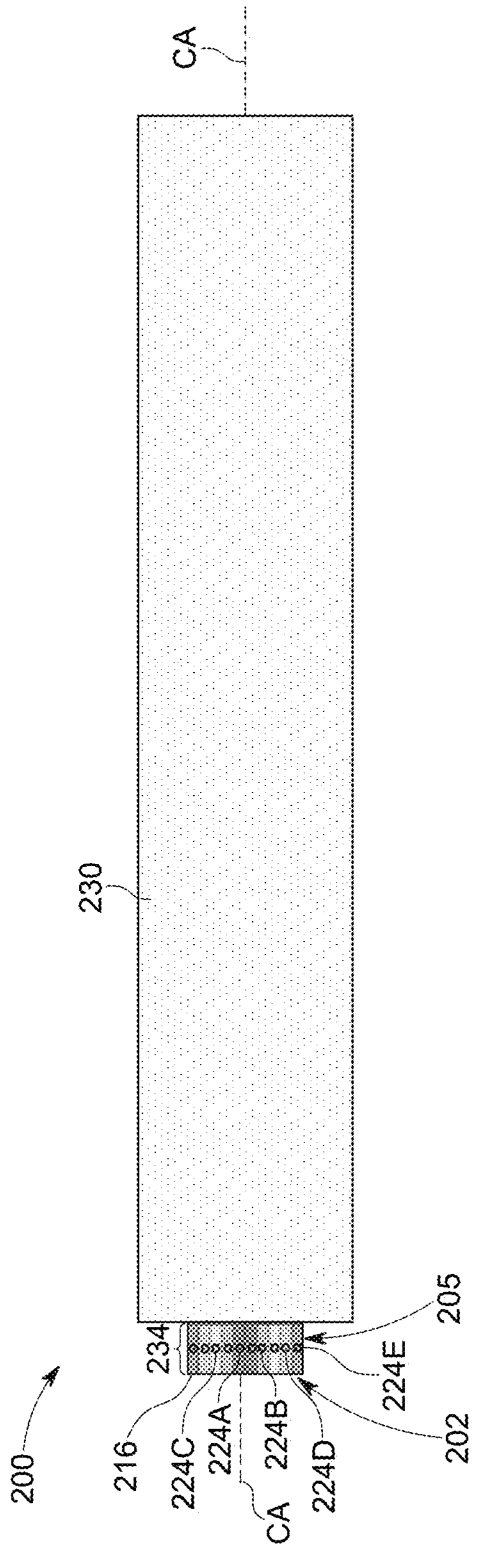
FIGS. 2E-2G illustrate a top view of a series of lithography and etch processes to further etch a film stack, according to embodiments of the present disclosure.

As shown first in FIG. 2E, the second lithography mask 230 may be formed over the array 205, and an etch may be performed to an exposed first subset 234 of each of the first plurality of contact openings 224A, the second plurality of contact openings 224B, the third plurality of contact openings 224C, the fourth plurality of contact openings 224D, and the fifth etch depth of a fifth plurality of contact openings 224E. The first subset 234 may correspond to a column directly adjacent the first end 216 of the array 205. A depth of each contact opening of the first subset 234 is increased as a result of the etch. The rest of the array 205 is not etched, however, due to the presence of the second lithography mask 230.

Figure 2F:
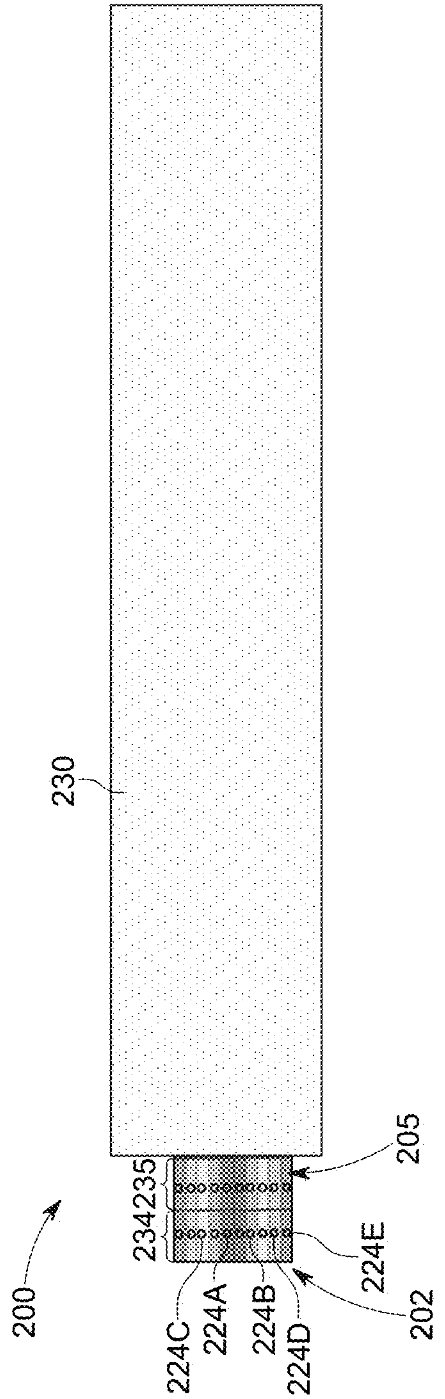

As shown in FIG. 2F, the second lithography mask 230 may be partially recessed or removed laterally to expose a second subset 235 of each of the first plurality of contact openings 224A, the second plurality of contact openings 224B, the third plurality of contact openings 224C, the fourth plurality of contact openings 224D, and the fifth etch depth of a fifth plurality of contact openings 224E. The second subset 235 may correspond to a second column directly adjacent the first subset 234 of the array 205. A depth of each contact opening of the first subset 234 and the second subset 235 is increased as a result of the etch. In this embodiment, an average depth of each contact opening of the first subset 234 is greater than an average depth of each contact opening of the second subset 235.

Figure 2G:
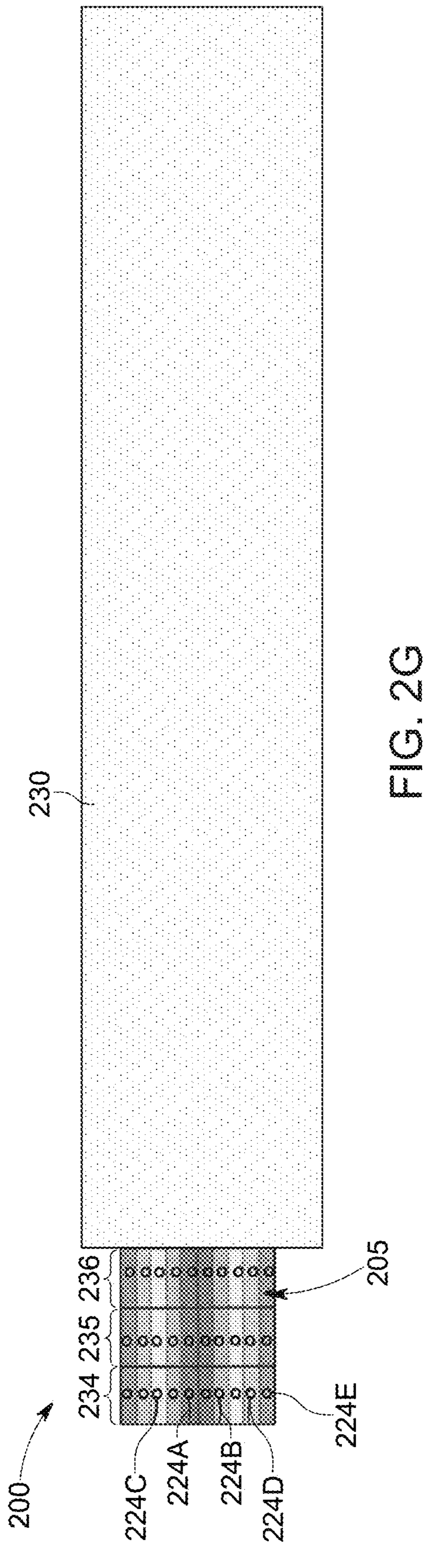

As shown in FIG. 2G, the second lithography mask 230 may again be partially recessed or removed to expose a third subset 236 of each of the first plurality of contact openings 224A, the second plurality of contact openings 224B, the third plurality of contact openings 224C, the fourth plurality of contact openings 224D, and the fifth etch depth of a fifth plurality of contact openings 224E. The third subset 236 may correspond to a third column directly adjacent the second subset 235 of the array 205. A depth of each contact opening of the first subset 234, the second subset 235, and the third subset 236 is increased as a result of the etch. In this embodiment, the average depth of each contact opening of the first subset 234 is greater than the average depth of each contact opening of the second subset 235, which is greater than an average depth of each contact opening of the third subset 236.

Figure 2H:
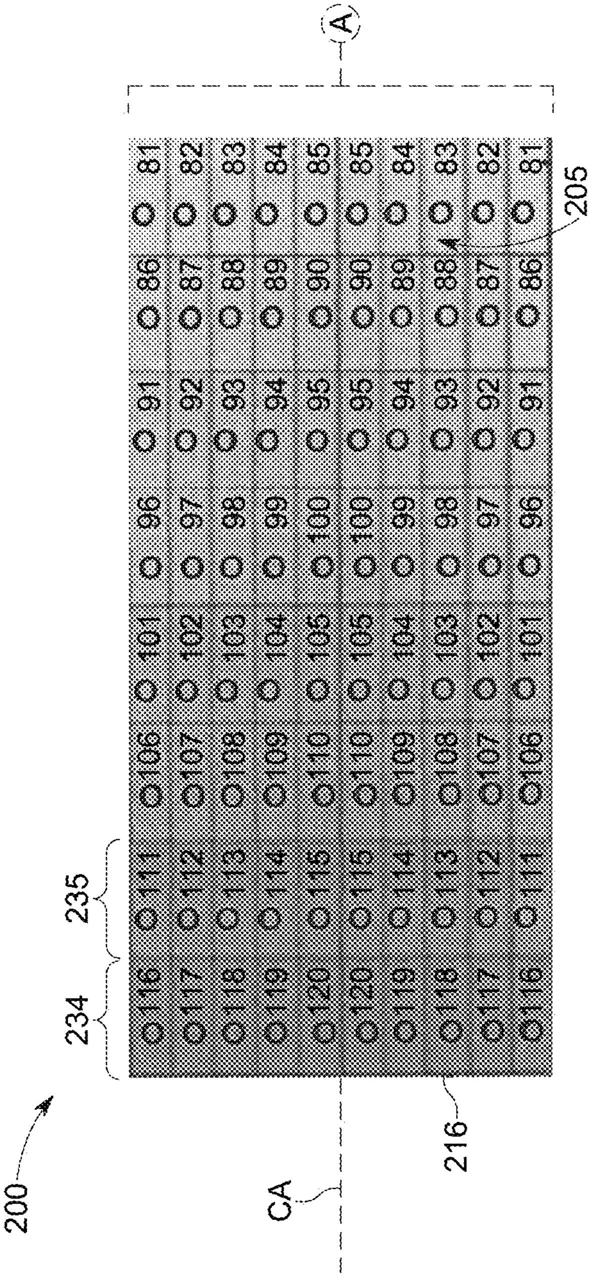
FIG. 2H illustrates a top view of an array of contact openings formed in a film stack, according to embodiments of the present disclosure.
Figure 2H:
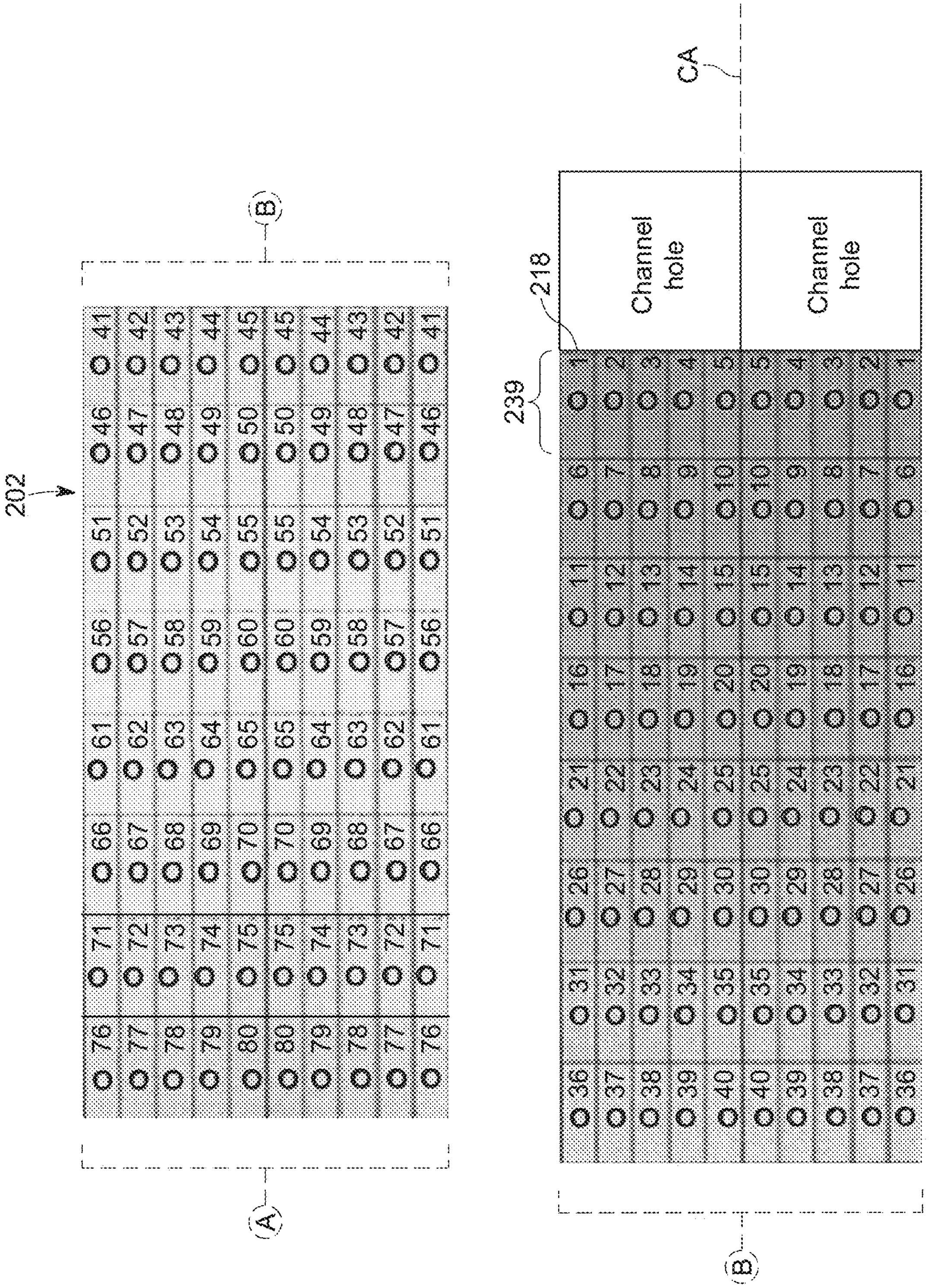

This second series of alternating lithography and etch processes may continue until the device 200 demonstrated in FIG. 2H is achieved. As shown, non-limiting contact opening numerical depth values are provided for each landing pad 210 to demonstrate depth variations across the array 205. For example, the first subset 234 has contact opening depth values ranging between 116 and 120, while the second subset 235 has contact opening depth values ranging between 111 and 115. As demonstrated, each contact opening of the first subset 234 may have a greater depth than each contact opening of the second subset 235. Meanwhile, subset 239 directly adjacent the second end 218 of the array 205, may have contact opening depth values ranging between 1 and 5. In this embodiment, subset 239 may only be etched during the first series of alternating lithography and etch processes demonstrated in FIGS. 2A-2D. Once etching is complete, the depth of the contact openings of the array 205 generally decreases between the first end 216 and the second end 218, and increases towards the central axis.

Advantageously, the staircase approach demonstrated in FIGS. 2A-2H can reduce the number of lithography and etch passes from 24 to 15.

Figure 3A:
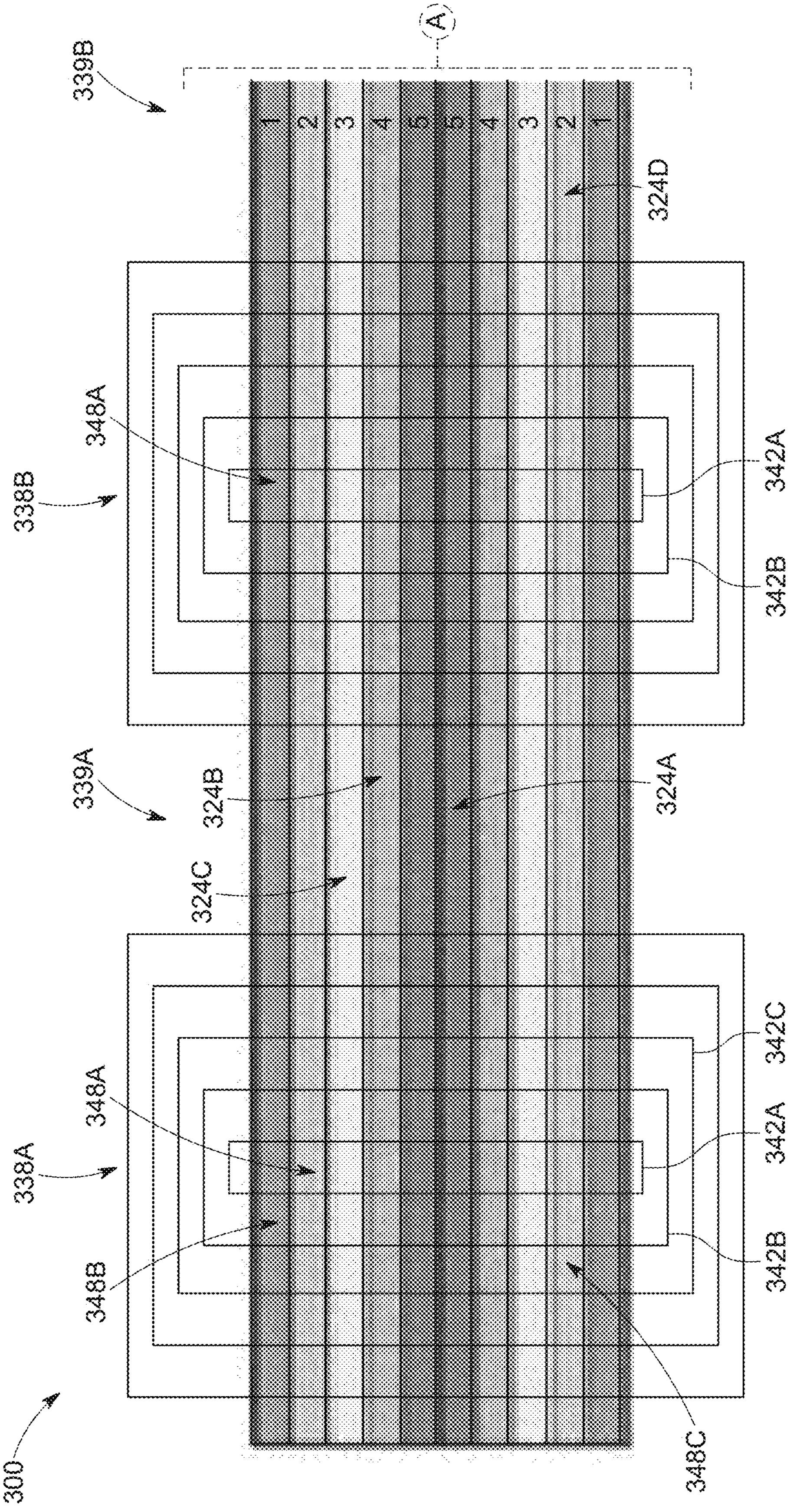
FIGS. 3A-3F illustrate a top view of a series of lithography and etch processes to form a plurality of contact openings therein, according to embodiments of the present disclosure.
Figure 3A:
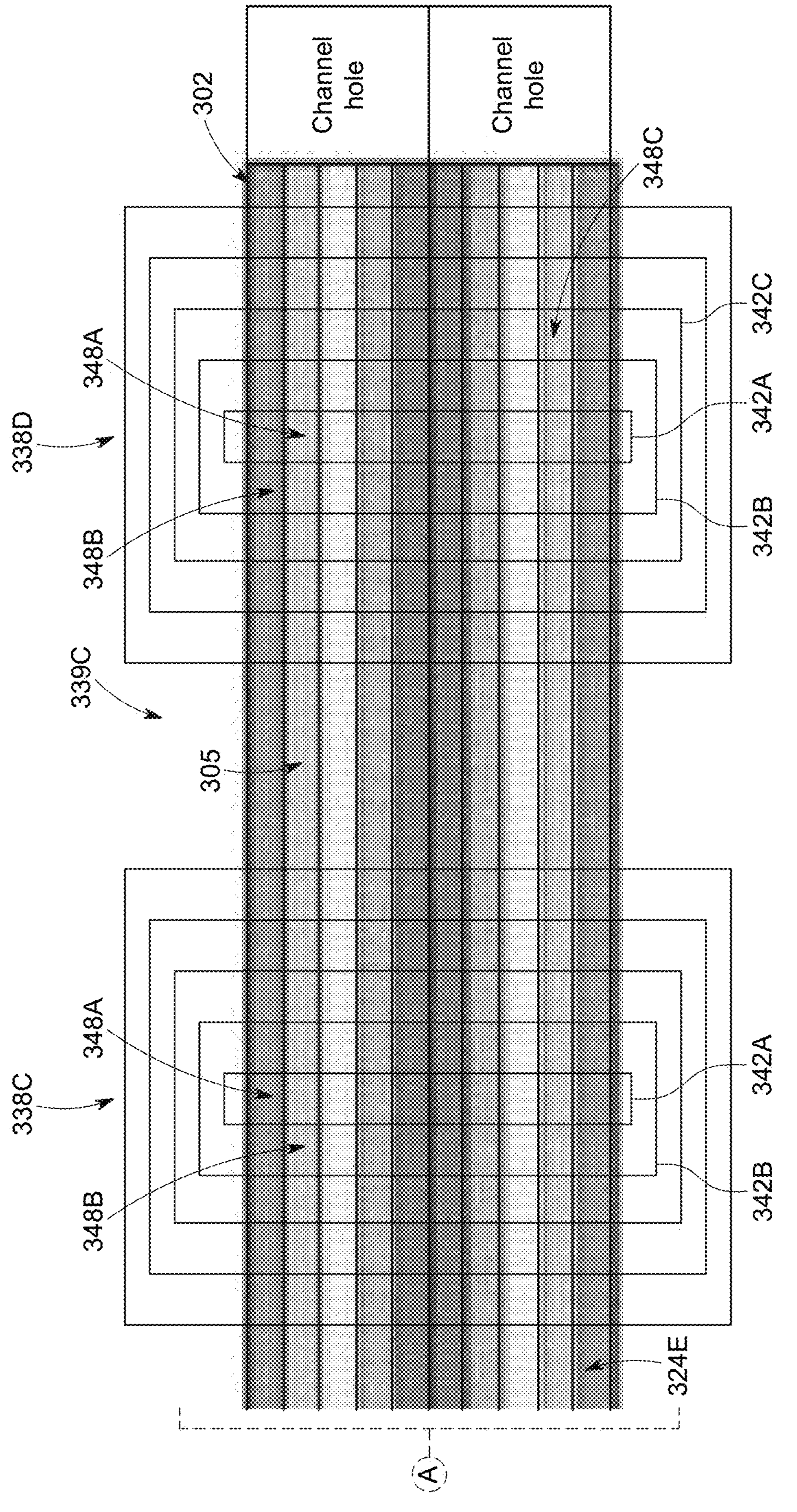

Turning now to FIG. 3A, another approach for forming a device 300 according to embodiments of the present disclosure is shown. The device 300 may be initially processed using the approach described above and shown in FIGS. 2A-2D. The device 300 may include a film stack 302 having a plurality of alternating horizontal first layers and second layers stacked atop one another. The film stack 302 may be a part of a memory cell device, such as a three-dimensional (3D) memory device (e.g., NAND).

Although individual landing pads and contact openings are not shown for the sake of simplicity, the film stack 302 may include an array 305 of first plurality of contact openings 324A, second plurality of contact openings 324B, third plurality of contact openings 324C, fourth plurality of contact openings 324D, and fifth plurality of contact openings 324E. In the embodiment shown, a first etch depth of the first plurality of contact openings 324A is greater than a second etch depth of the second plurality of contact openings 324B, which is greater than a third etch depth of the third plurality of contact openings 324C, which is greater than a fourth etch depth of the fourth plurality of contact openings 324D, which is greater than a fifth etch depth of the fifth plurality of contact openings 324E.

The device 300 may include a plurality of target etch areas, 338A-338D, which are separated by a plurality of etch-free areas 339A-339C. Although not shown, a first lithography mask may be formed over the array 305, including over each of the plurality of target etch areas 338A-338D and over each of the plurality of etch free areas 339A-339C. A series of lithography and etch processes may then be performed whereby openings 342A are formed through the first lithography mask to expose an upper surface of the film stack 302. A subsequent etch may increase a depth of those contact openings exposed by the opening 342A. More specifically, the etch may further processes a first subset 348A of each of the first plurality of contact openings 324A, the second plurality of contact openings 324B, the third plurality of contact openings 324C, the fourth plurality of contact openings 324D, and the fifth plurality of contact openings 324E.

Each of the openings 342A may then be expanded to form openings 342B for each of the plurality of target etch areas 338A-338D, and a subsequent etch may increase a depth of those contact openings exposed by the opening 342B. More specifically, the etch may further process a second subset 348B of each of the first plurality of contact openings 324A, the second plurality of contact openings 324B, the third plurality of contact openings 324C, the fourth plurality of contact openings 324D, and the fifth plurality of contact openings 324E. The first subset 348A may also be further processed together with the second subset 348B.

Similarly, each of the openings 342B may then be expanded to form openings 342C for each of the plurality of target etch areas 338A-338D, and a subsequent etch may increase a depth of those contact openings exposed by the opening 342C. More specifically, the etch may further process a third subset 348C of each of the first plurality of contact openings 324A, the second plurality of contact openings 324B, the third plurality of contact openings 324C, the fourth plurality of contact openings 324D, and the fifth plurality of contact openings 324E. The first subset 348A and the second subset 348B may also be further processed together with the third subset 348C.

Figure 3B:
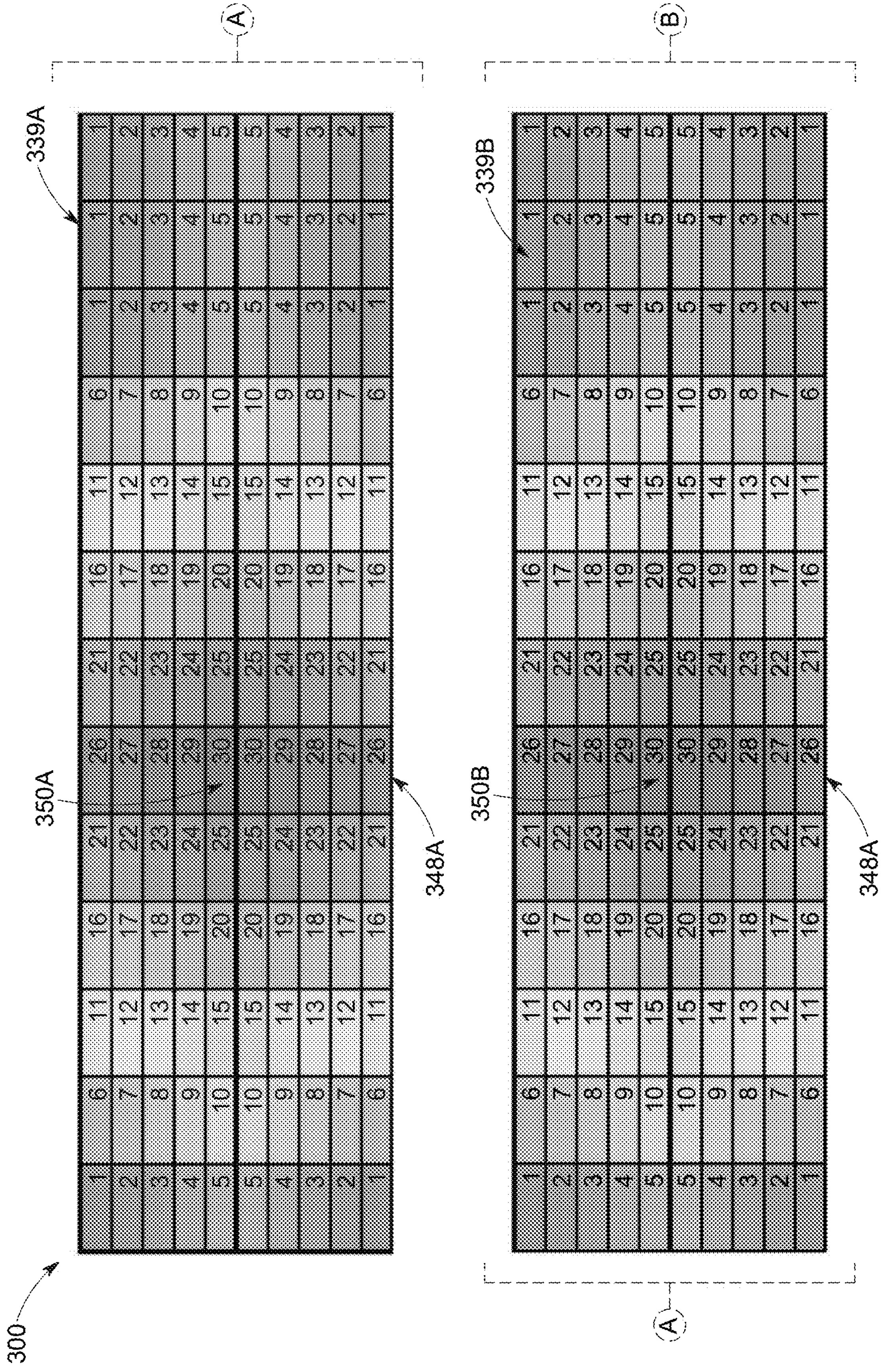
Figure 3B:
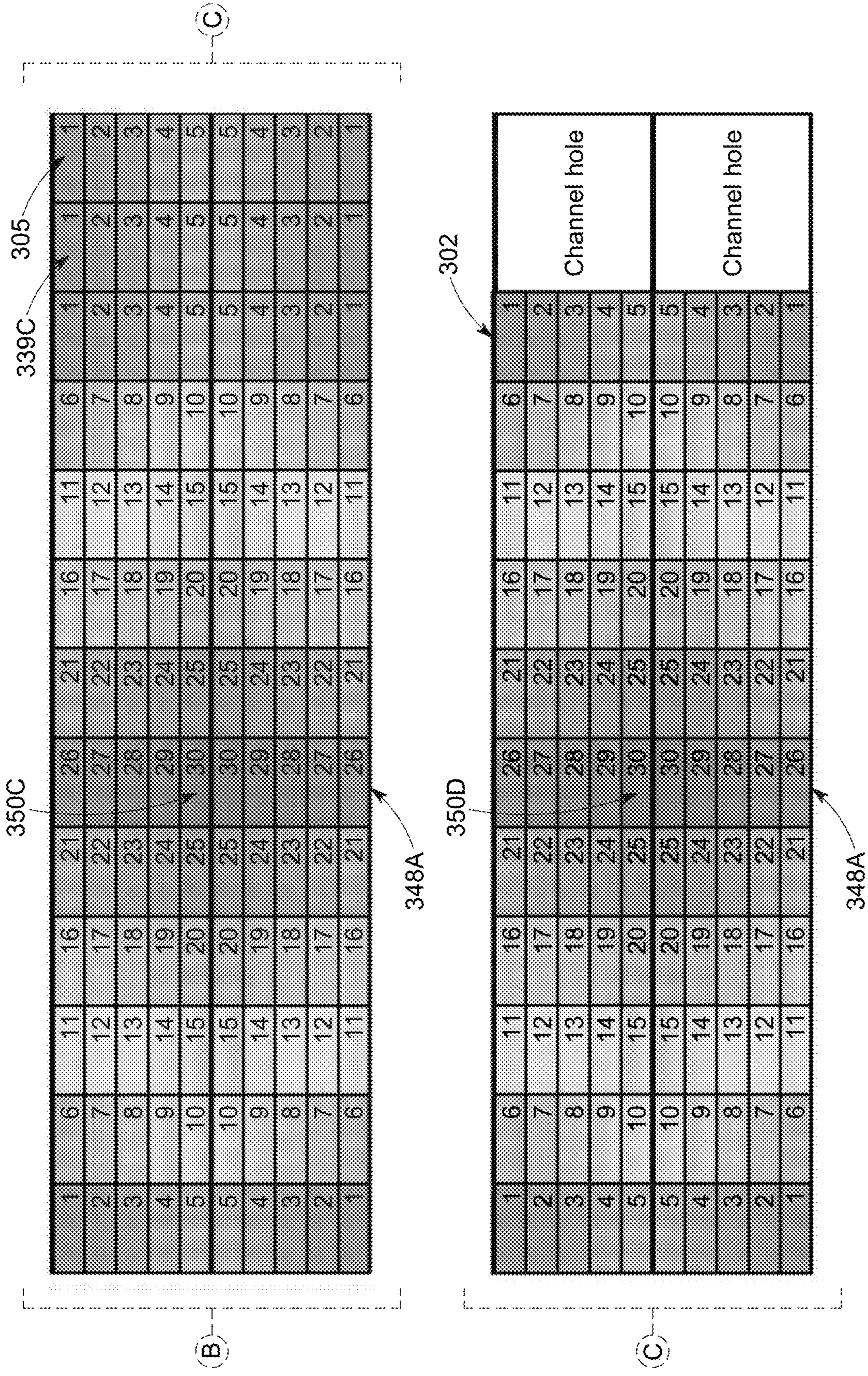

This series of lithography and etch processes is repeated as desired, resulting in the device 300 shown in FIG. 3B, for example. At this stage, the contact openings of the array 305 may be characterized by a series of deeper sections 350A-350D separated by etch-free areas 339A-339C. In this embodiment, the deeper sections 350A-350D generally correspond to the those contact openings of the first subset 348A which are directly adjacent the central axis.

Figure 3C:
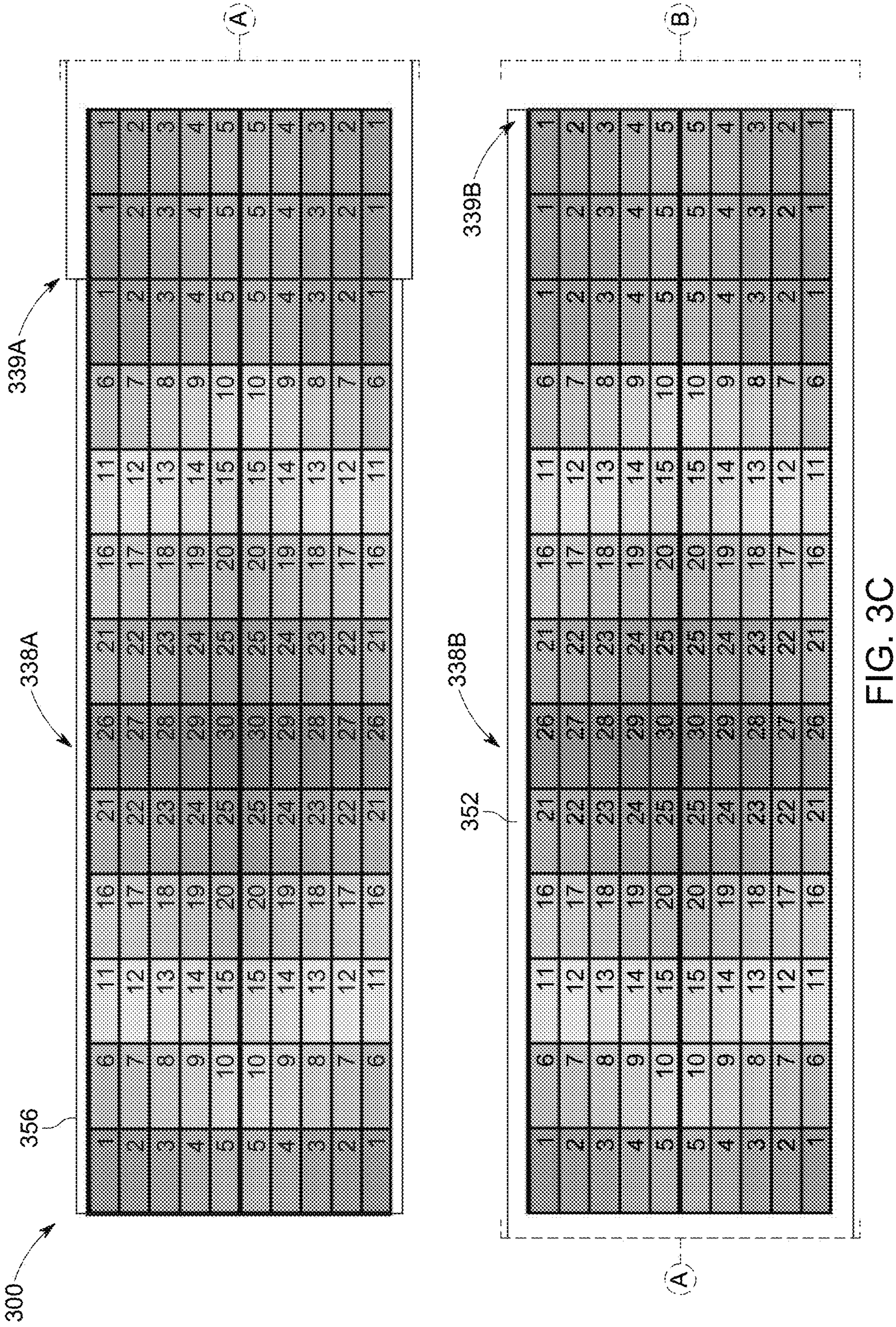
Figure 3C:
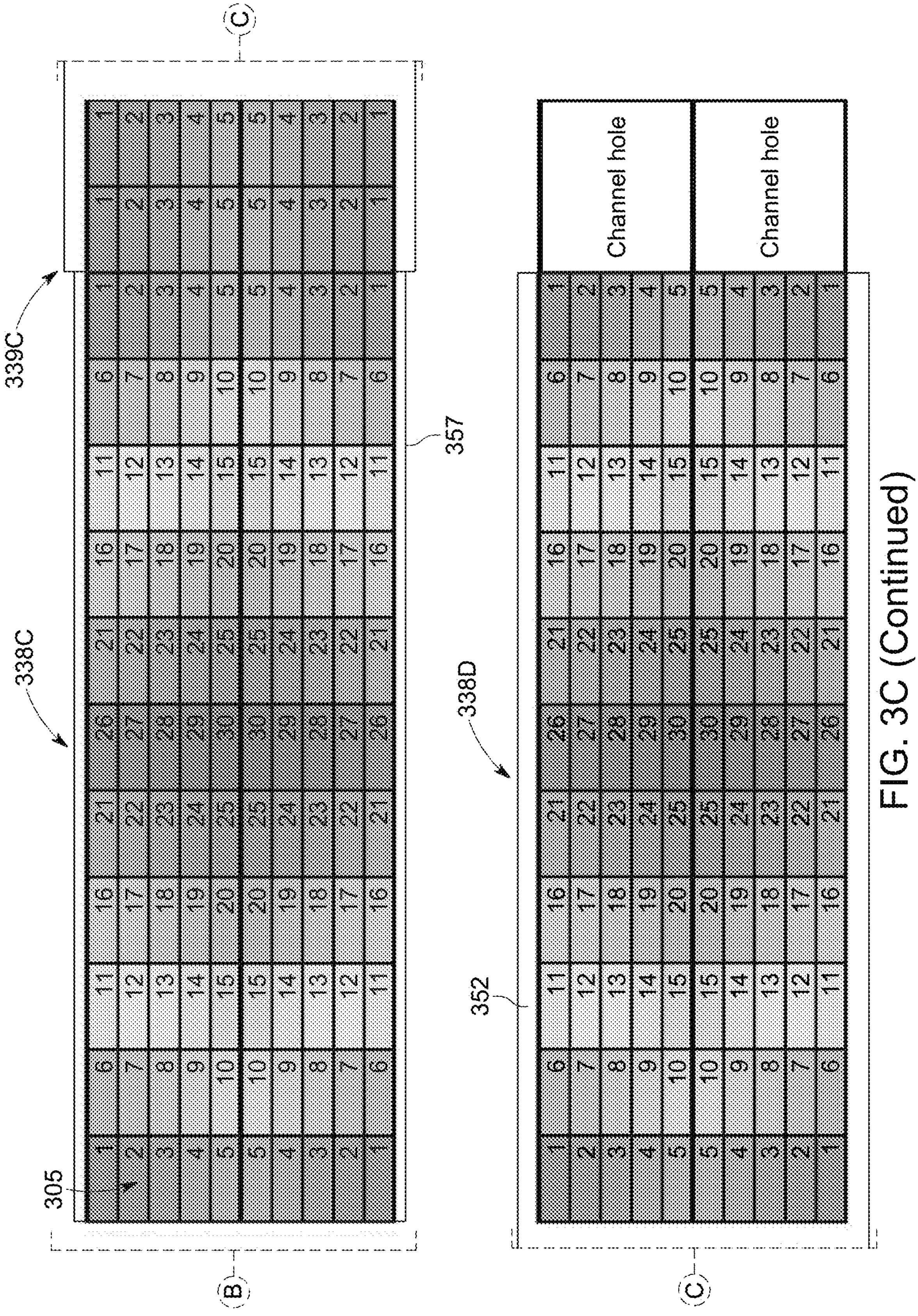

Next, as shown in FIG. 3C, a second lithography mask 352 (or multiple masks) may be formed over select portions of the array 305. For example, the second lithography mask 352 may be formed over the second and fourth target etch areas 338B, 338D but not over the first and third target etch areas 338A, 338C. In some embodiments, the second lithography mask 352 may be formed partially over etch-free areas 339A-339C. An etch process may then be performed on exposed portions 356, 357 of the array 305 to further increase an etch depth of the contact openings in these areas.

Figure 3D:
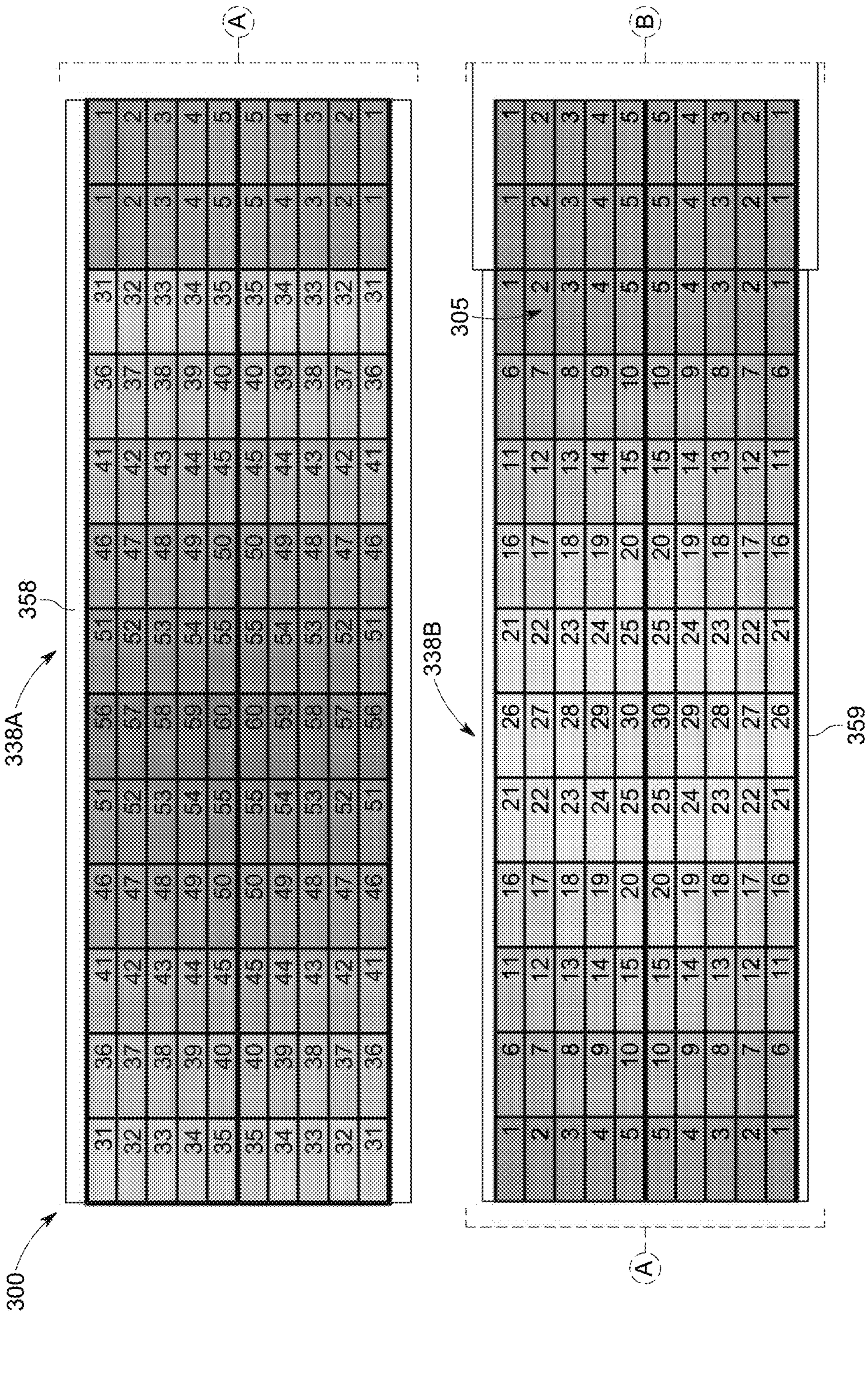
Figure 3D:
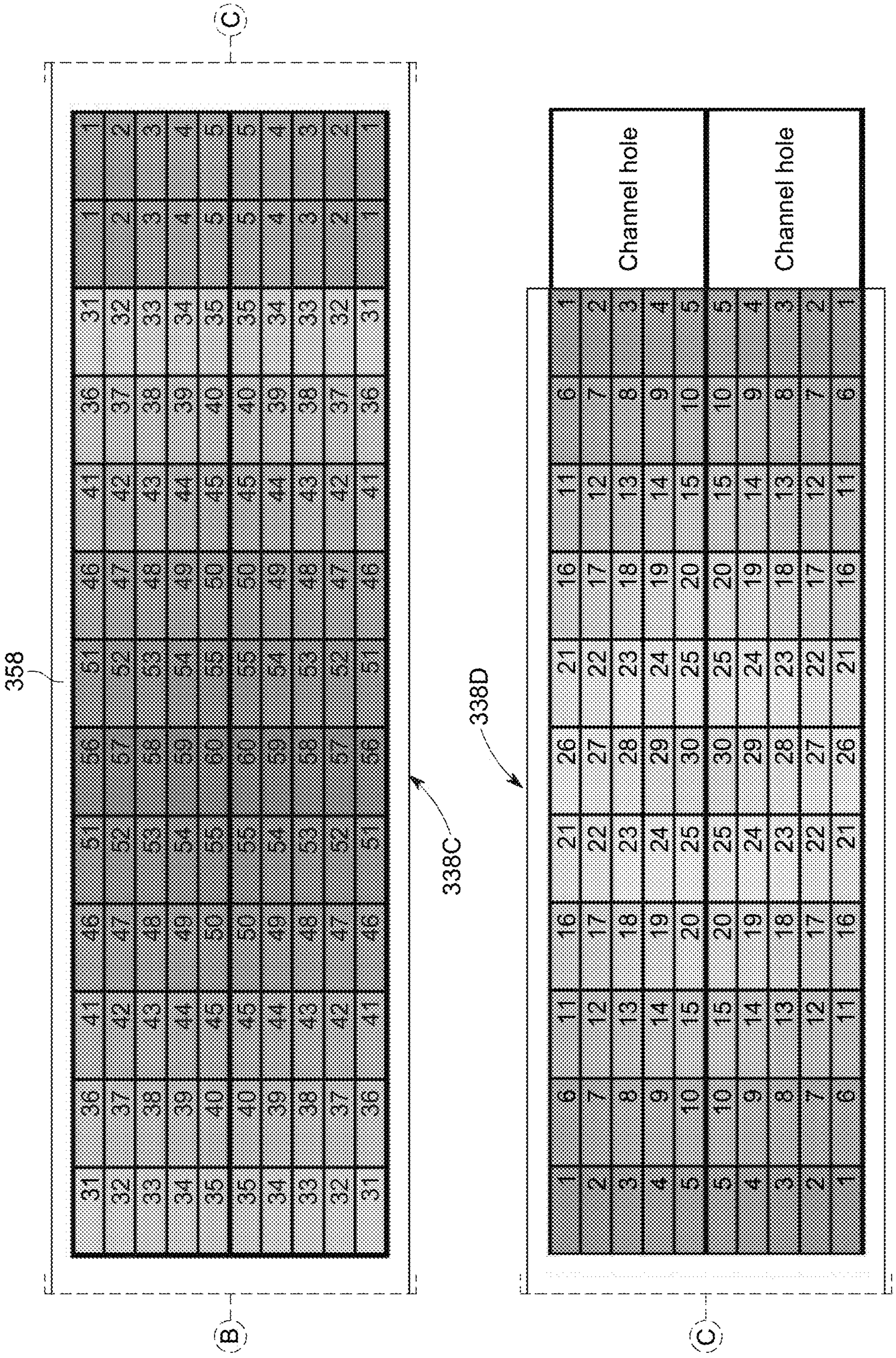

Next, as shown in FIG. 3D, a third lithography mask 358 (or multiple masks) may be formed over select portions of the array 305. For example, the third lithography mask 358 may be formed over the first target etch area 338A, the third target etch area 338C, and the fourth target etch area 338D. However, the second target etch area 338B remains uncovered by the third lithography mask 358. An etch process may then be performed on exposed portion 359 of the array 305 to further increase an etch depth of the contact openings in this area.

Figure 3E:
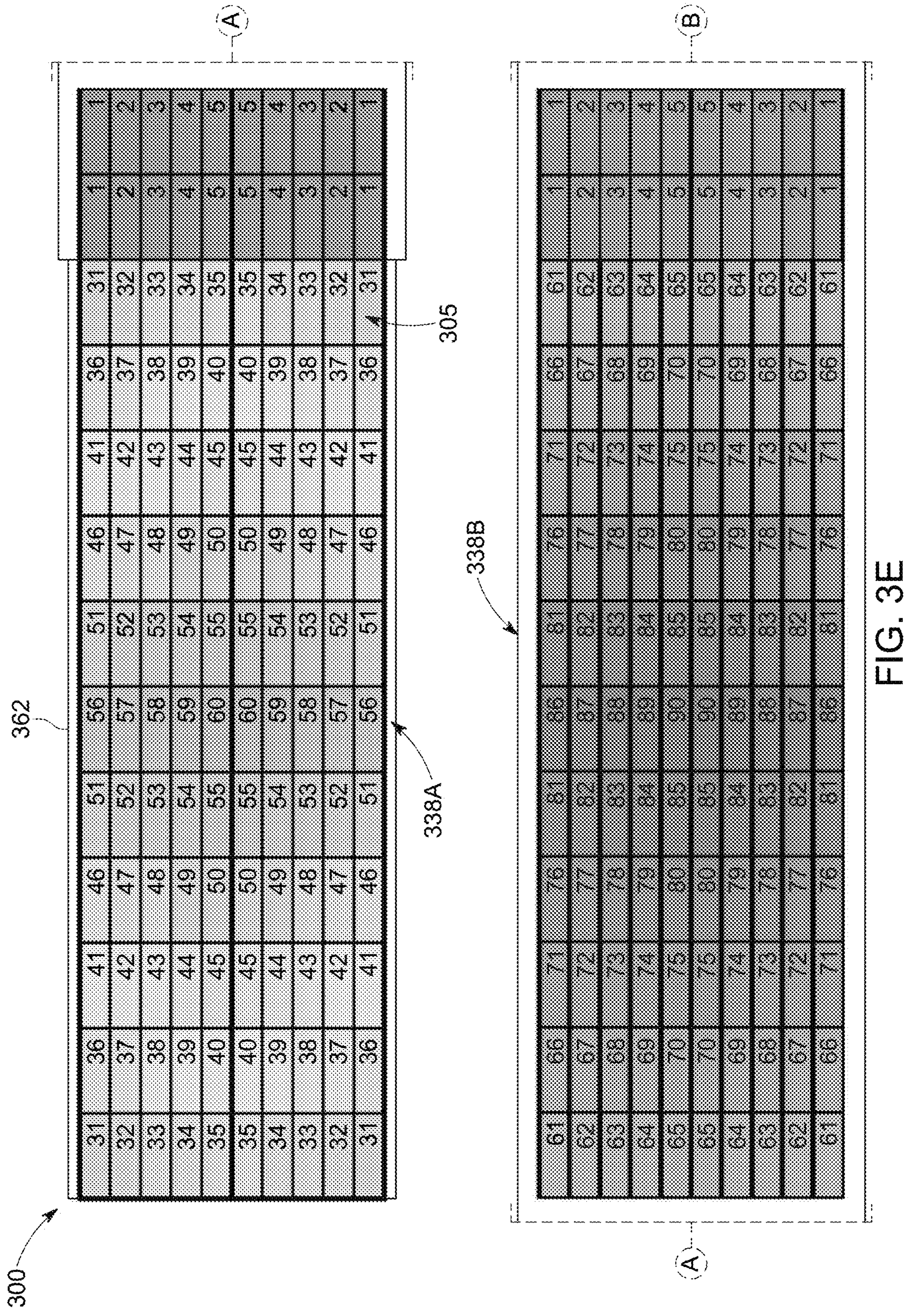
Figure 3E:
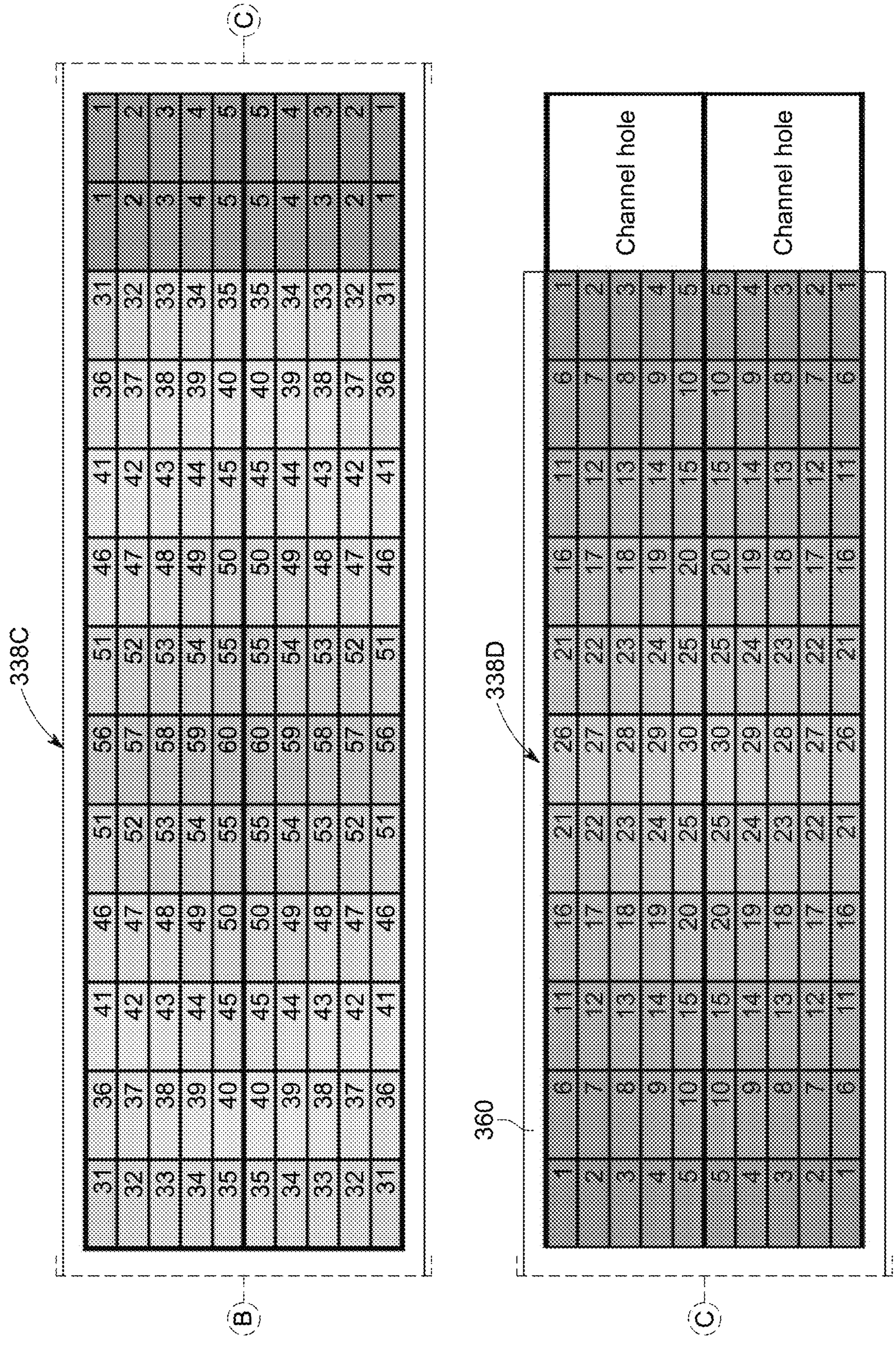

Similarly, as shown in FIG. 3E, a fourth lithography mask 360 may be formed over select portions of the array 305. For example, the fourth lithography mask 360 may be formed over the second target etch area 338B, the third target etch area 338C, and the fourth target etch area 338D. However, the first target etch area 338A remains uncovered by the fourth lithography mask 360. An etch process may then be performed on exposed portion 362 of the array 305 to further increase an etch depth of the contact openings in this area.

Figure 3F:
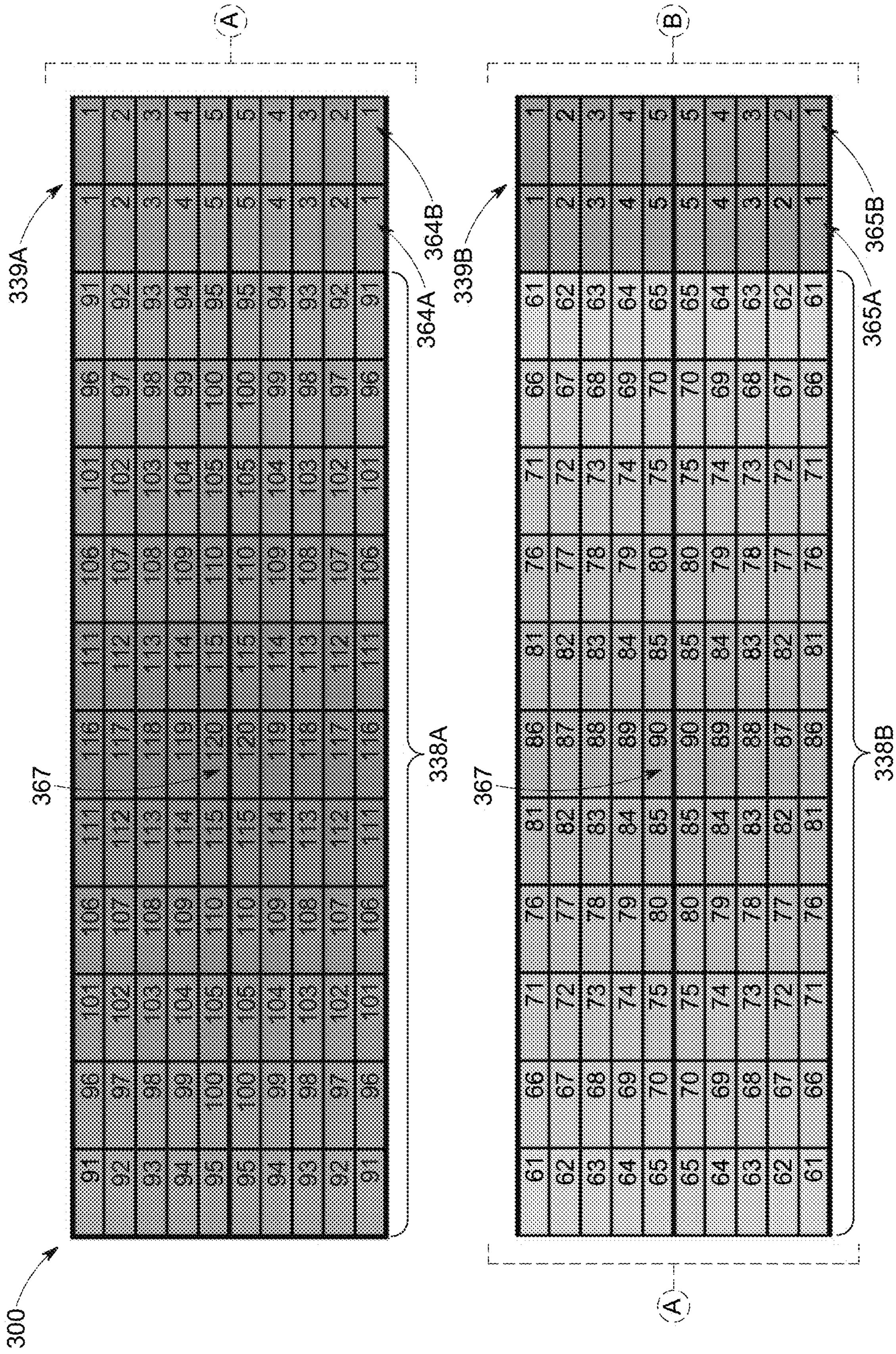
Figure 3F:
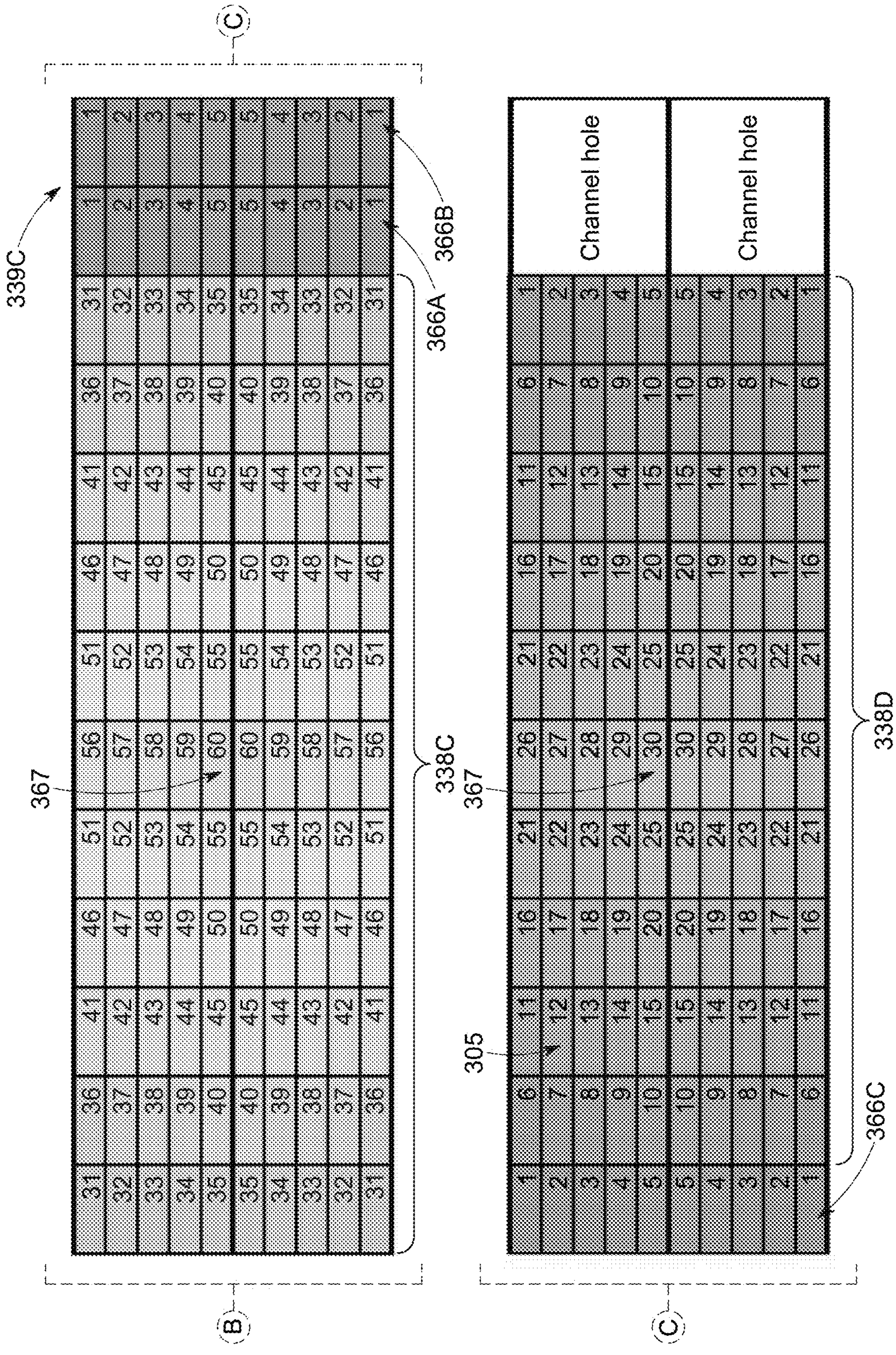

This second series of alternating lithography and etch processes may continue until the device 300 demonstrated in FIG. 3F is achieved. As shown, each of the target etch areas 338A-338D are separated by etch-free areas 339A-339C. In the embodiment shown, an average etch depth of the contact openings of the first target etch area 338A is greater than an average etch depth of the contact openings of the second target etch area 338B, which is greater than an average etch depth of the contact openings of the third target etch area 338C, which is greater than an average etch depth of the contact openings of the fourth target etch area 338D. Although non-limiting, etch-free area 339A corresponds to columns 364A-364B, etch-free area 339B corresponds to columns 364A-364B, while etch-free area 339C corresponds to columns 366A-366C. Once etching is complete, the depth of the contact openings within each of the target etch areas 338A-338D generally increases towards a center 367 of each of the target etch areas 338A-338D. Advantageously, the direct wordline contact-first staircase+chop approach demonstrated in FIGS. 3A-3F can reduce the number of lithography and etch passes from 24 to 18, and reduce the max delta pairs from 114 to 29.

Figure 4A:
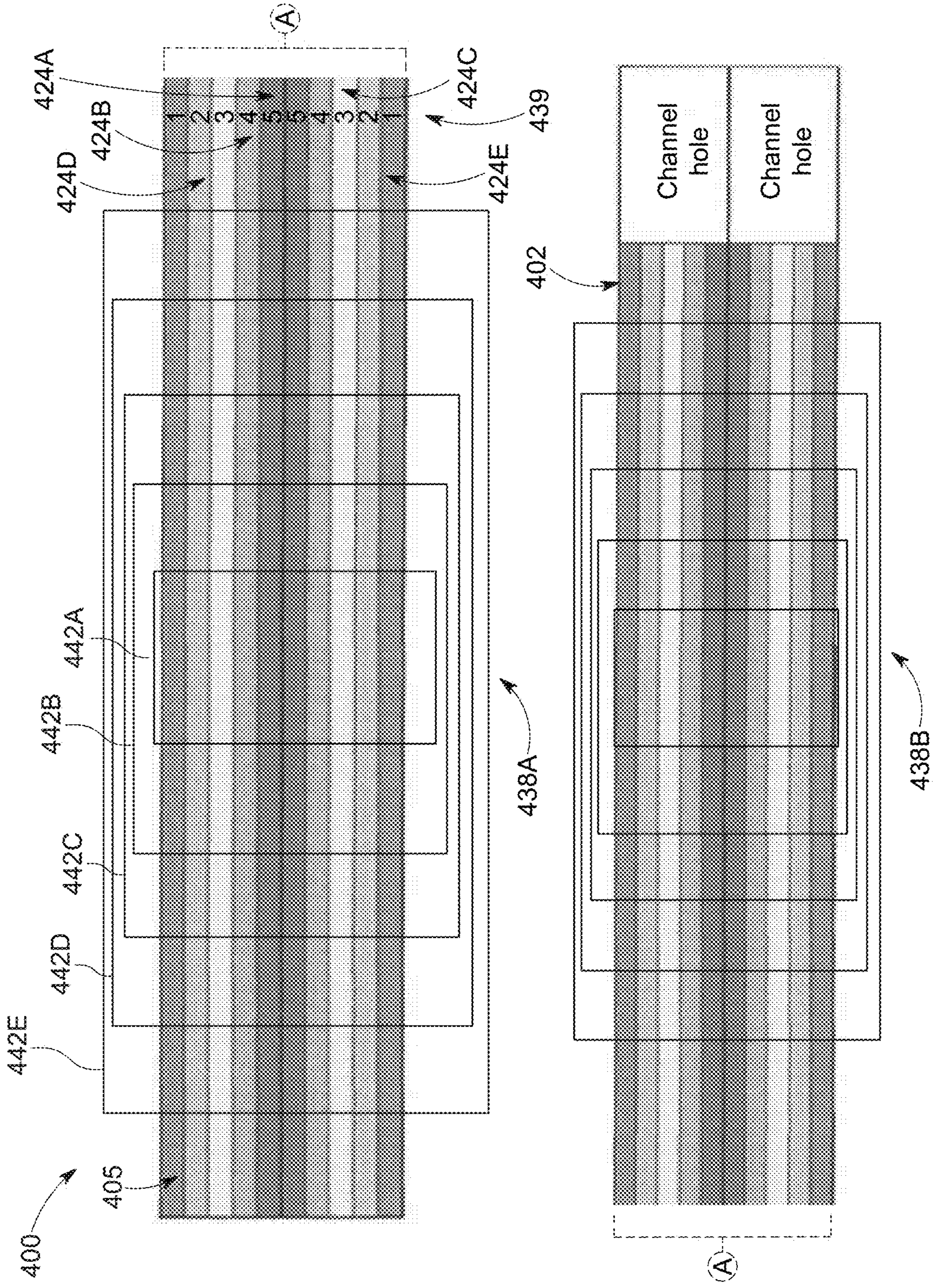
FIGS. 4A-4E illustrate a top view of a series of lithography and etch processes to form a plurality of contact openings therein, according to embodiments of the present disclosure.

Turning now to FIG. 4A, another approach for forming a device 400 according to embodiments of the present disclosure is shown. The device 400 may be initially processed using the approach described above and shown in FIGS. 2A-2D. The device 400 may include a film stack 402 having a plurality of alternating horizontal first layers and second layers stacked atop one another. The film stack 402 may be a part of a memory cell device, such as a three-dimensional (3D) memory device (e.g., NAND).

Although individual landing pads and contact openings are not shown for the sake of simplicity, the film stack 402 may include an array 405 of first plurality of contact openings 424A, second plurality of contact openings 424B, third plurality of contact openings 424C, fourth plurality of contact openings 424D, and fifth plurality of contact openings 424E. In the embodiment shown, a first etch depth of the first plurality of contact openings 424A is greater than a second etch depth of the second plurality of contact openings 424B, which is greater than a third etch depth of the third plurality of contact openings 424C, which is greater than a fourth etch depth of the fourth plurality of contact openings 424D, which is greater than a fifth etch depth of the fifth plurality of contact openings 424E.

The device 400 may include a plurality of target etch areas 438A-438B, which are separated by of an etch-free area 439. Although not shown, a first lithography mask may be formed over the array 405, including over each of the plurality of target etch areas 438A-438B and over the etch free area 439. A series of lithography and etch processes may then be performed, similar to those described above and shown in FIG. 3A, whereby a series of ever-expanding openings 442A-442E are formed through the first lithography mask to expose an upper surface of the film stack 402. A series of etch processes performed between each of the opening expansion steps may increase a depth of those contact openings exposed by the openings 442A-442E.

Figure 4B:
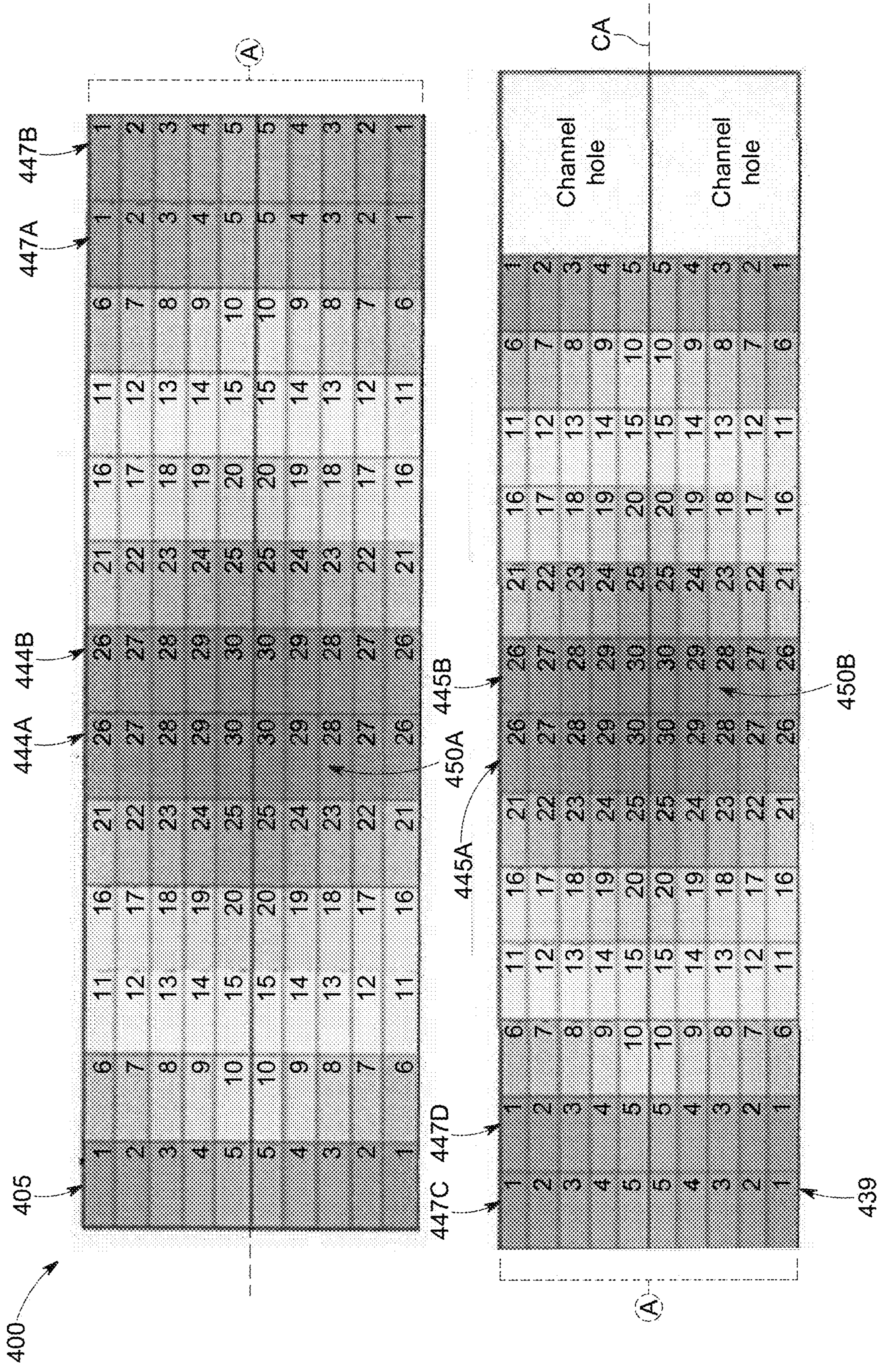

This series of lithography and etch processes is repeated as desired, resulting in the device 400 shown in FIG. 4B, for example. As shown, the contact openings of the array 405 may be characterized by a series of deeper sections 450A, 450B separated by the etch-free area 439. Deeper section 450A generally corresponds to a pair of adjacent first columns 444A, 444B of the array 405, while deeper section 450B generally corresponds to a pair of adjacent second columns 445A, 444B of the array 405. A depth of the contact openings of the pair of adjacent first columns 444A, 445B increases towards the central axis. Similarly, a depth of the contact openings of the pair of adjacent second columns 445A, 445B increases towards the central axis. In this embodiment, the etch-free area 439 may correspond to columns 447A-447D.

Figure 4C:
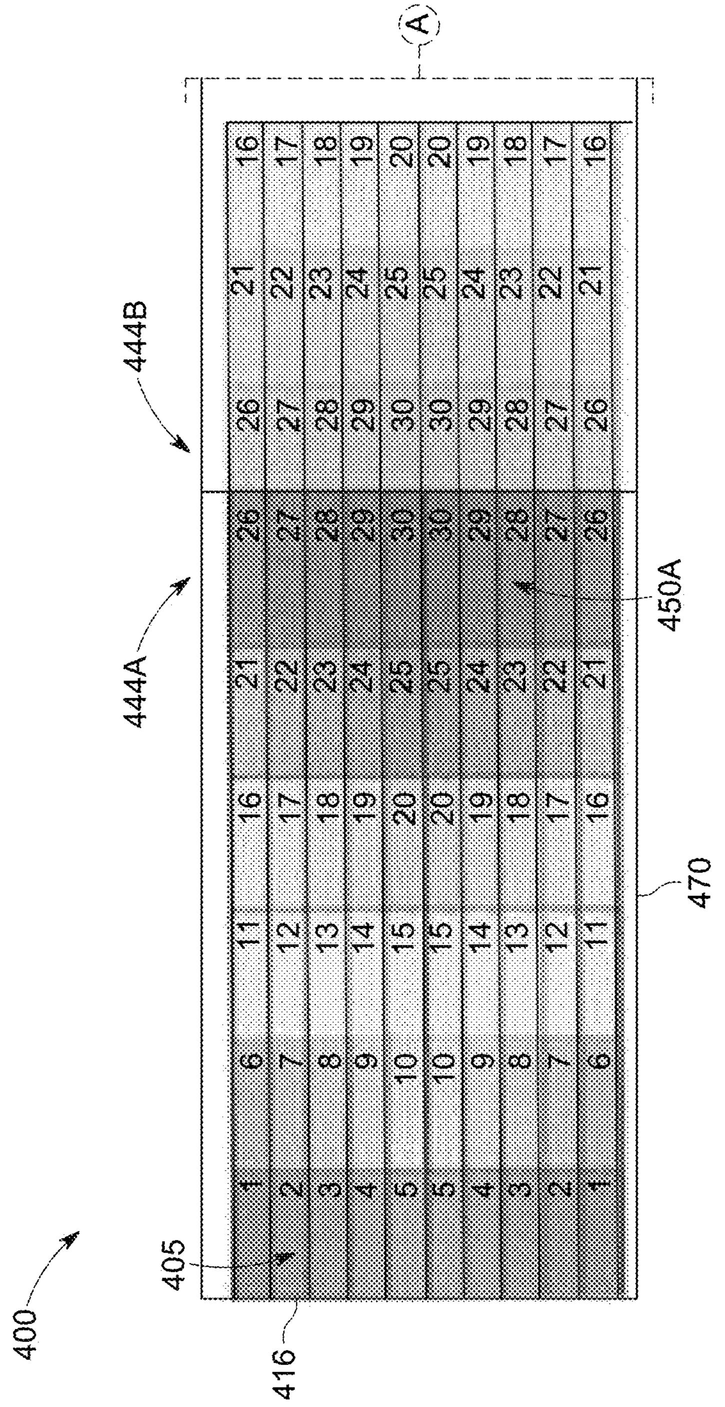
Figure 4C:
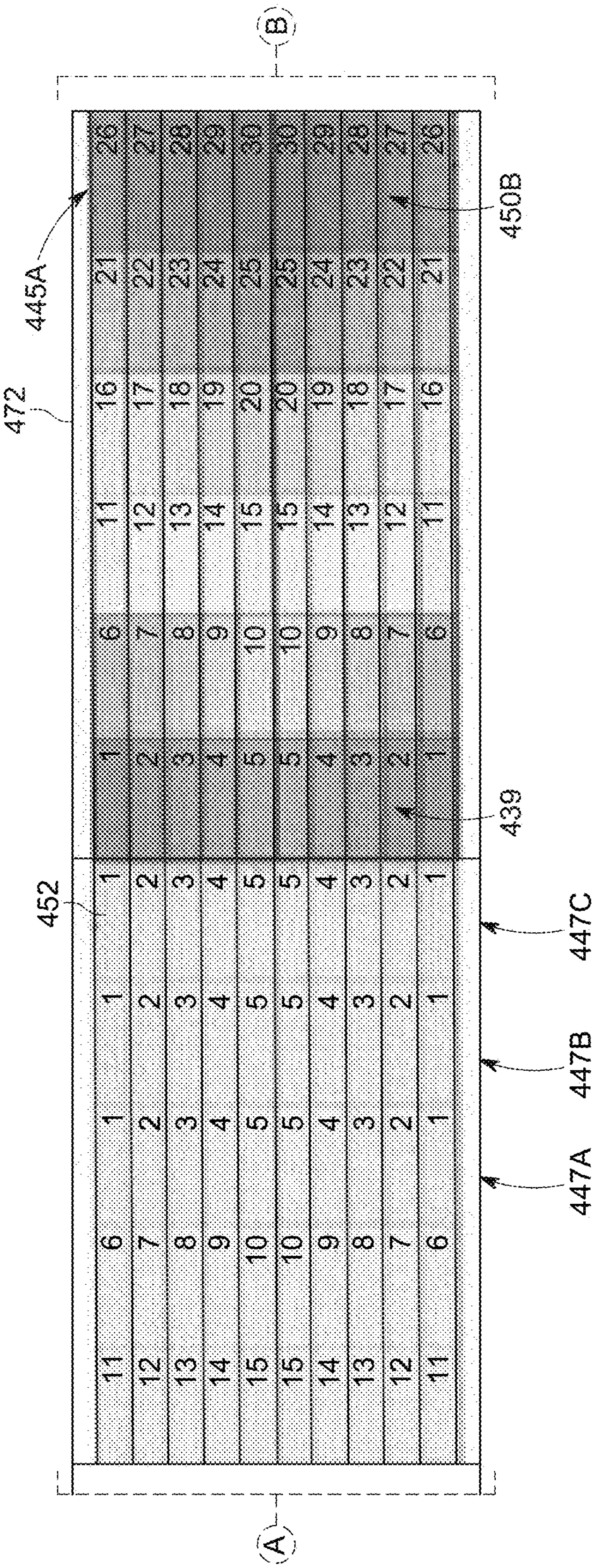
Figure 4C:
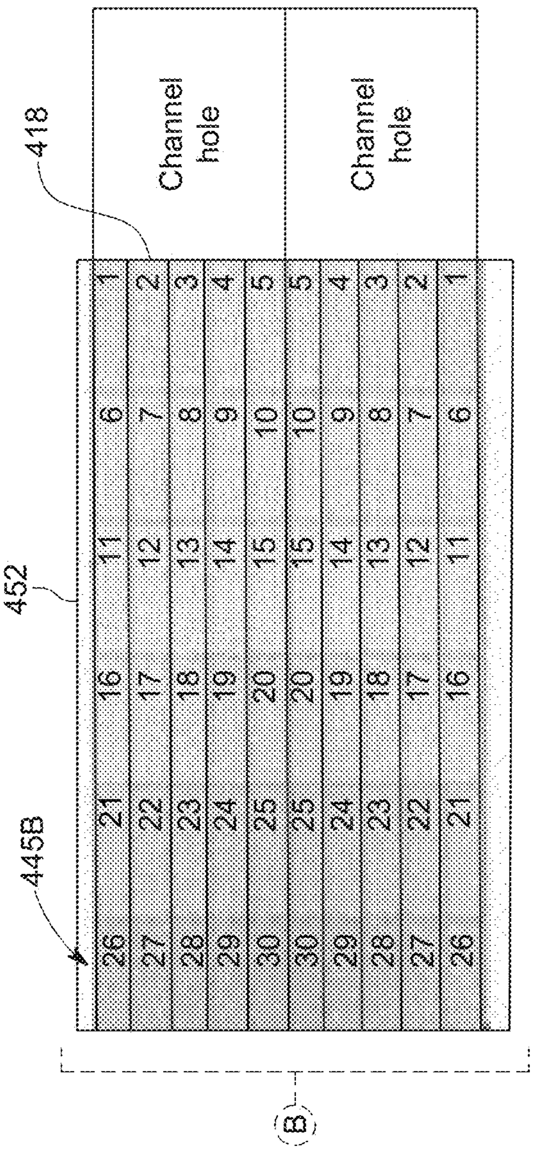

As shown in FIG. 4C, a second lithography mask 452 (or multiple masks) may be formed over select portions of the array 405. For example, the second lithography mask 452 may be formed over just a portion of each deeper section 450A, 450B. More specifically, the second lithography mask 452 may be formed between column 444B of the deeper section 450A and column 447C of the etch free area 439. An area 470 between the first end 416 of the array 405 and the first column 444A of the deeper section 450A is not covered by the second lithography mask 452, however. Meanwhile, the second lithography mask 452 may be further formed over the array 405, between second column 445B of the deeper section 450B and the second end 418 of the array 405. As shown, the second lithography mask 452 may not cover an area 472 between column 447D of the etch-free area 439 and first column 445A of deeper section 450B. An etch process may then be performed on exposed areas 470, 472 of the array 405 to further increase an etch depth of the contact openings in these areas.

Figure 4D:
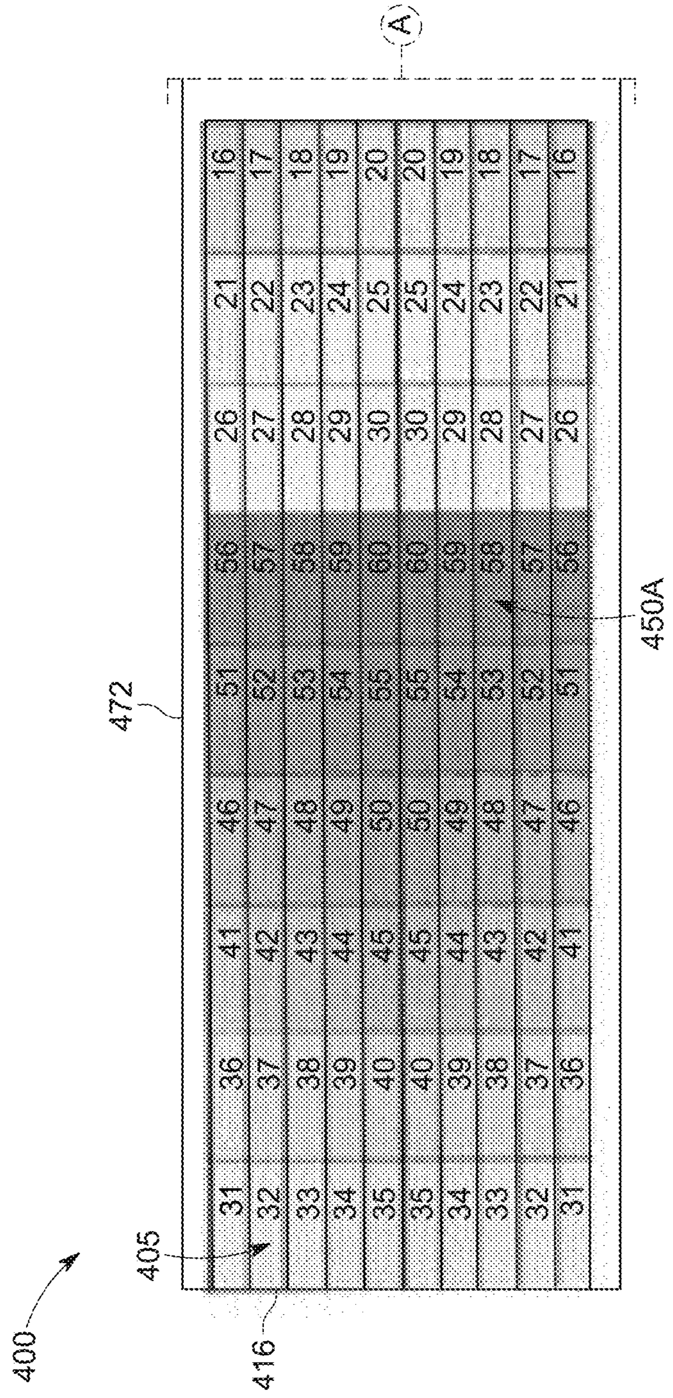
Figure 4D:
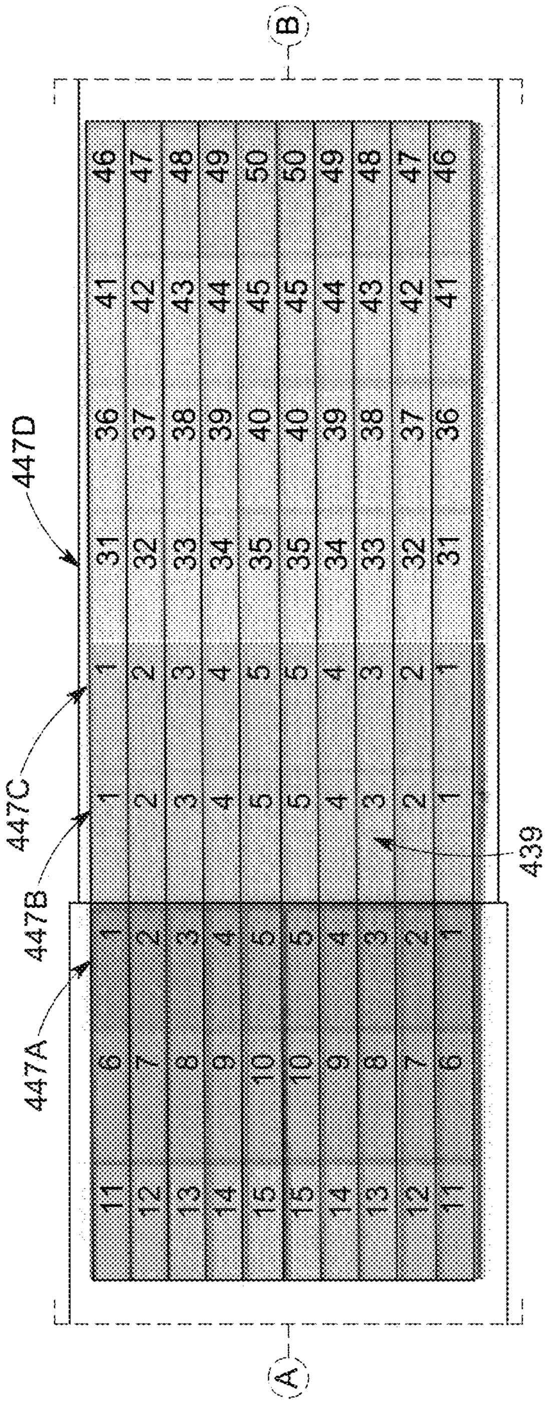
Figure 4D:
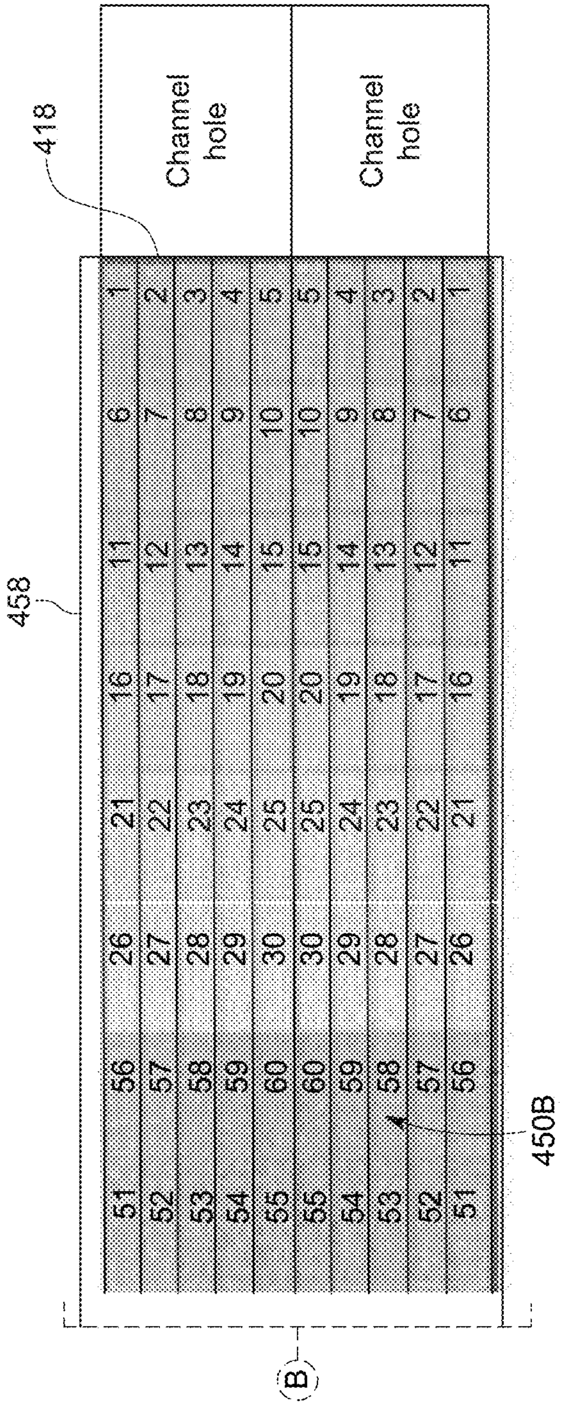

Next, as shown in FIG. 4D, a third lithography mask 458 may be formed over select portions of the array 405. For example, the third lithography mask 458 may be formed over the deeper section 450B and a portion of the etch-free area 439. More specifically, the third lithography mask 458 may extend from the second end 418 of the array 405 to column 447B of the etch-free area 439. However, the deeper section 450A remains uncovered by the third lithography mask 458. An etch process may then be performed on exposed area 475 of the array 405 to further increase an etch depth of the contact openings in this area. As shown, the exposed area 475 may extend from the first end 416 of the array 405 to column 447A of the etch-free area 439.

Figure 4E:
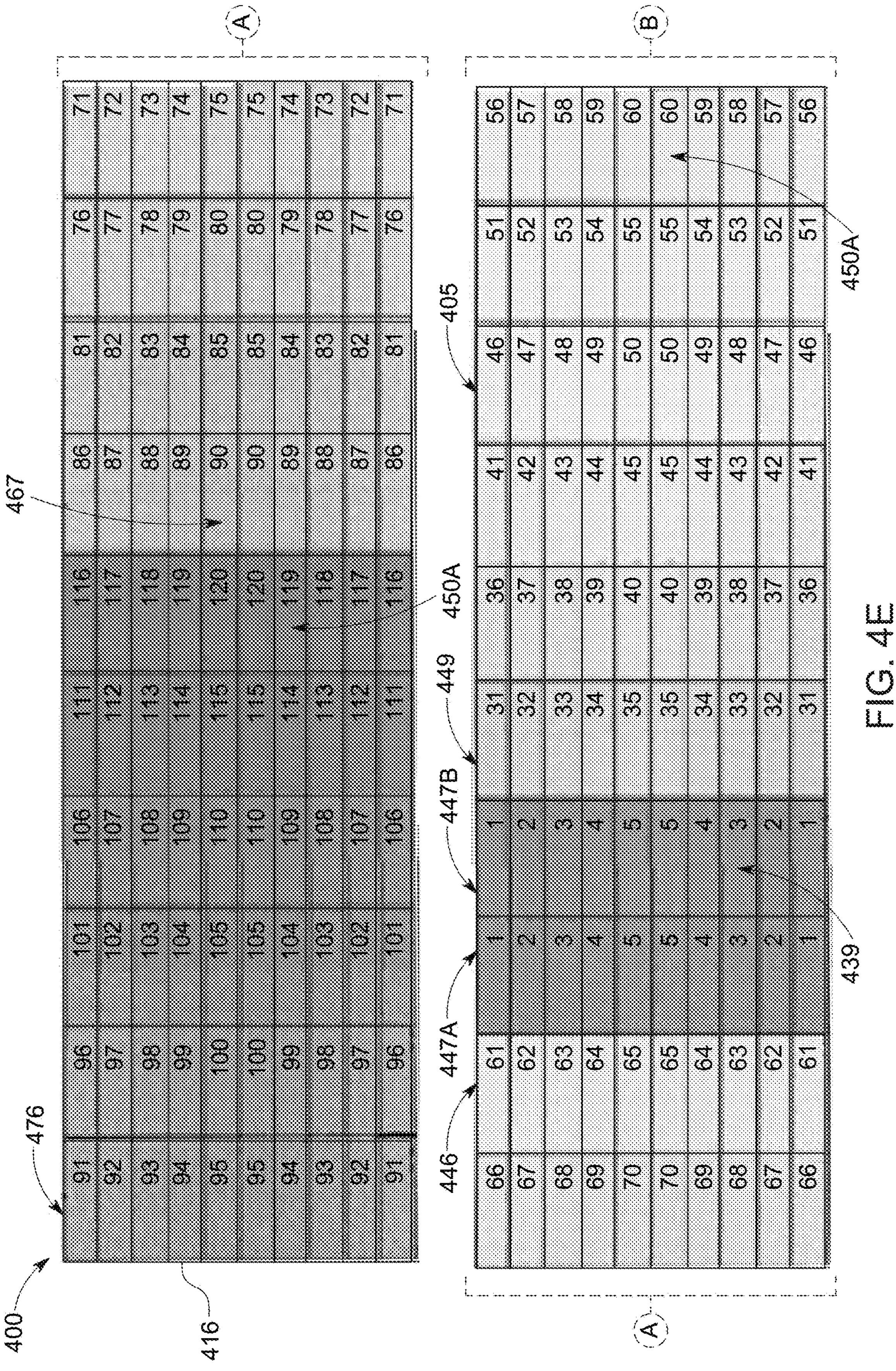
Figure 4E:
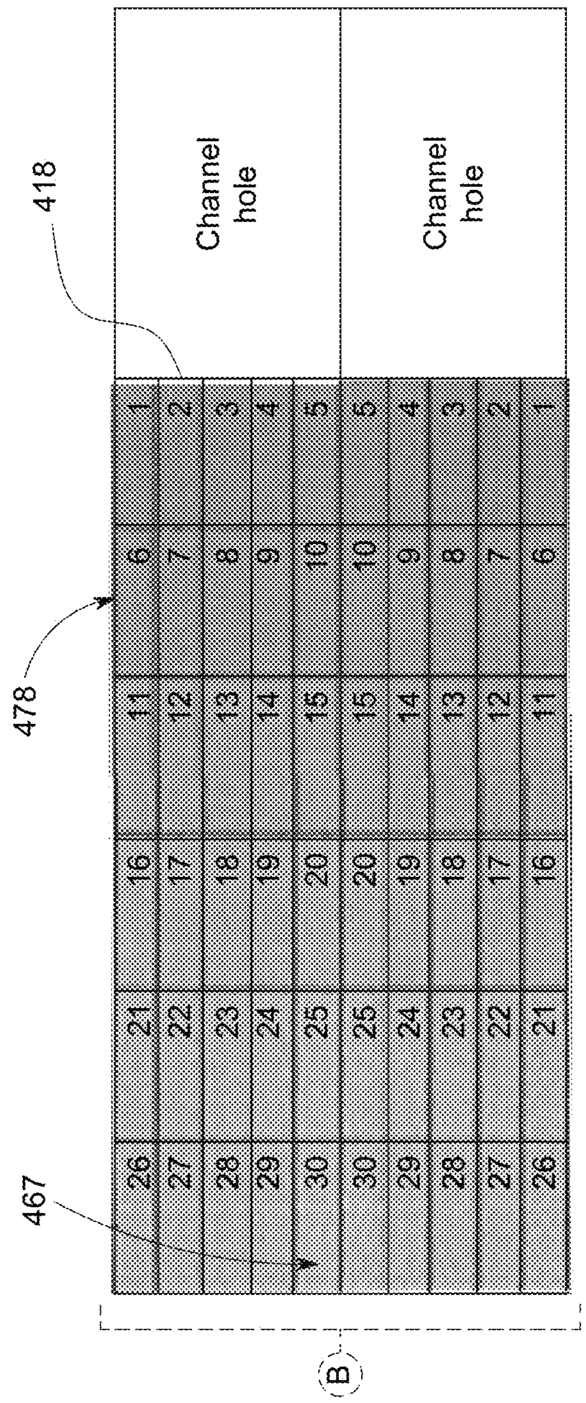

Following the series of alternating lithography and etch processes, the device 400 demonstrated in FIG. 4E is achieved. As shown, the depth of the contact openings within each deeper section 450A, 450B generally increases towards a center 467 thereof. However, an average depth of the contact openings within column 476, which is directly adjacent the first end 416 of the array 405, is greater than an average depth of the contact openings of column 446, which is directly adjacent column 447A of the etch-free area 439. Similarly, an average depth of the contact openings within column 449, which is directly adjacent the column 447B of the etch-free area 439, is greater than an average depth of the contact openings of column 478, which is closer to the second end 418 of the array 405. In this embodiment, column 479 may also represent an etch-free area of the array 405. Advantageously, the direct wordline contact-first staircase+chop approach demonstrated in FIGS. 4A-4E can reduce the number of lithography and etch passes from 24 to 15, and reduce contact length from 150 to 78 (e.g., assuming 3 tiers, *360 ON pairs, and *5 μm block width).

Figure 5A:
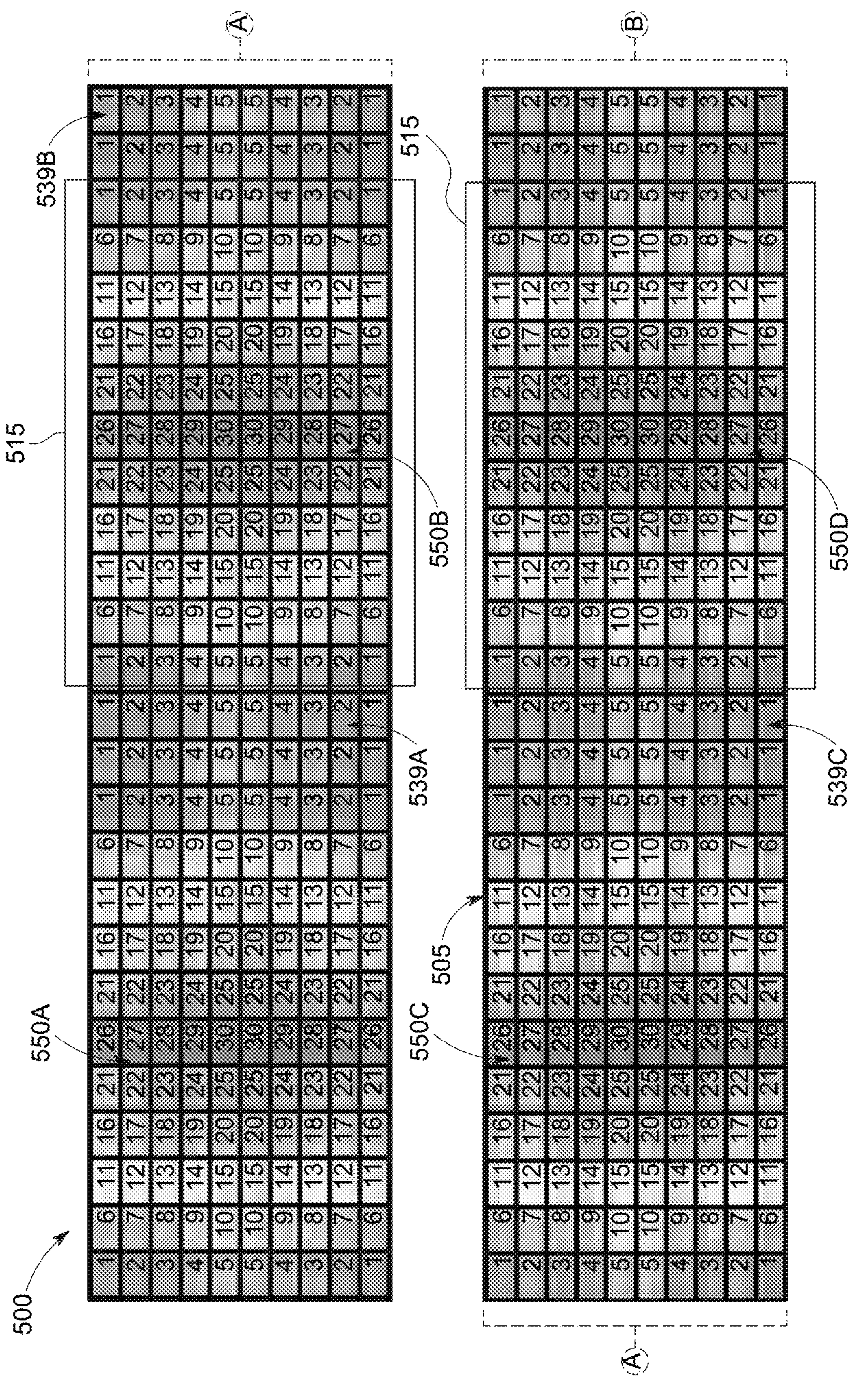
FIGS. 5A-5E illustrate a top view of a series of lithography and etch processes to form a plurality of contact openings therein, according to embodiments of the present disclosure.
Figure 5A:
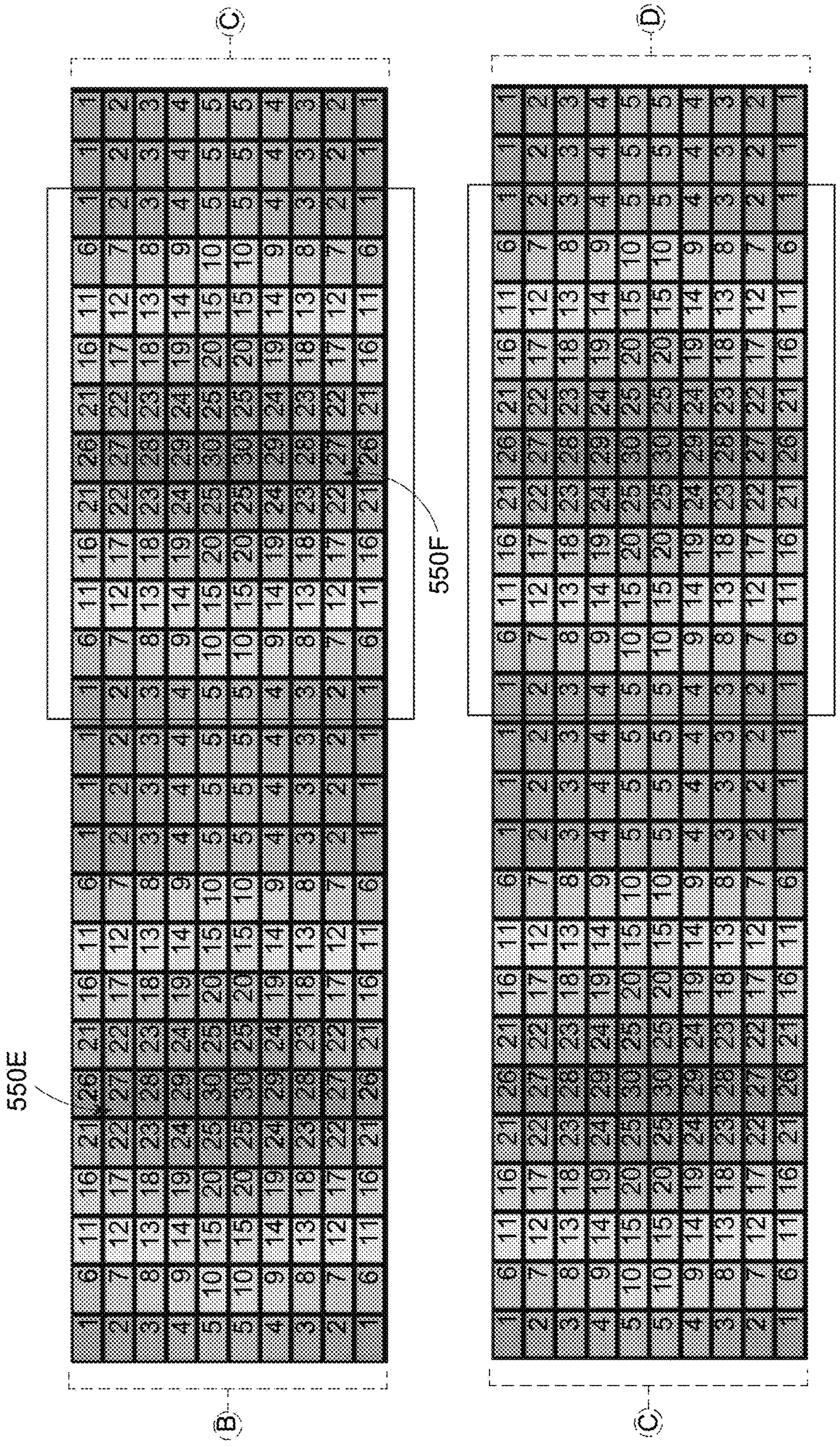
Figure 5A:
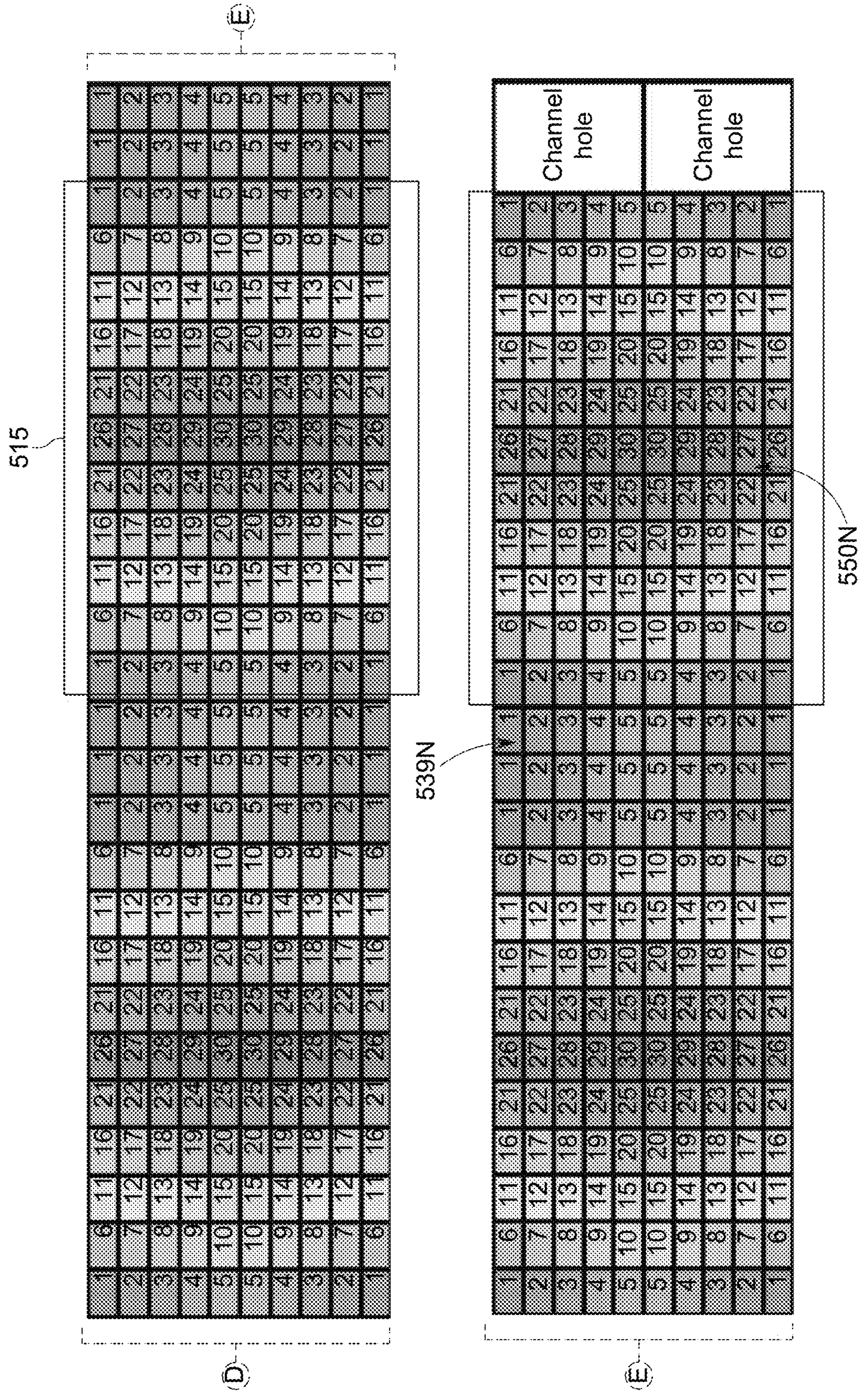

Turning now to FIG. 5A, another approach for forming a device 500 according to embodiments of the present disclosure is shown. The device 500 may be initially processed using the approach described above and shown in FIGS. 2A-2D. The device 500 may be further processed using the approach described above and shown in FIG. 3A. As shown, the device 500 may include an array 505 including contact openings processed to form a series of alternating deeper sections 550A-550L and etch-free areas 539.

A lithography mask (not shown) may be formed over the array 505 of the device 500, and a plurality of openings 515 may be formed therethrough to expose portions of the array 505. The exposed portions of the array 505 are then etched to increase a depth of the affected contact openings. In this step, every other deeper section (e.g., 550B, 550D, etc.) may be etched.

Figure 5B:
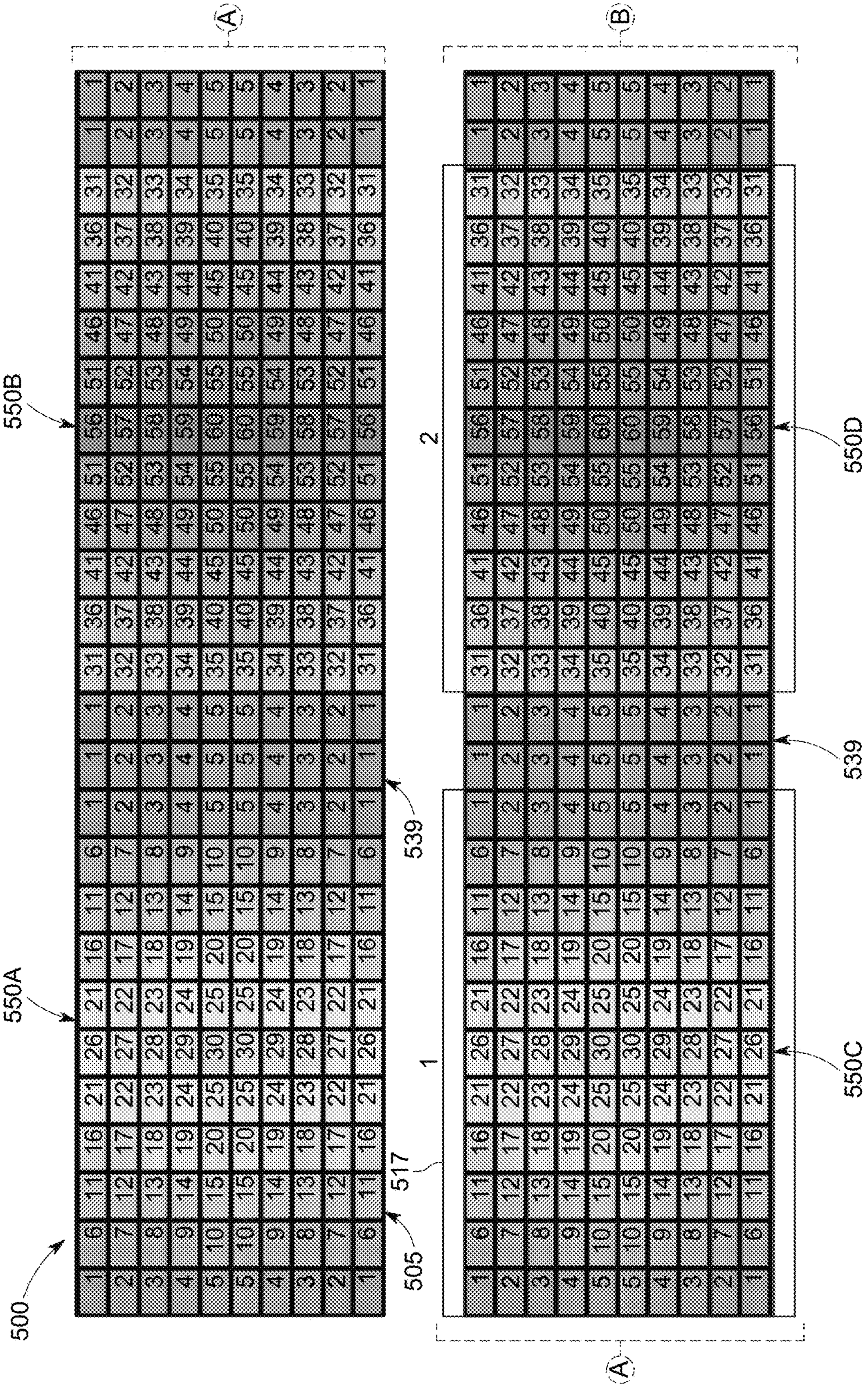
Figure 5B:
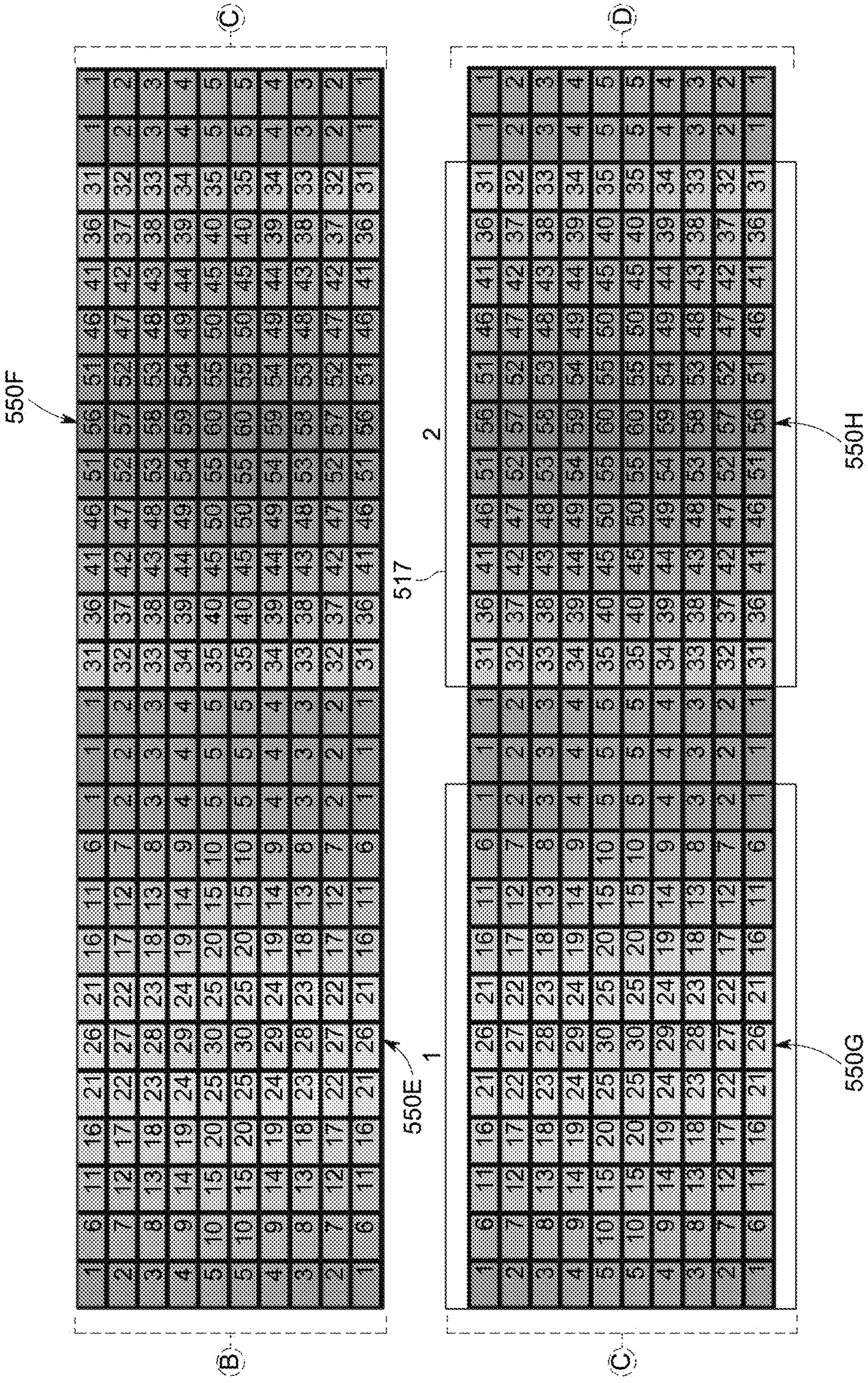
Figure 5B:
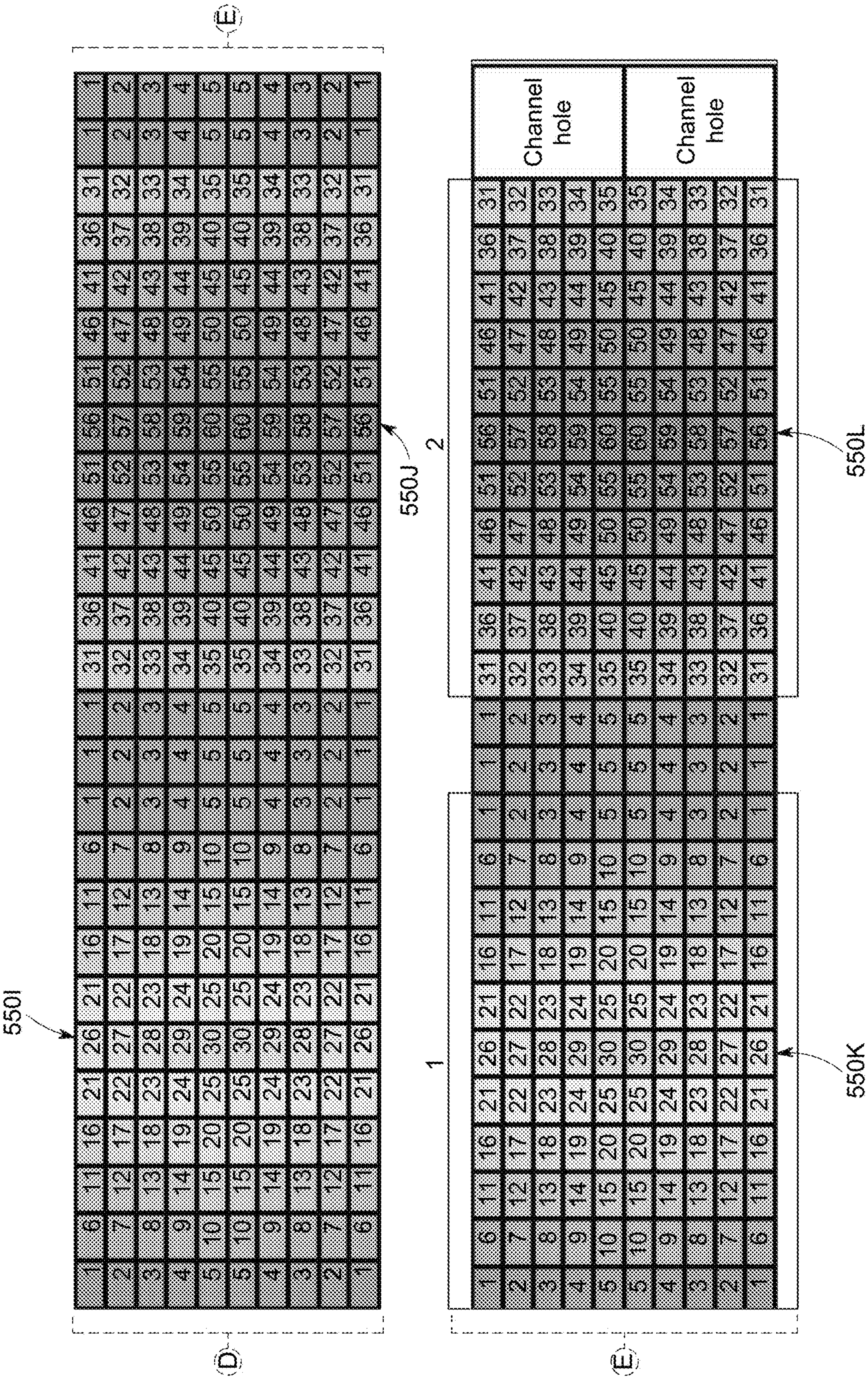

As shown in FIG. 5B, the array 505 is subjected to a series of additional lithography and etch steps, wherein a plurality of openings 517 are formed through the lithography mask (not shown) to further increase a depth of the affected contact openings. As shown, deeper sections 550C, 550D, 550G, 550H, 550K, and 550L are etched. More specifically, deeper sections 550D, 550H, and 550L may be etched twice for each time deeper sections 550C, 550G, and 550K are etched.

Figure 5C:
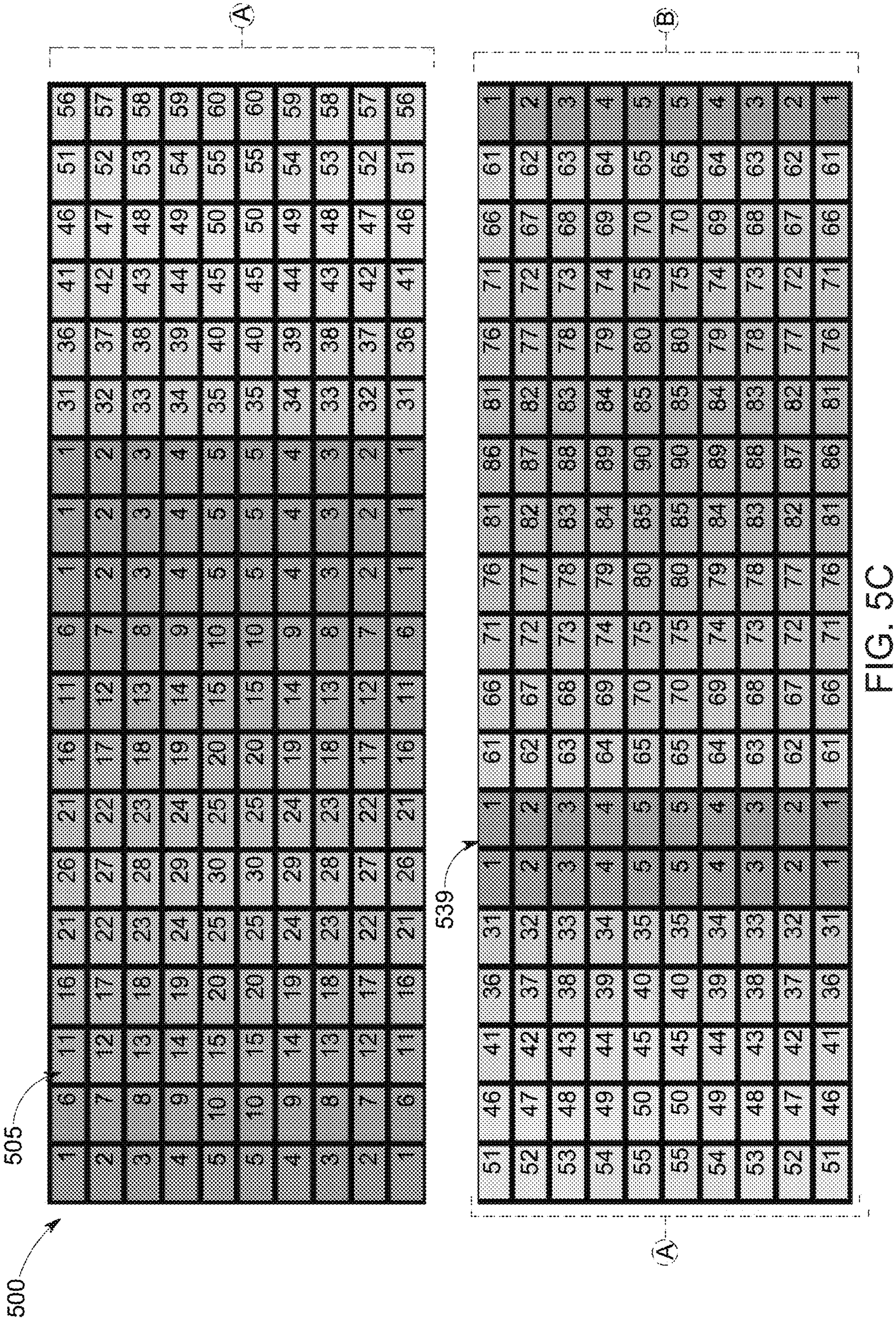
Figure 5C:
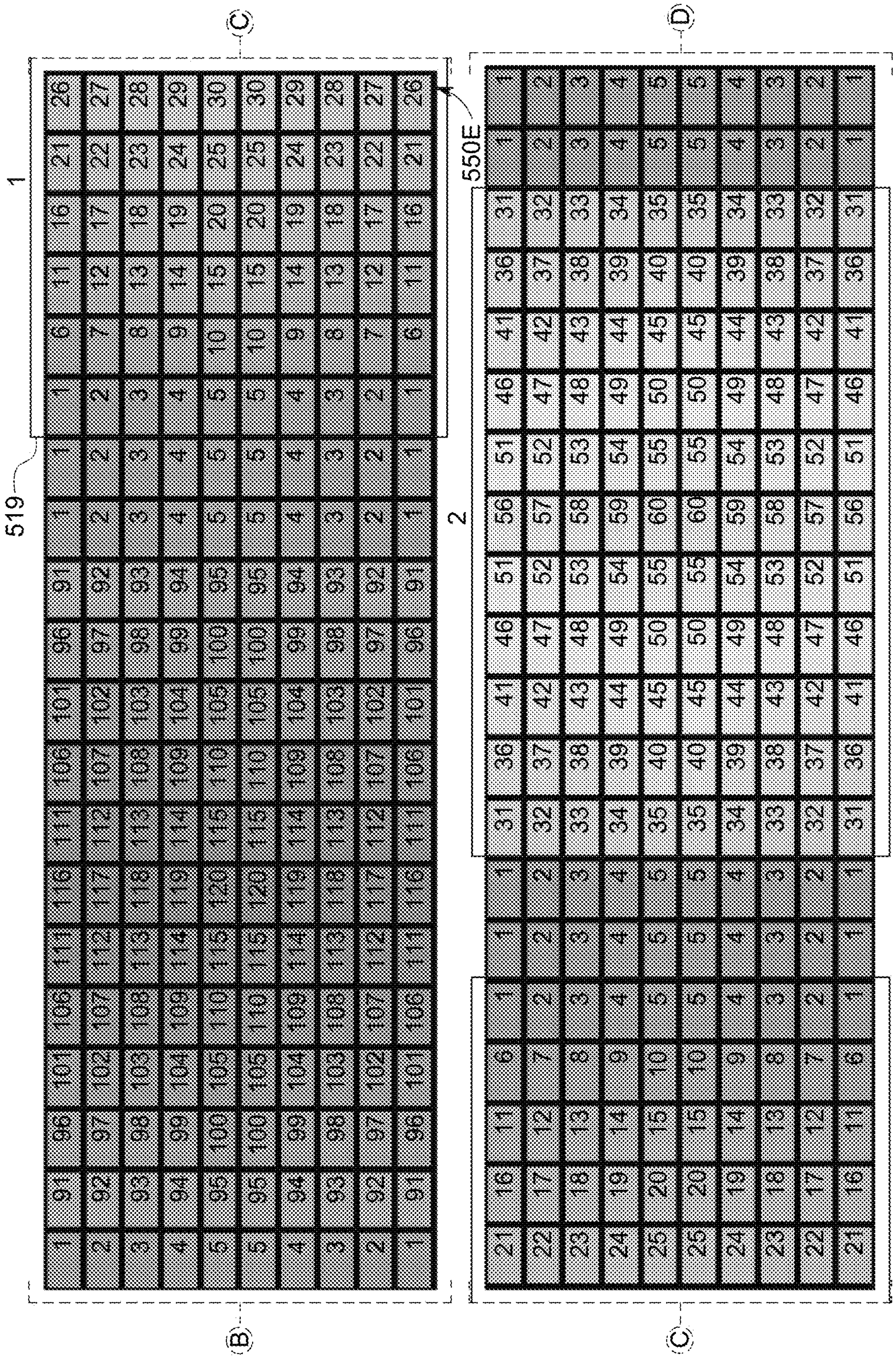
Figure 5C:
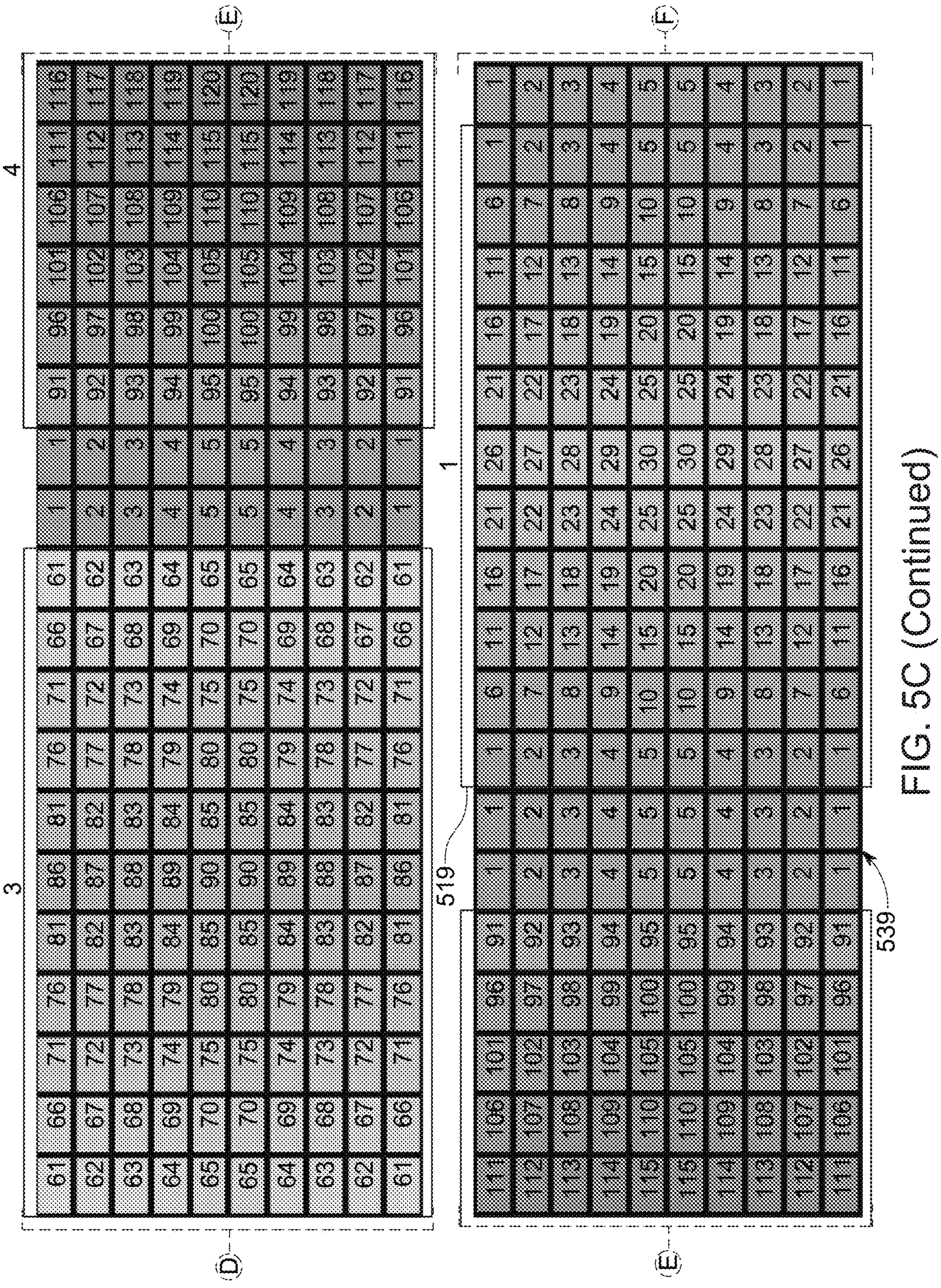
Figure 5C:
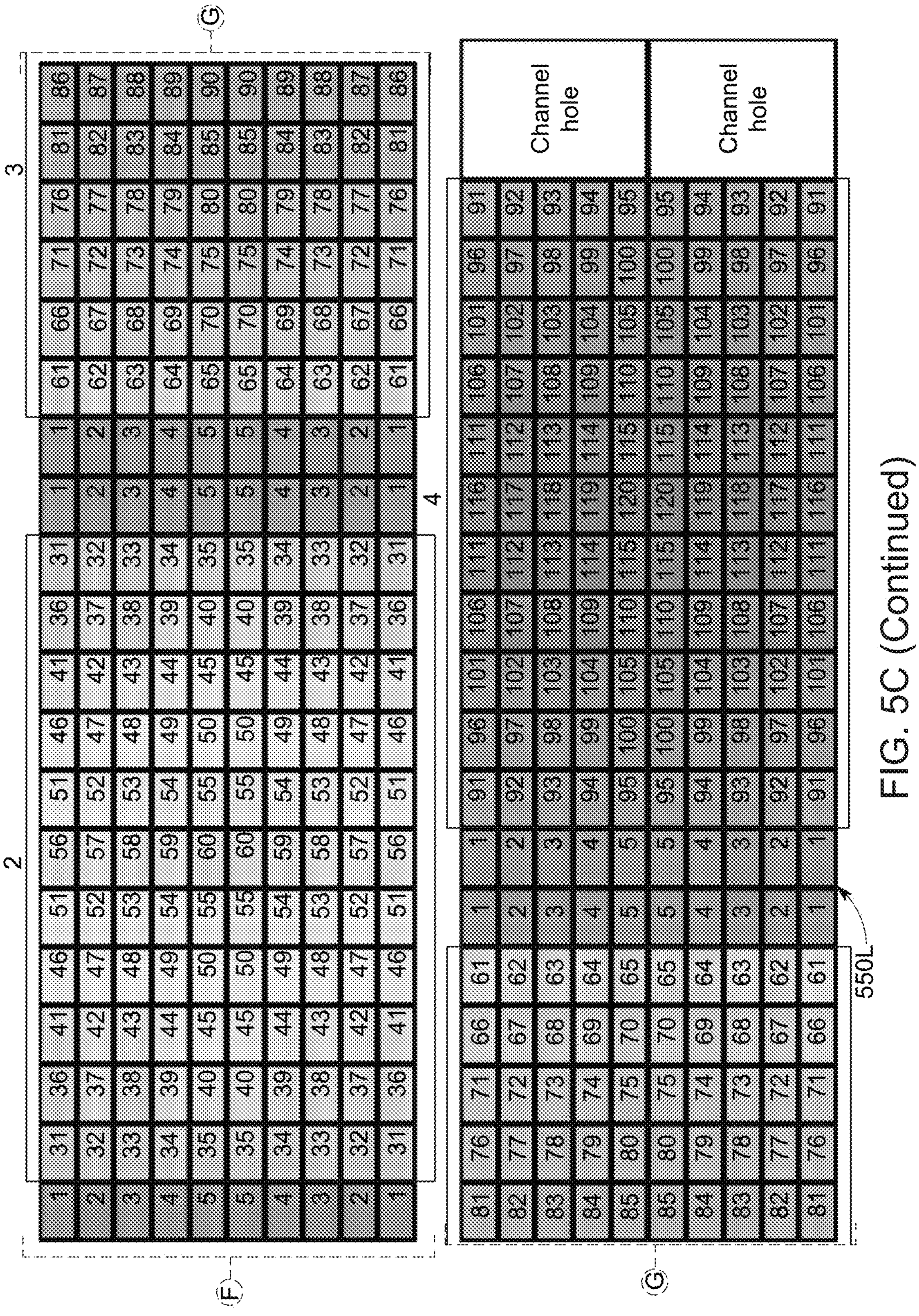

As shown in FIG. 5C, the array 505 is subjected to a series of additional lithography and etch steps, wherein a plurality of openings 519 are formed through the lithography mask (not shown) to further increase a depth of the affected contact openings. As shown, certain of the deeper sections 550E-550L are etched between one and four times.

Figure 5D:
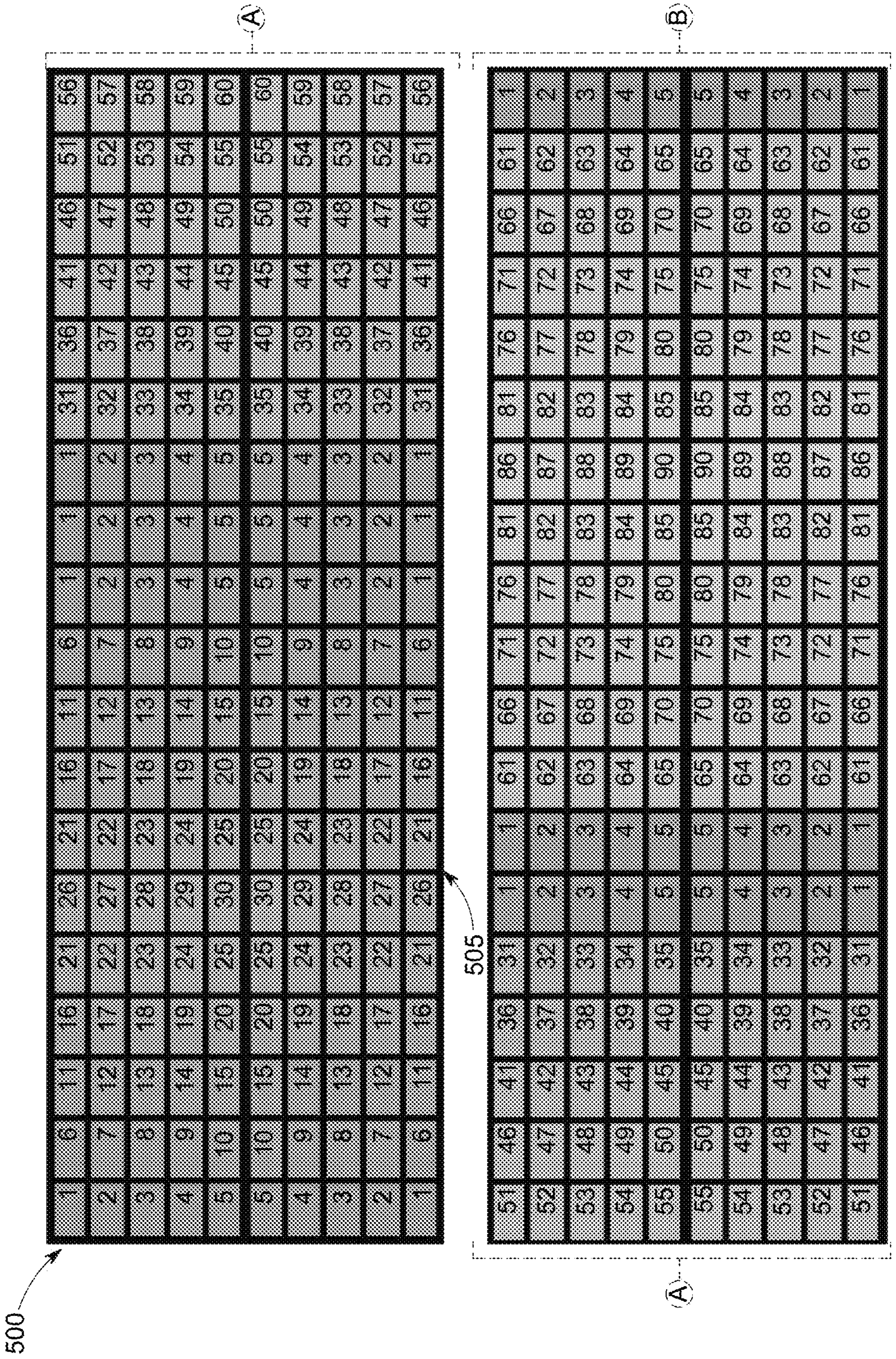
Figure 5D:
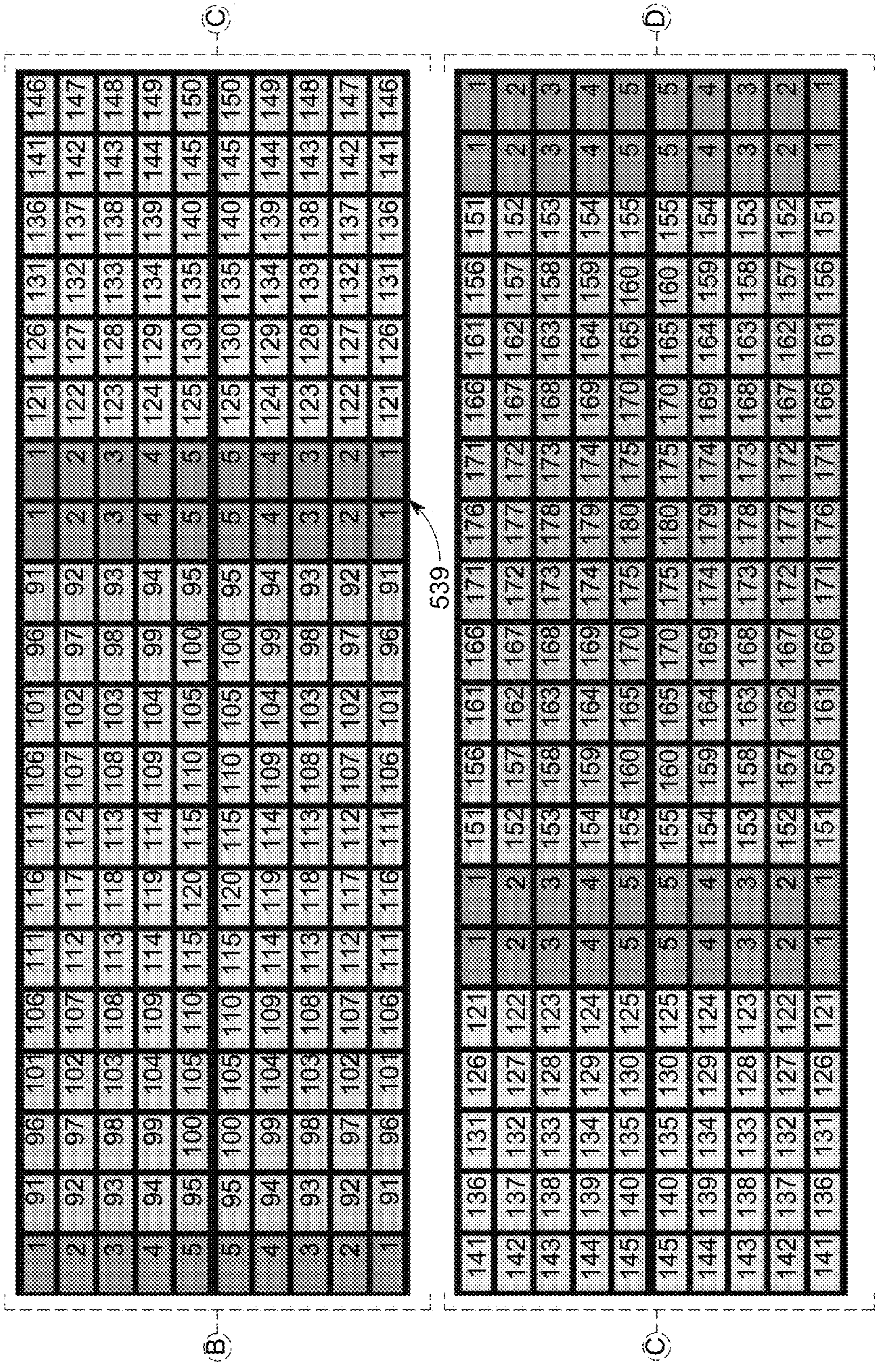
Figure 5D:
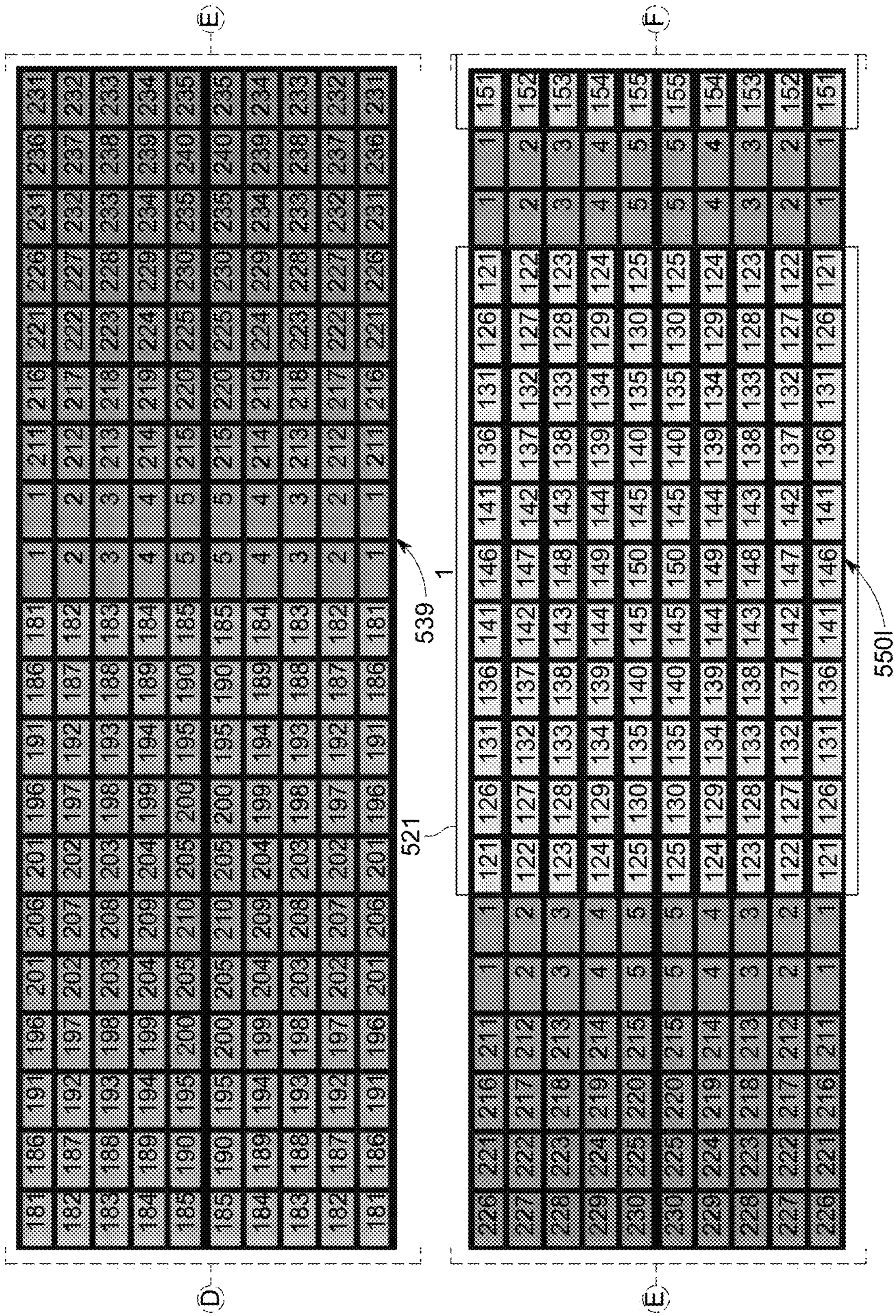
Figure 5D:
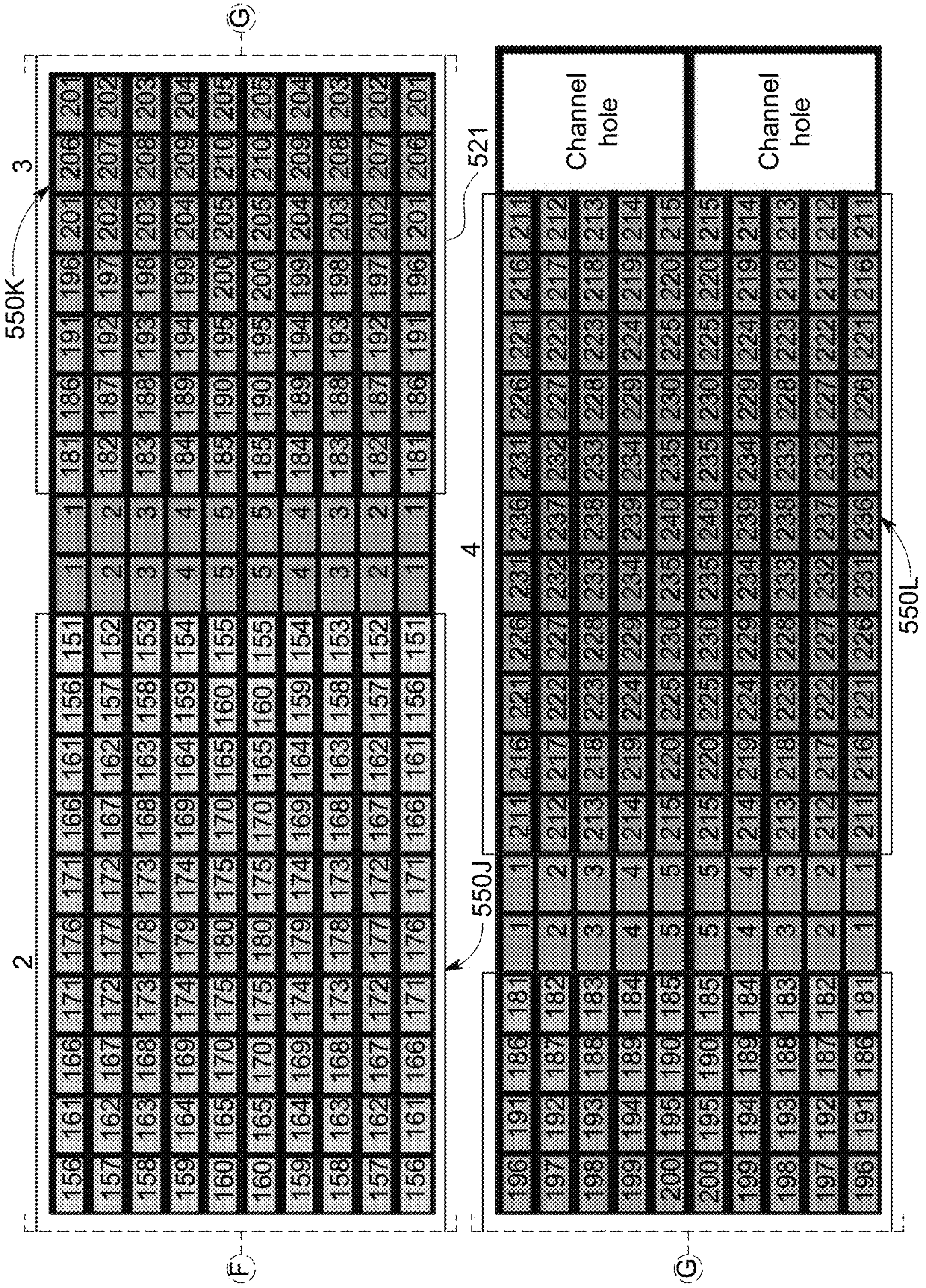
Figure 5E:
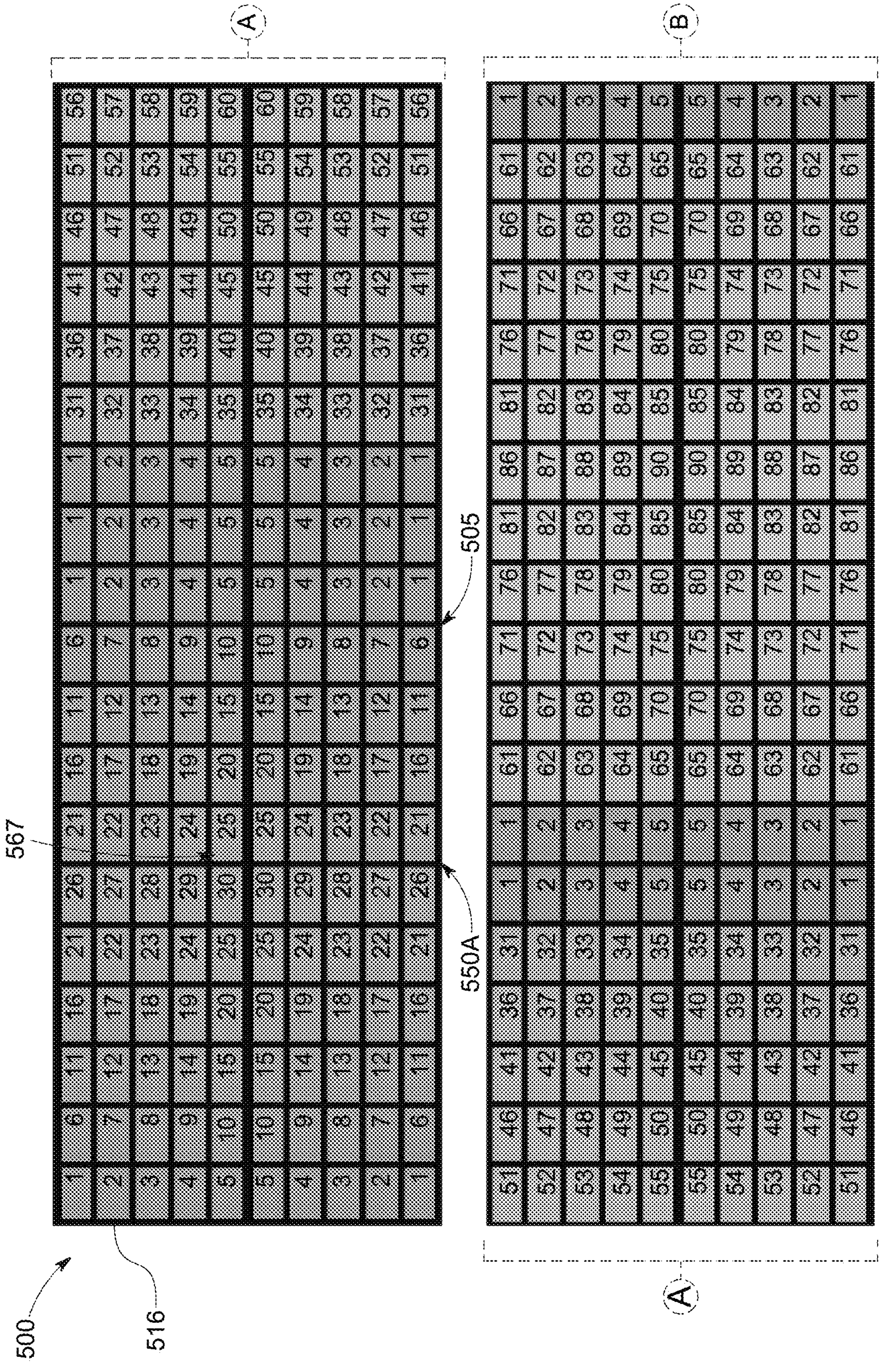
Figure 5E:
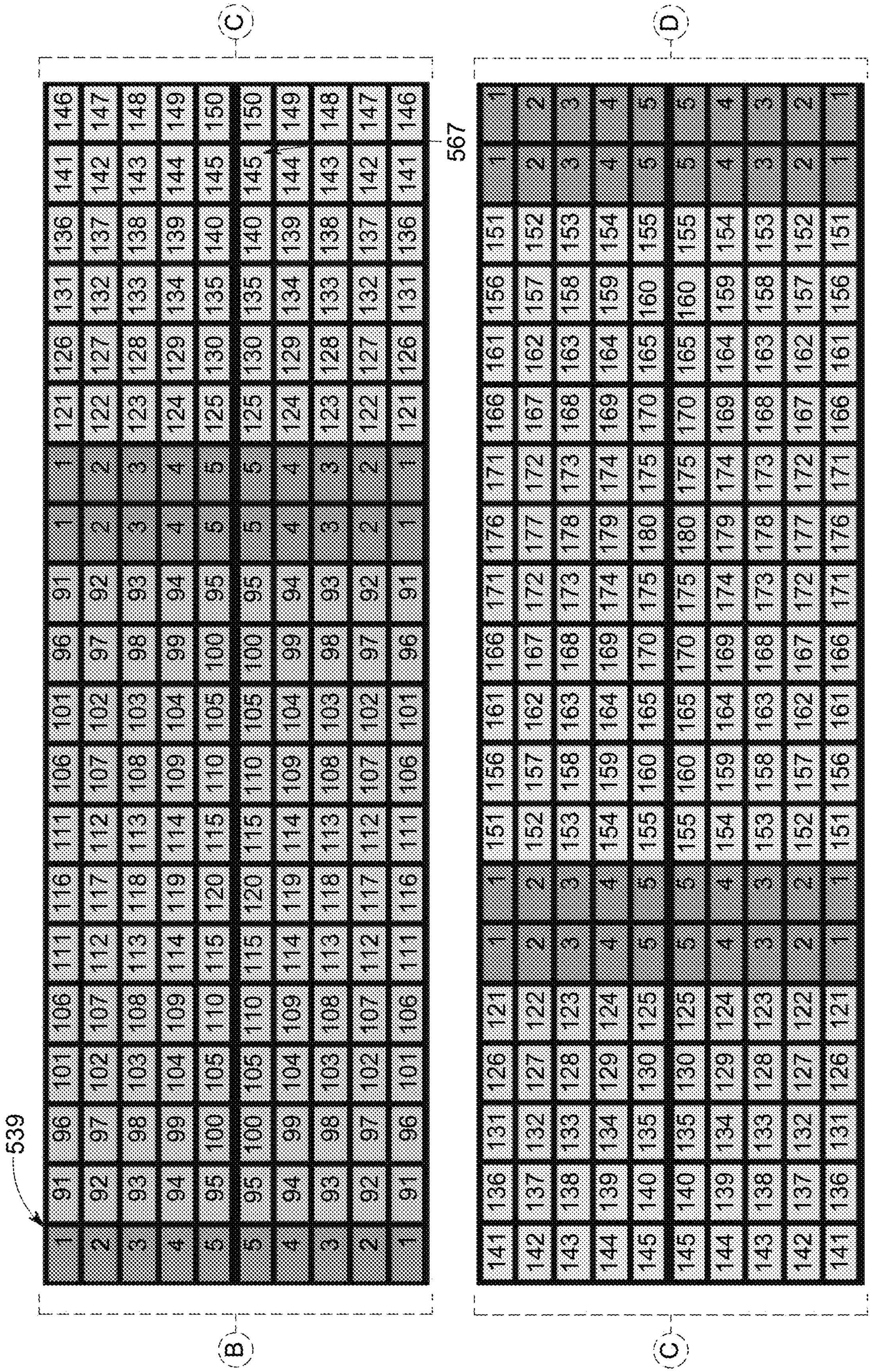
Figure 5E:
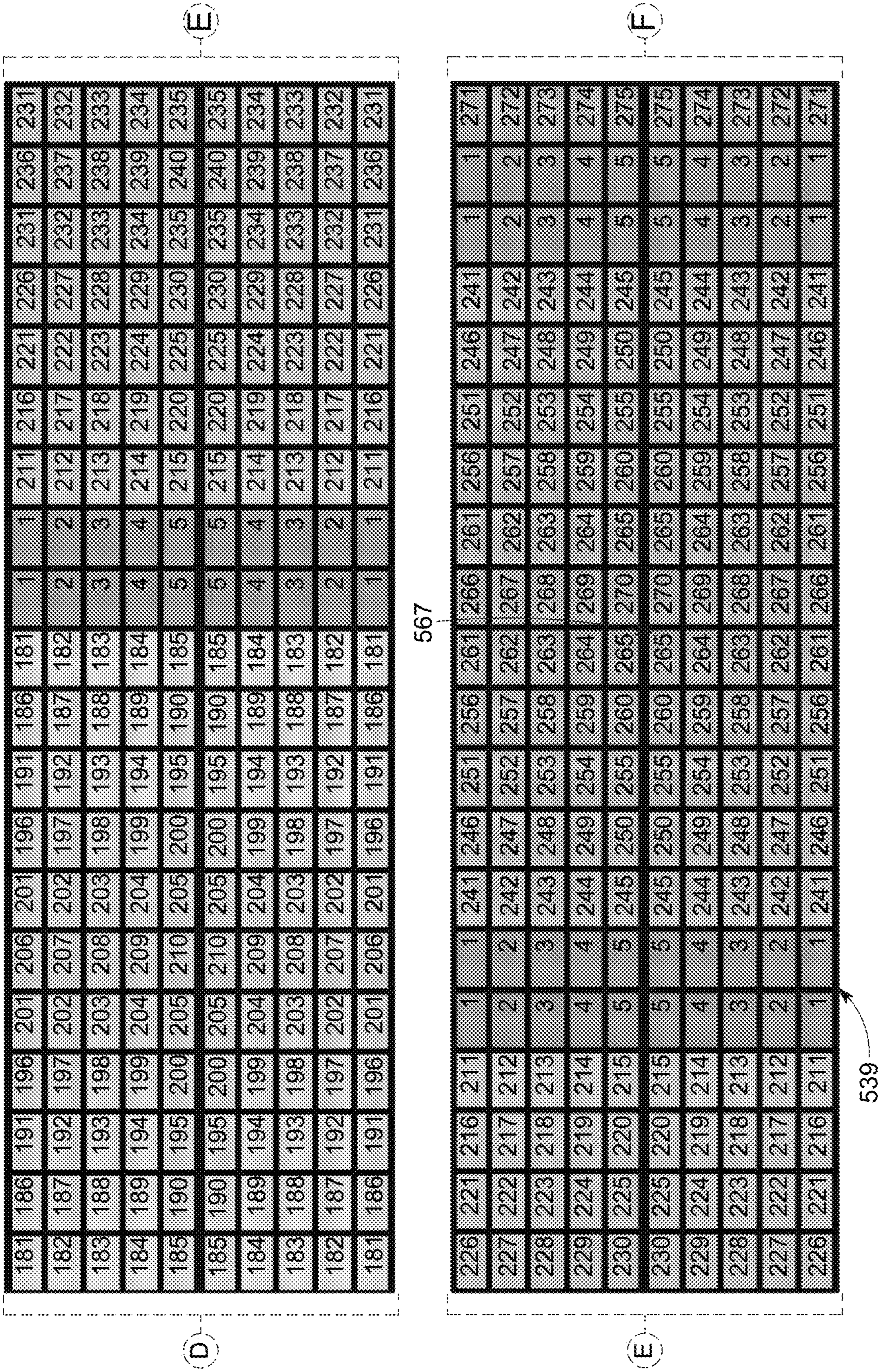
Figure 5E:
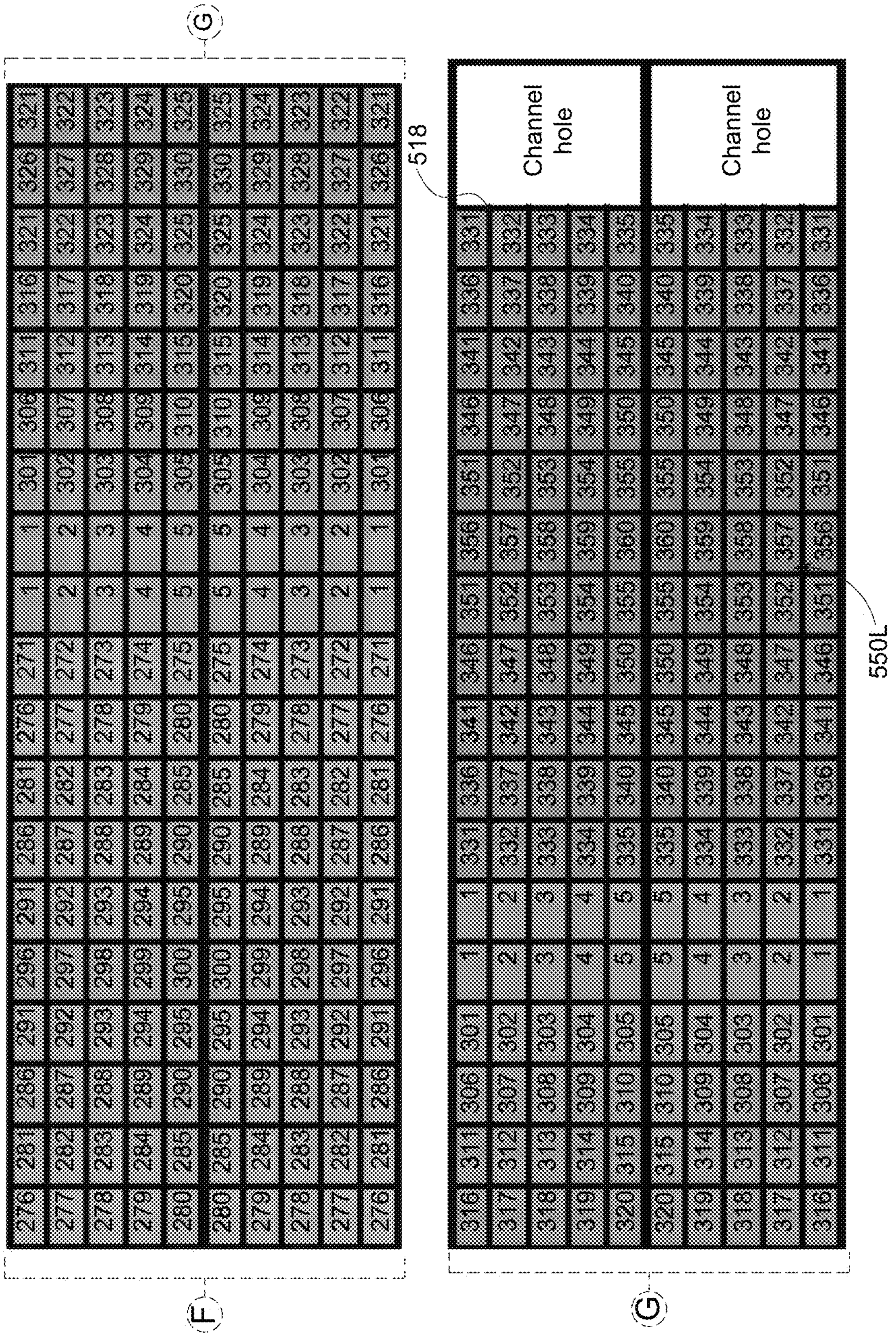

As shown in FIG. 5D, the array 505 is subjected to a series of additional lithography and etch steps, wherein a plurality of openings 521 are formed through the lithography mask (not shown) to further increase a depth of the affected contact openings. As shown, certain of the deeper sections 5501-550L are etched between one and four times, resulting in the device 500 shown in FIG. 5E. As demonstrated, an average depth of the contact openings of the deeper section 550L is the greatest in the array 505. In general, the depth of the contact openings of the array increases between the first end 516 and the second end 518 of the array 505. Furthermore, the depth of the contact openings within each deeper section 550A-550L increases towards a center 567 thereof. Advantageously, the direct wordline contact-last staircase+chop approach demonstrated in FIGS. 5A-5E can reduce the number of max delta pairs from 116 to 29.

Figure 6A:
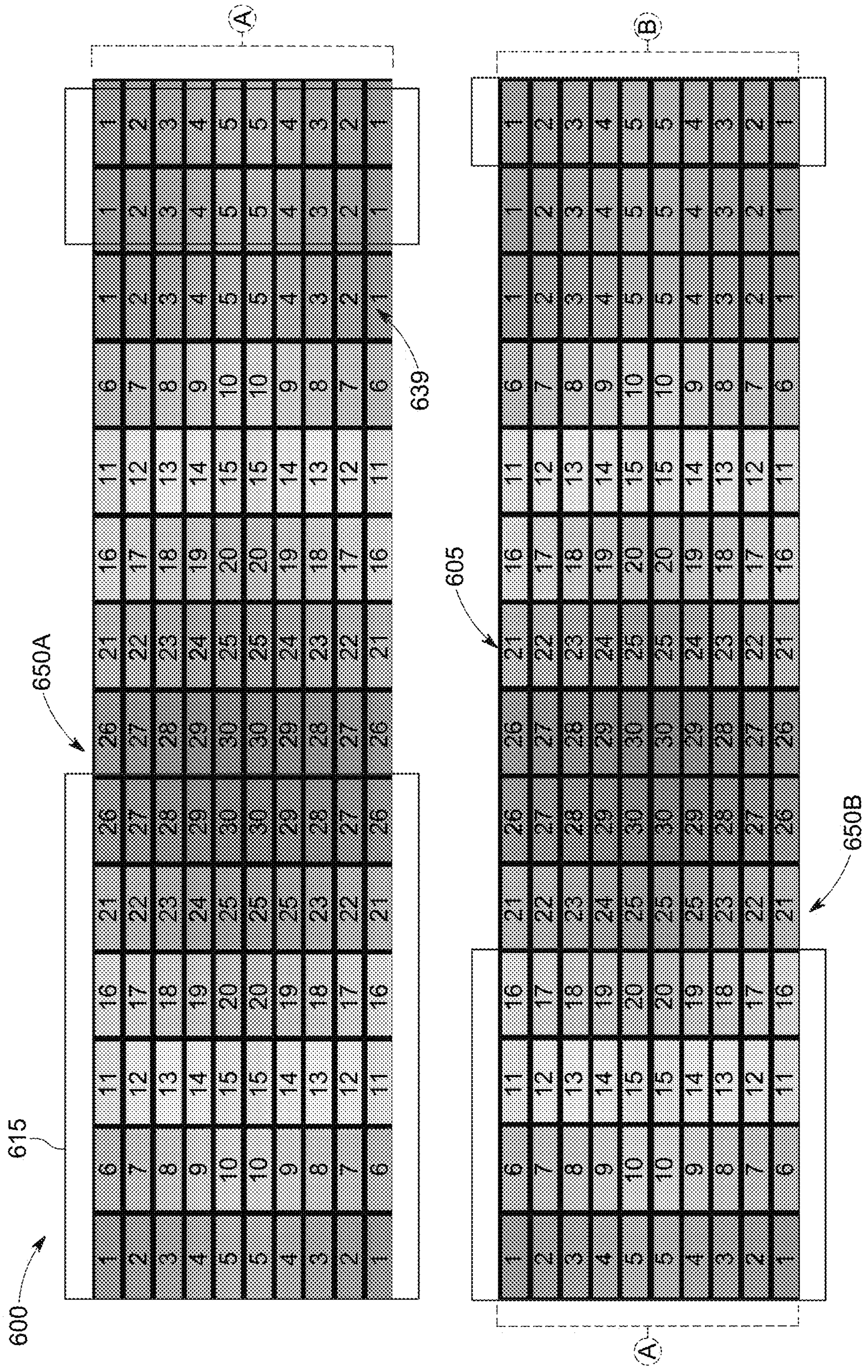
FIGS. 6A-6E illustrate a top view of a series of lithography and etch processes to form a plurality of contact openings therein, according to embodiments of the present disclosure.
Figure 6A:
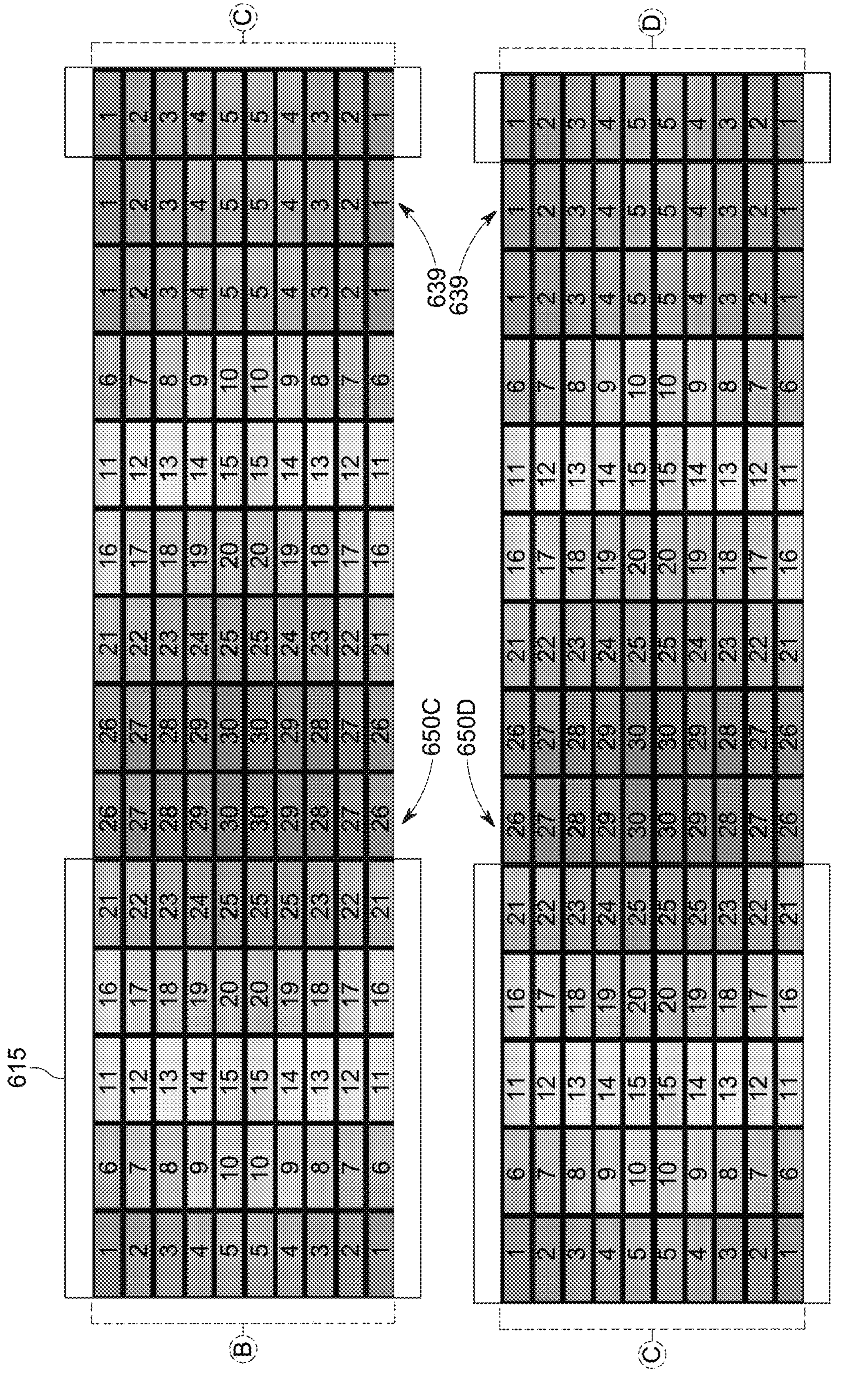
Figure 6A:
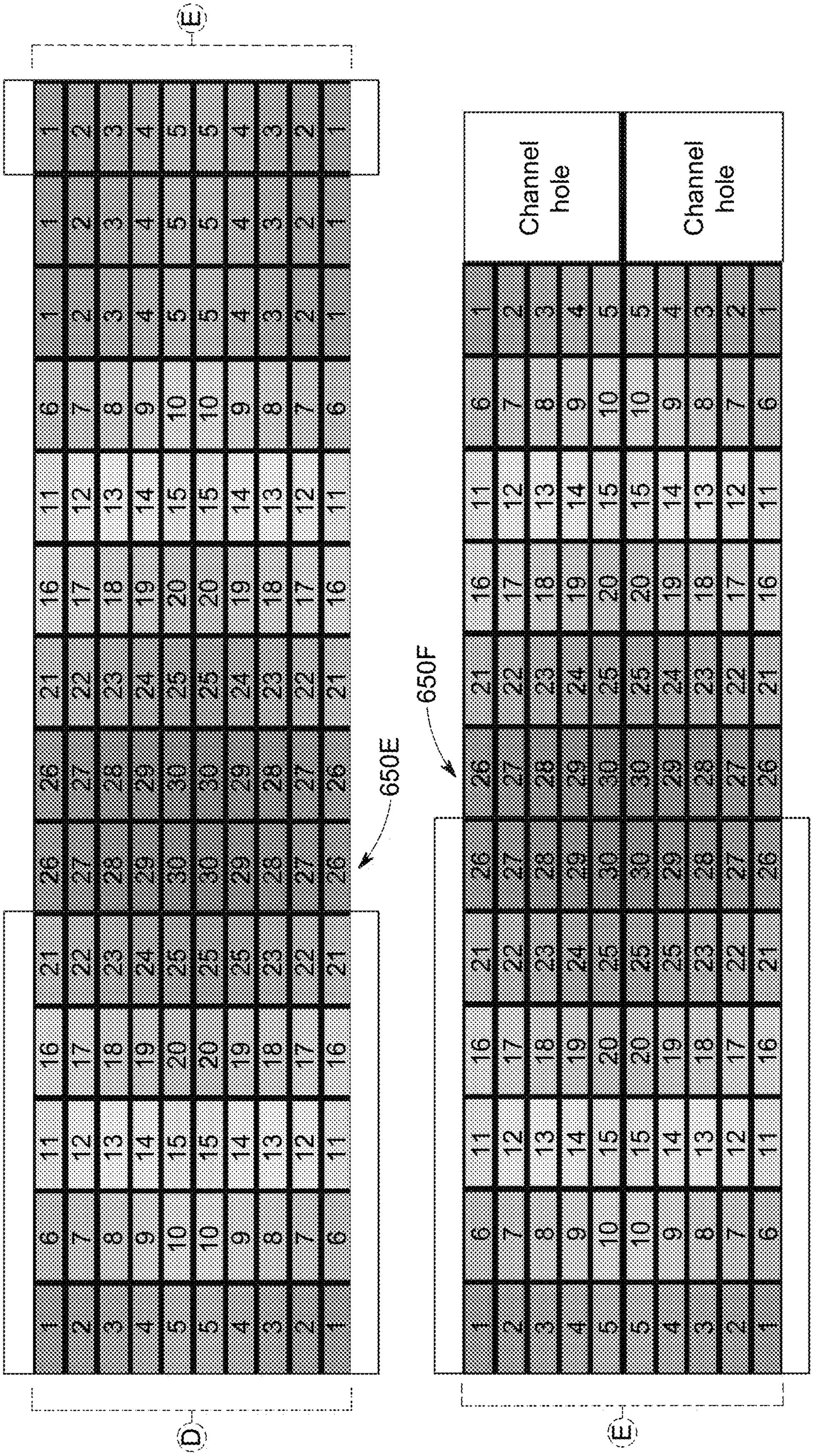

Turning now to FIG. 6A, another approach for forming a device 600 according to embodiments of the present disclosure is shown. The device 600 may be initially processed using the approach described above and shown in FIGS. 2A-2D. The device 500 may be further processed using the approach described above and shown in FIG. 3A. As shown, the device 600 may include an array 605 including contact openings processed to form a series of alternating deeper sections 650A-650F and etch-free areas 639.

A lithography mask (not shown) may be formed over the array 605 of the device 600, and a plurality of openings 615 may be formed therethrough to expose portions of the array 605. The exposed portions of the array 505 are then etched to increase a depth of the affected contact openings. In this step, each opening 615 may expose a portion of each deeper section 650A-650F and a portion of each etch-free area 639. Said differently, the each opening 615 may be offset relative to each corresponding deeper section 650A-650F.

Figure 6B:
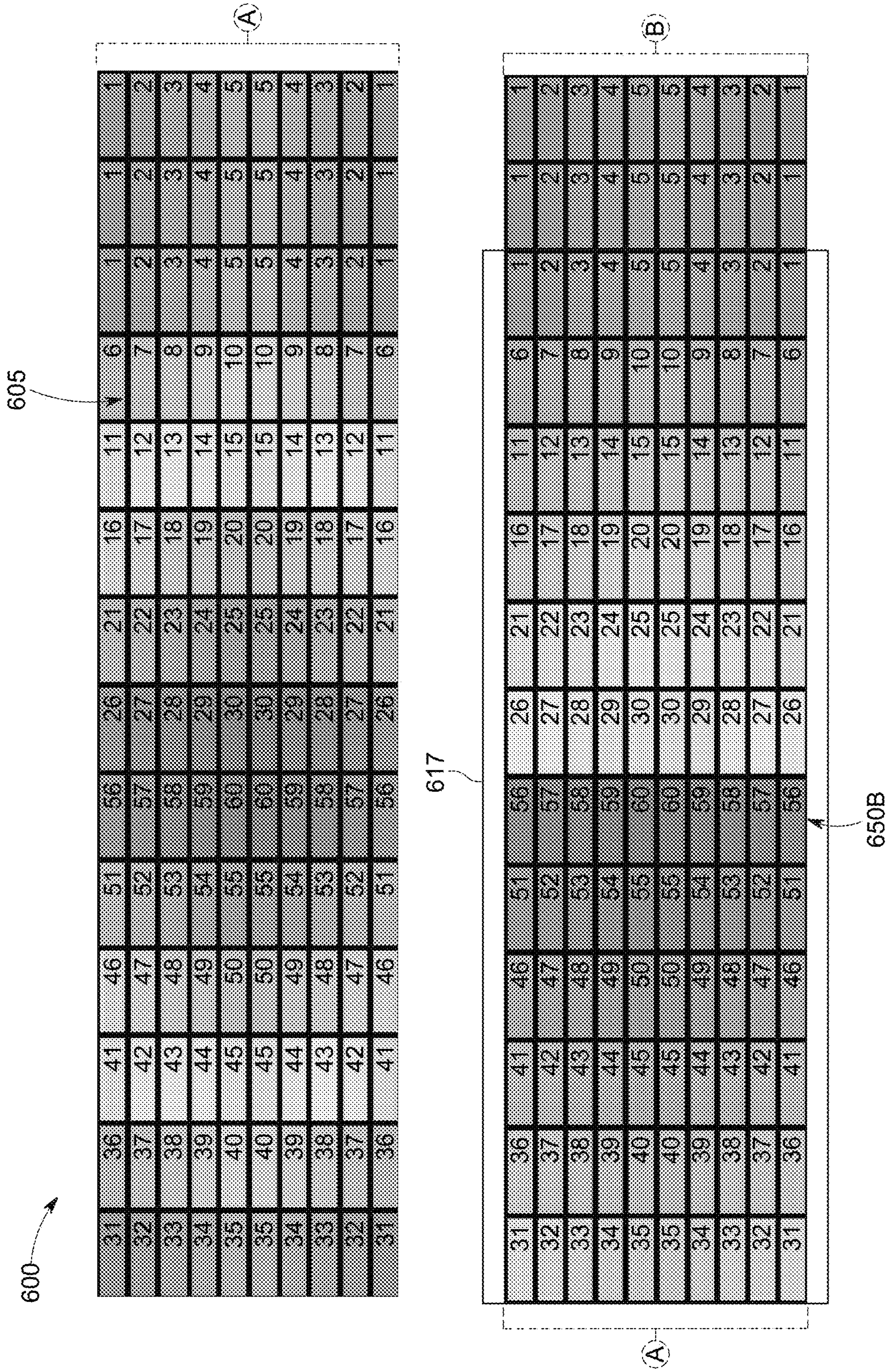
Figure 6B:
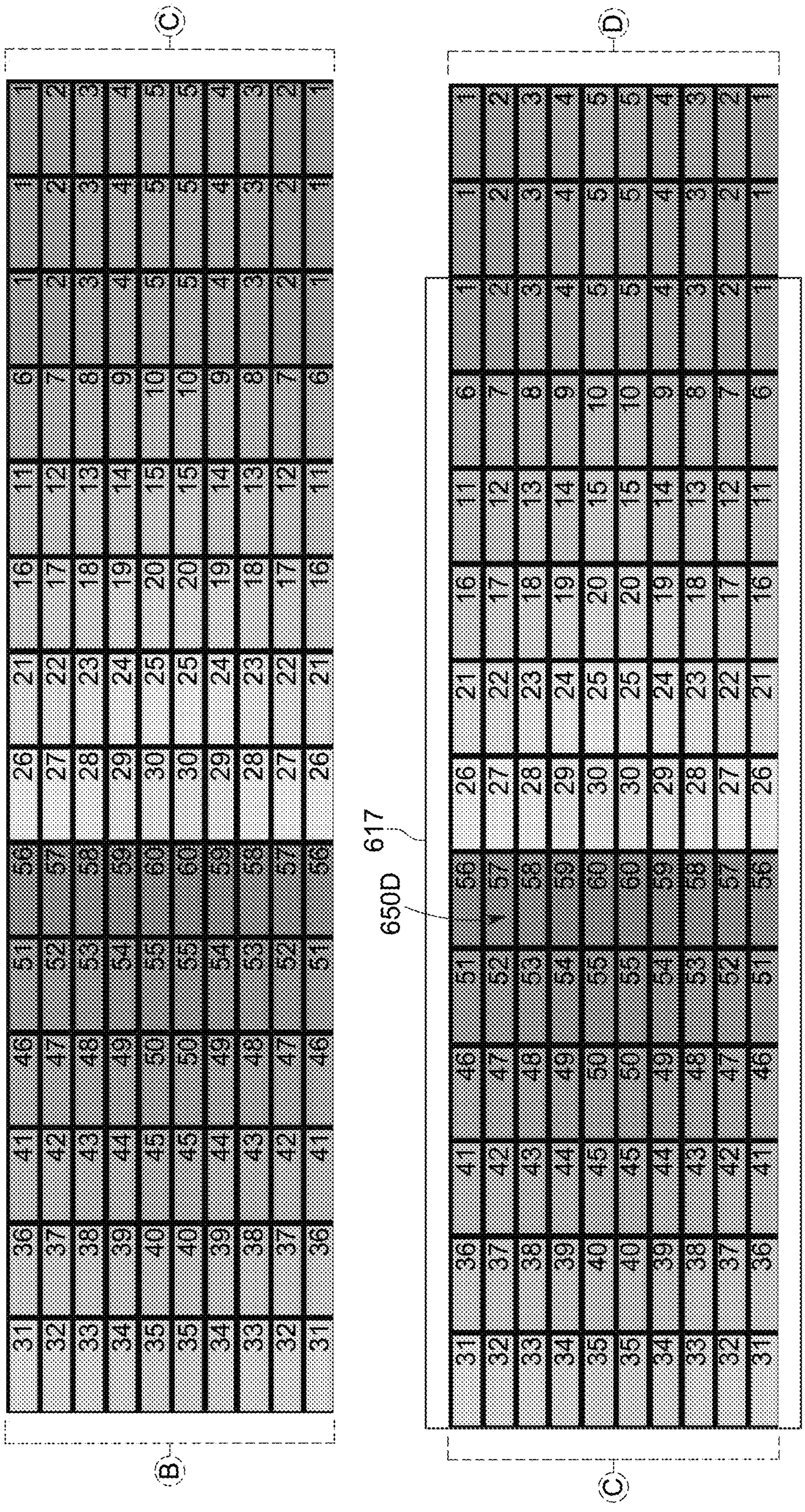
Figure 6B:
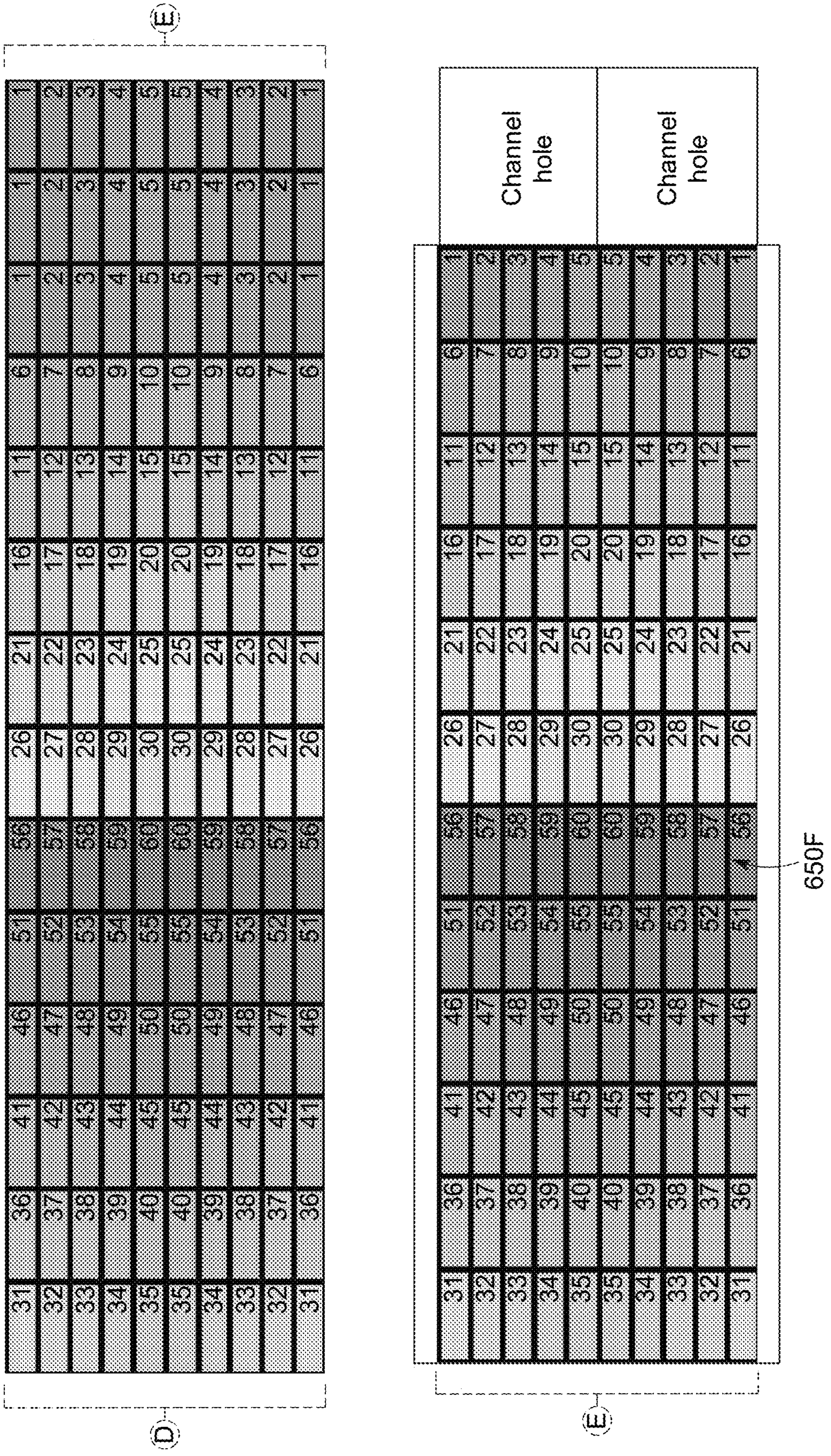

As shown in FIG. 6B, the array 605 is subjected to a series of additional lithography and etch steps. Here, a plurality of openings 617 are formed through the lithography mask (not shown) to further increase a depth of the affected contact openings. As shown, deeper sections 650B, 650D, and 650F are centered beneath openings 617 and then etched.

Figure 6C:
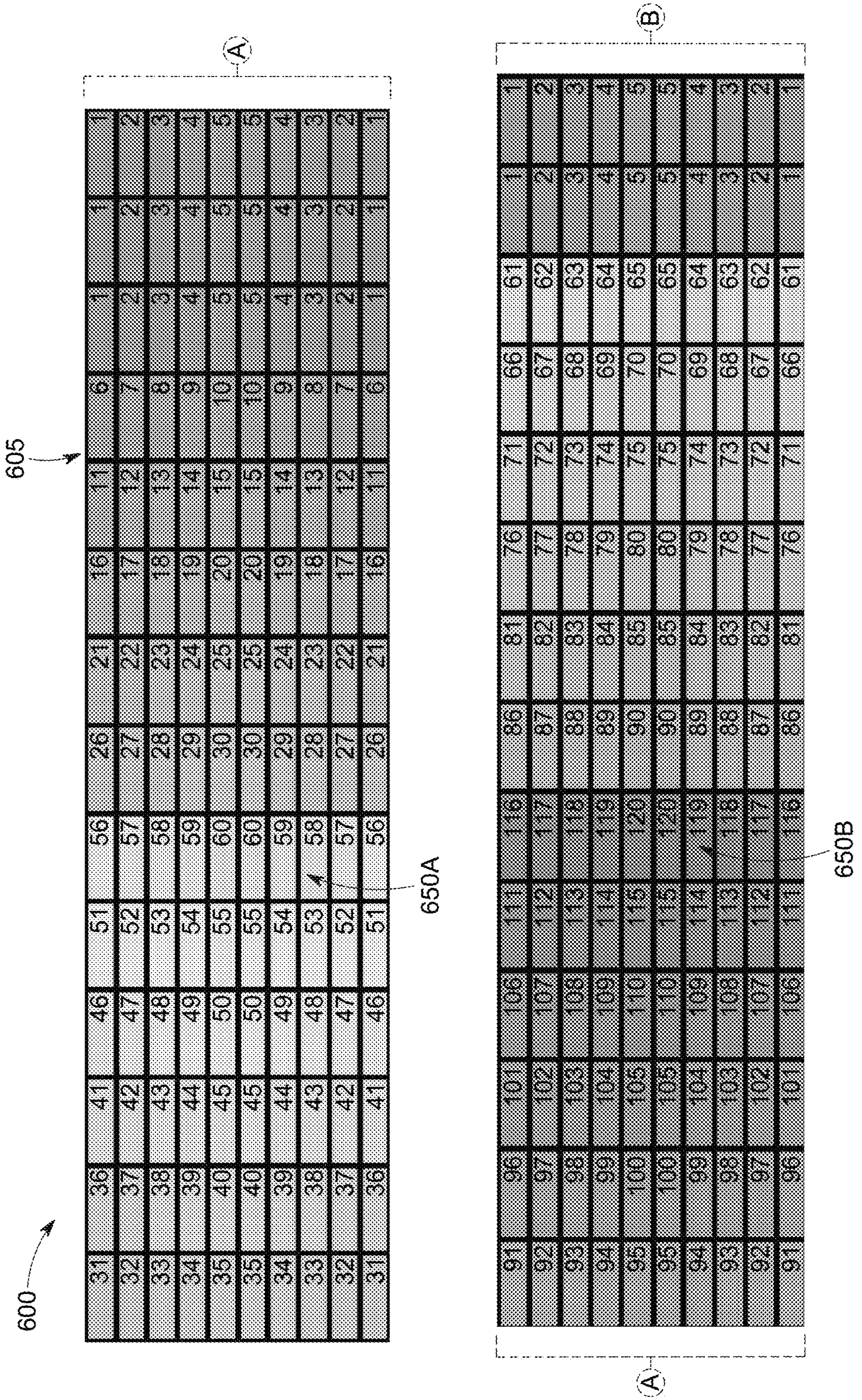
Figure 6C:
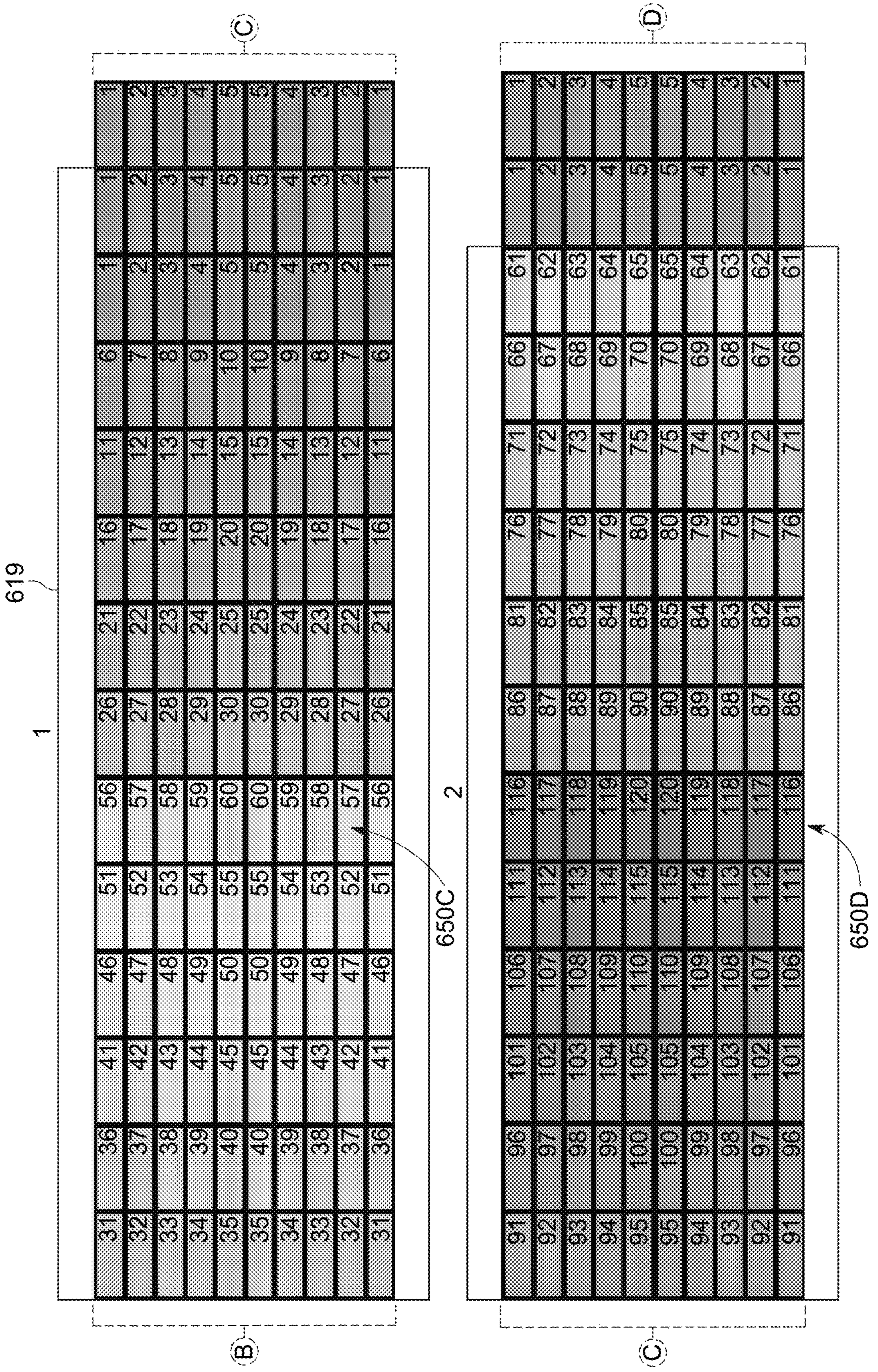
Figure 6C:
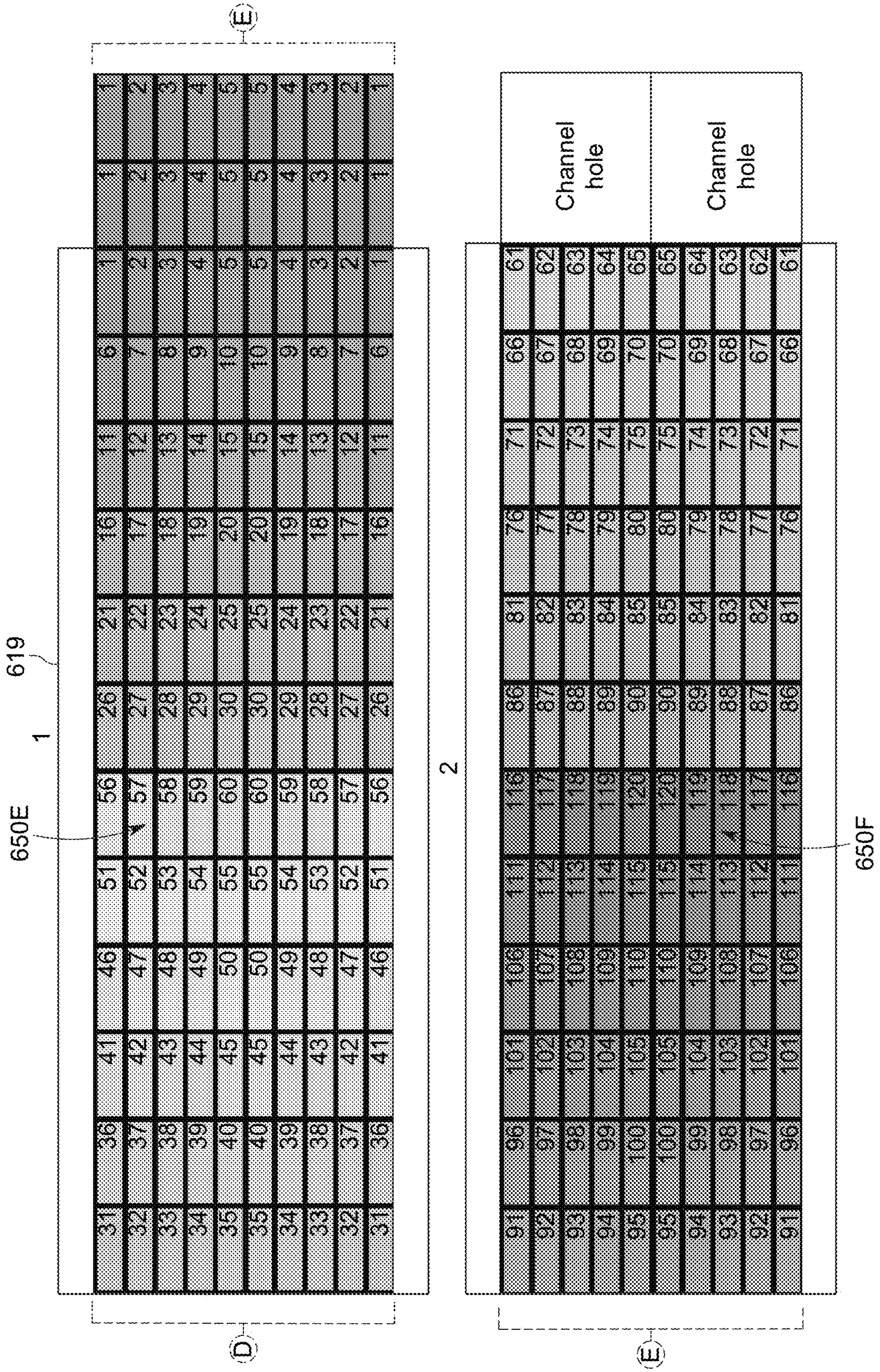

As shown in FIG. 6C, the array 605 is subjected to a series of additional lithography and etch steps, wherein a plurality of openings 619 are formed through the lithography mask (not shown) to further increase a depth of the affected contact openings. As shown, deeper sections 650C-650F are etched between one and two times, while deeper sections 650A, 650B remain unaffected in this step.

Figure 6D:
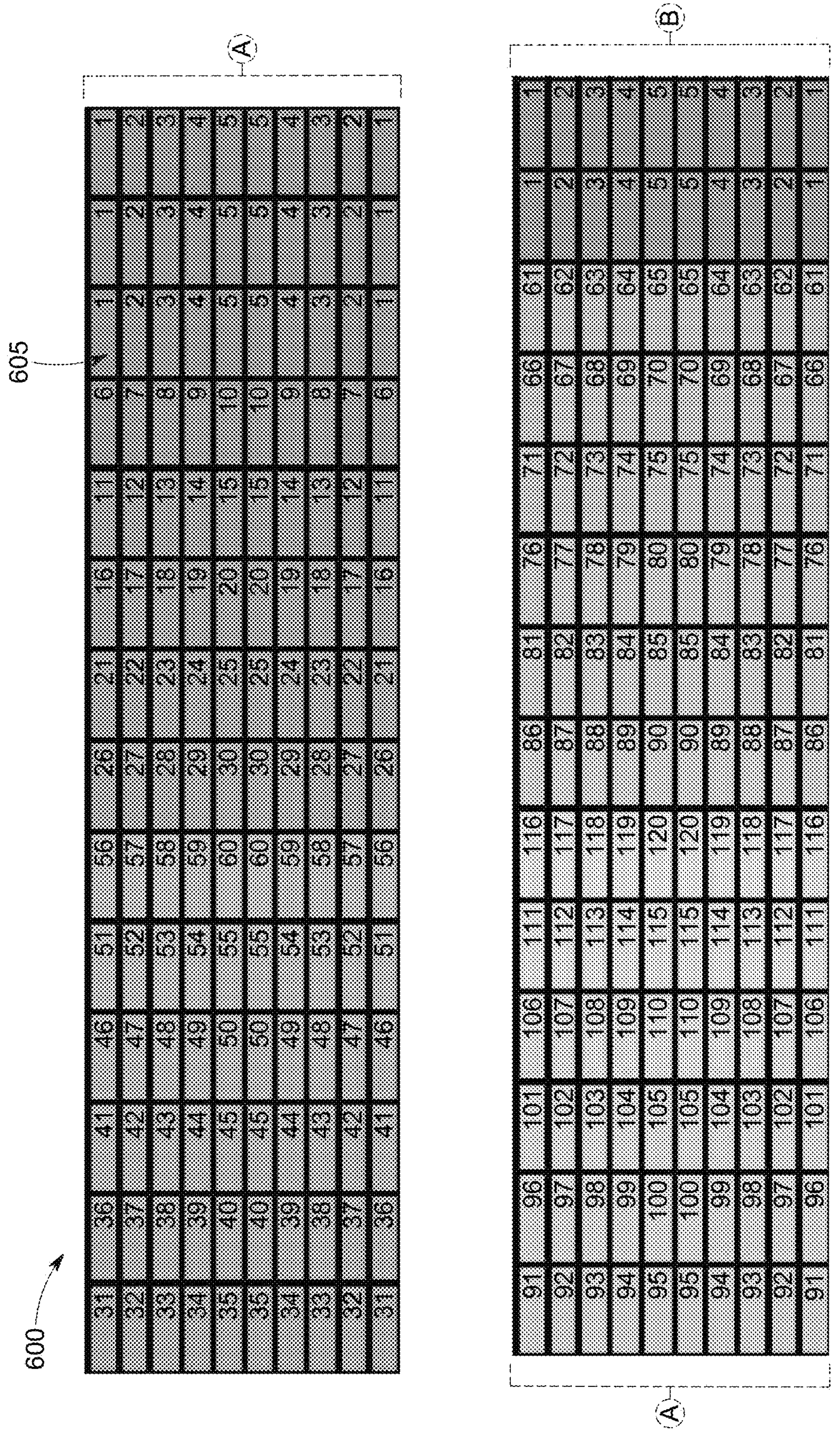
Figure 6D:
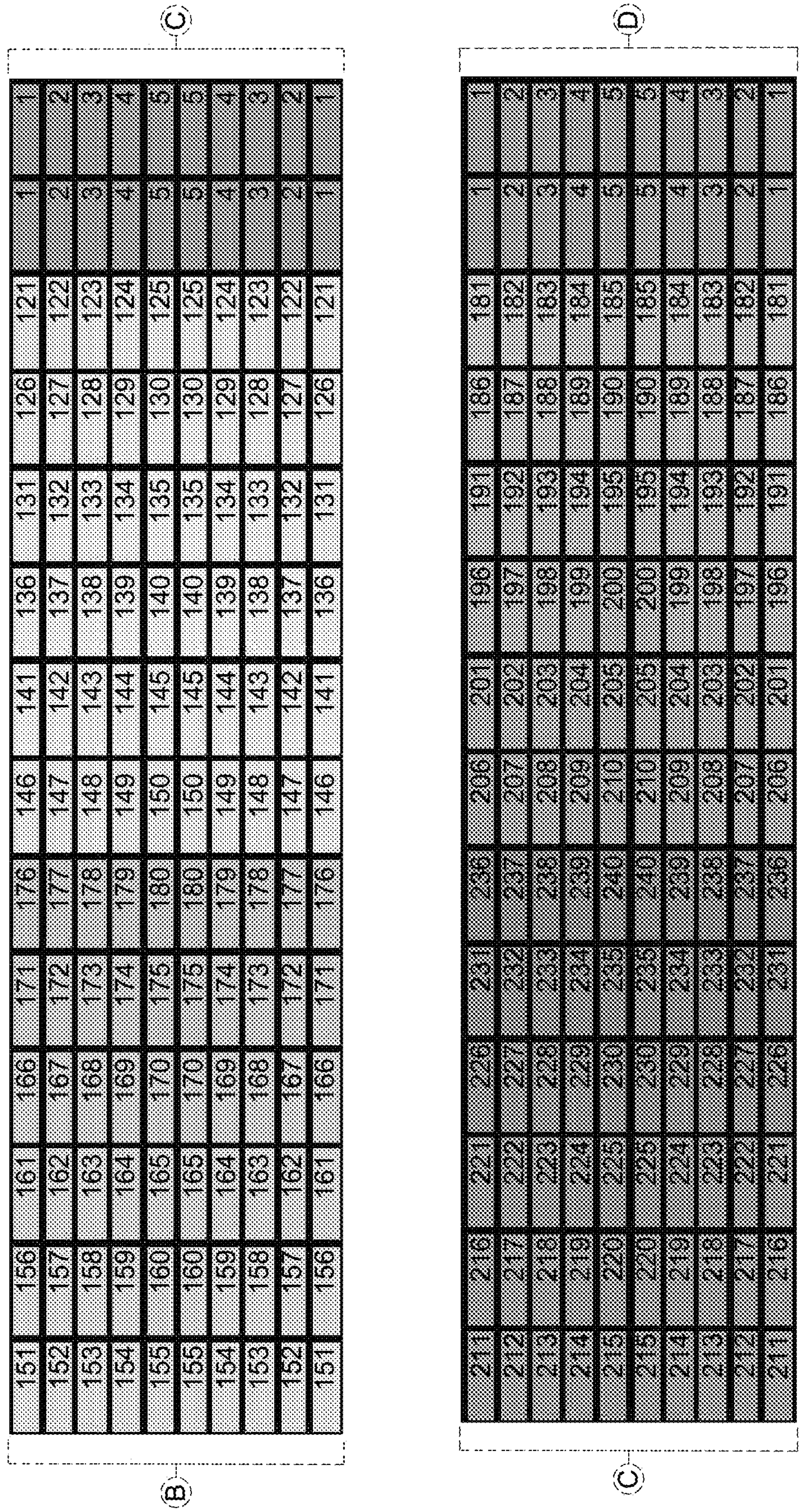
Figure 6D:
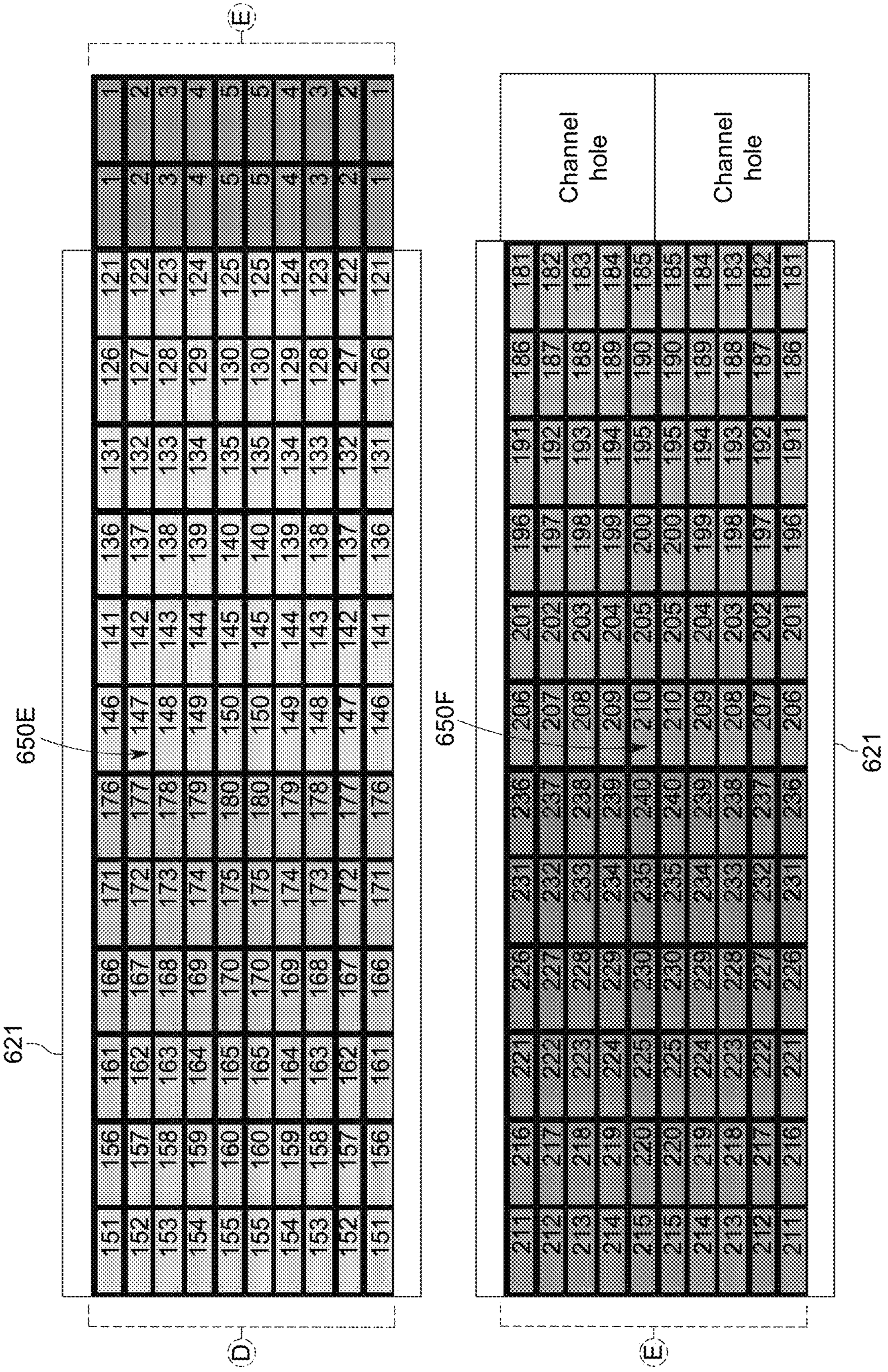
Figure 6E:
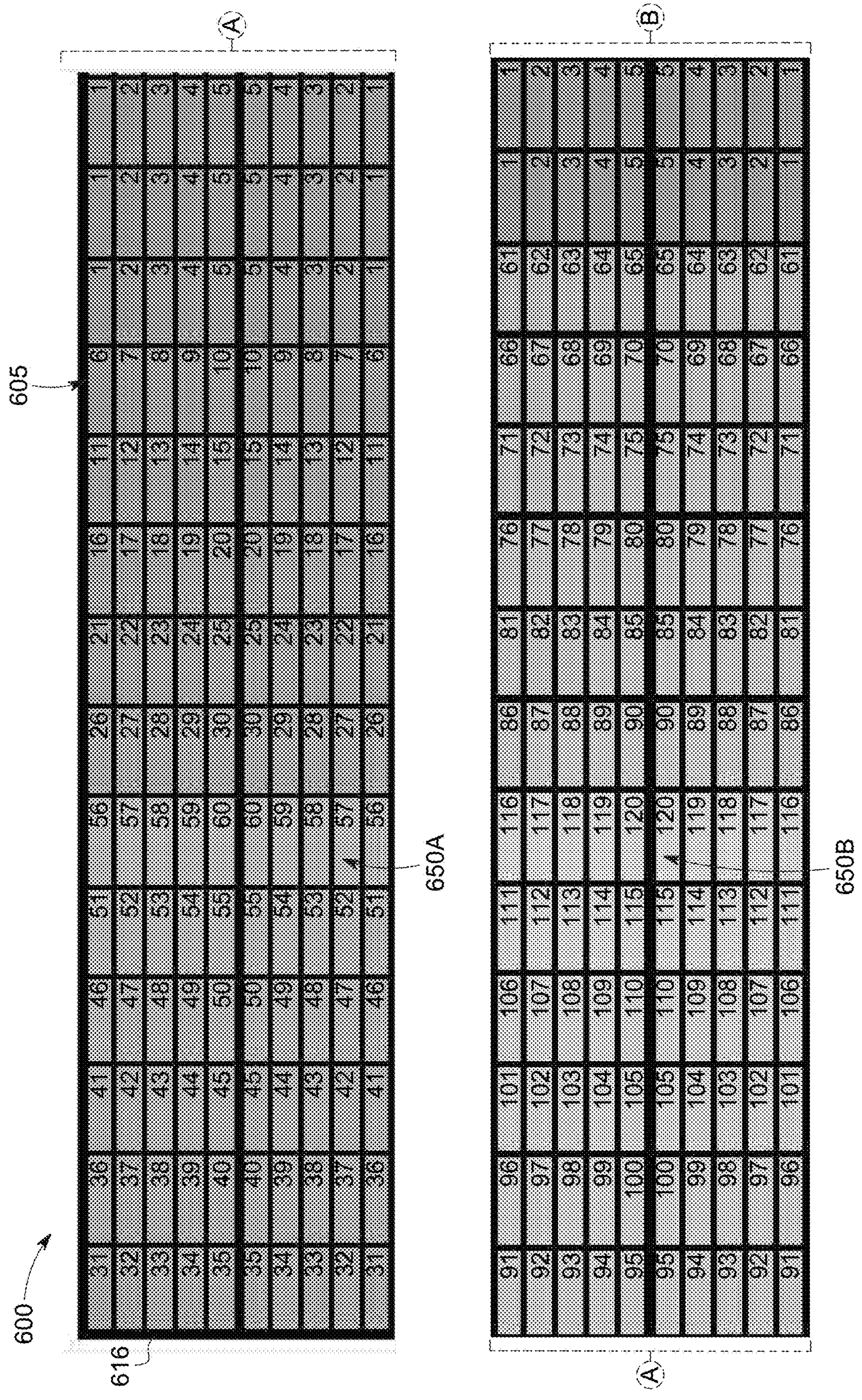
Figure 6E:
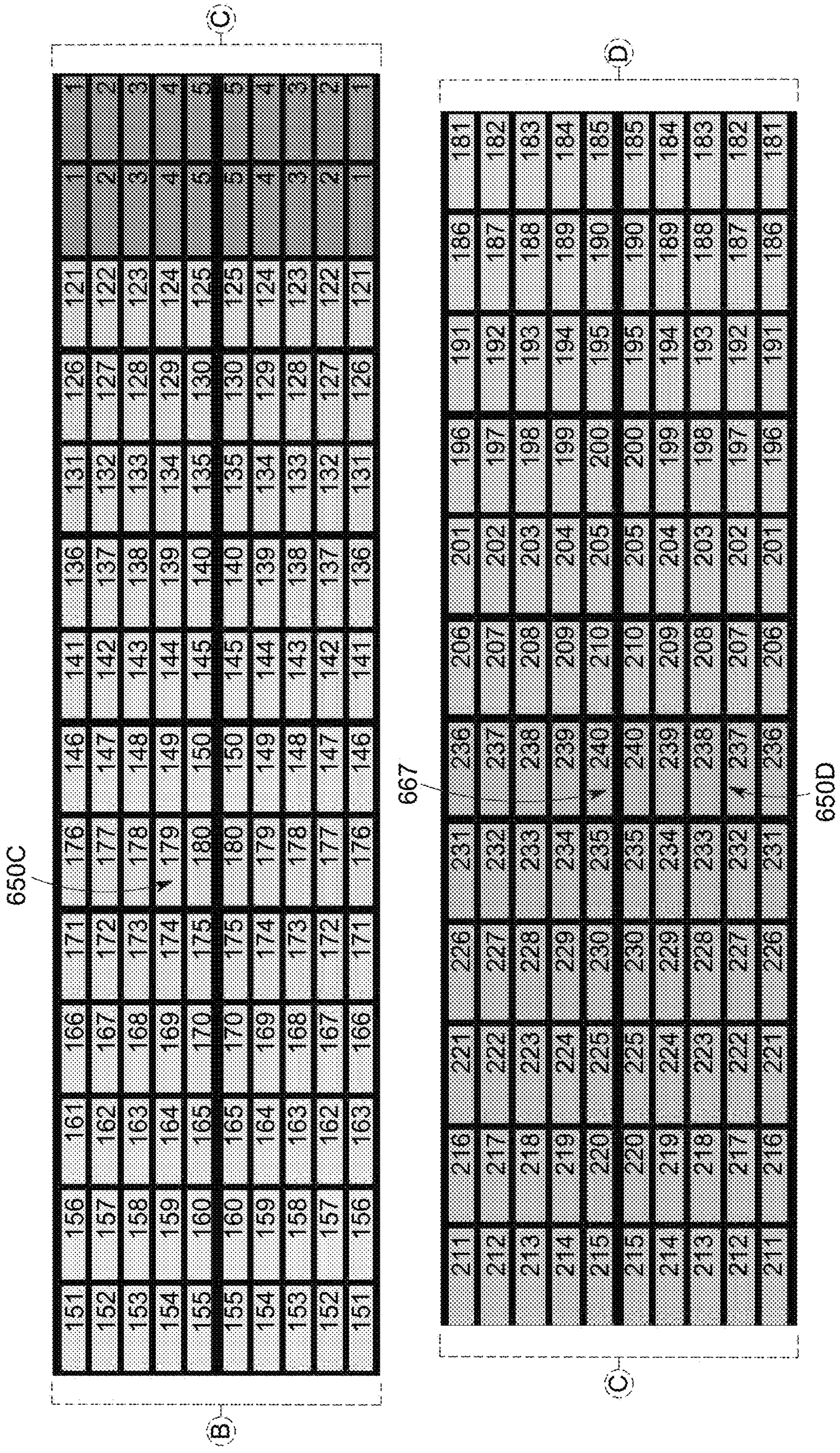
Figure 6E:
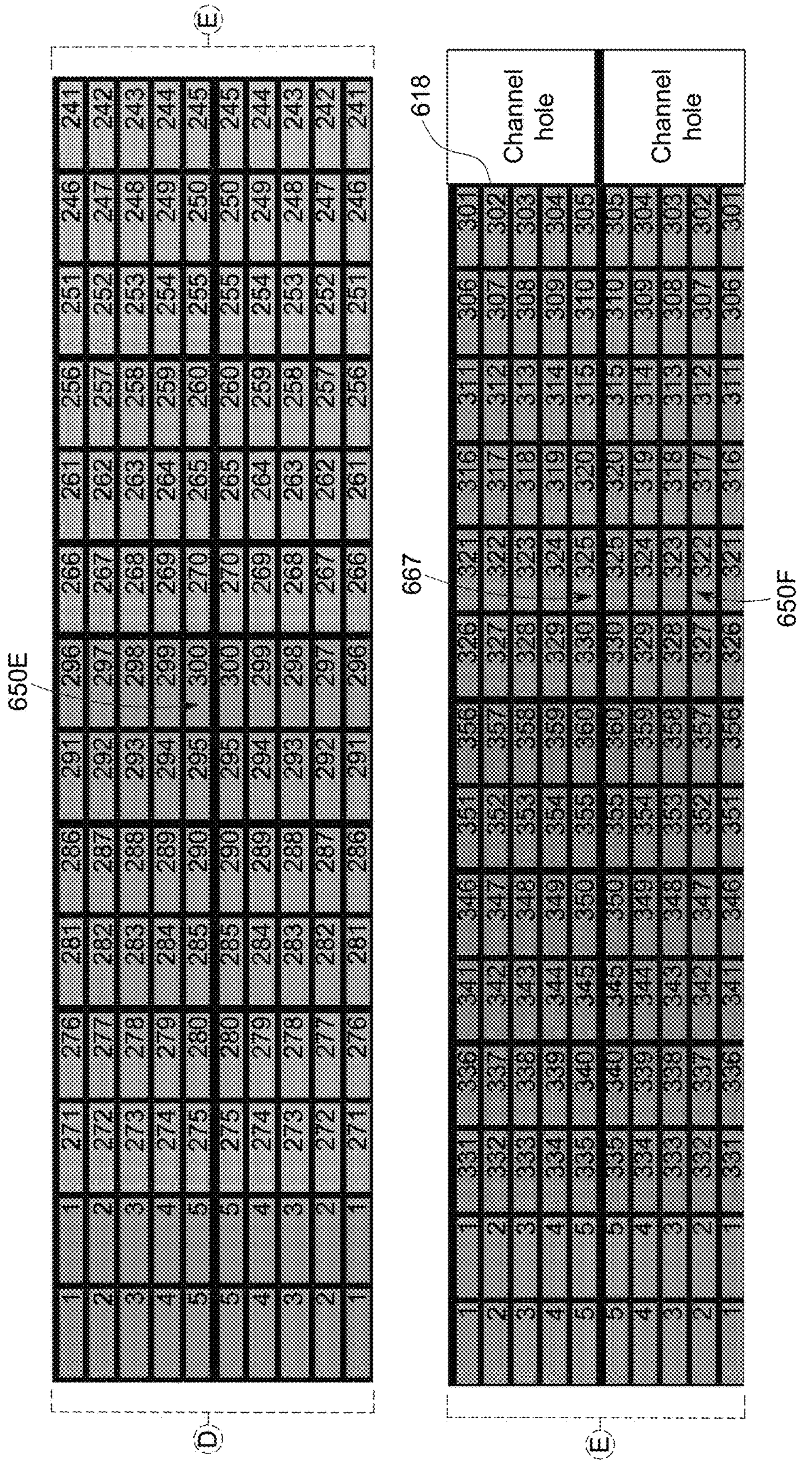

As shown in FIG. 6D, the array 605 is subjected to a series of additional lithography and etch steps, wherein a plurality of openings 621 are formed through the lithography mask (not shown) to further increase a depth of the affected contact openings. As shown, deeper sections 650E, 650F are etched, resulting in the device 500 shown in FIG. 6E. As demonstrated, an average depth of the contact openings of the deeper section 650F is the greatest in the array 605. In general, the depth of the contact openings of the array 605 increases between the first end 616 and the second end 618 of the array 605. Furthermore, the depth of the contact openings within each deeper section 650A-650F increases towards a center 667 thereof. Advantageously, the direct wordline contact-last staircase+chop approach demonstrated in FIGS. 6A-6E can reduce the max delta pairs from 116 to 59, reduce the number of lithography passes from 10 to 9, and reduce contact length from 152 μm to 82 μm (e.g., assuming 3 tiers, *360 ON pairs, and *5 μm block width).

Figure 7A:
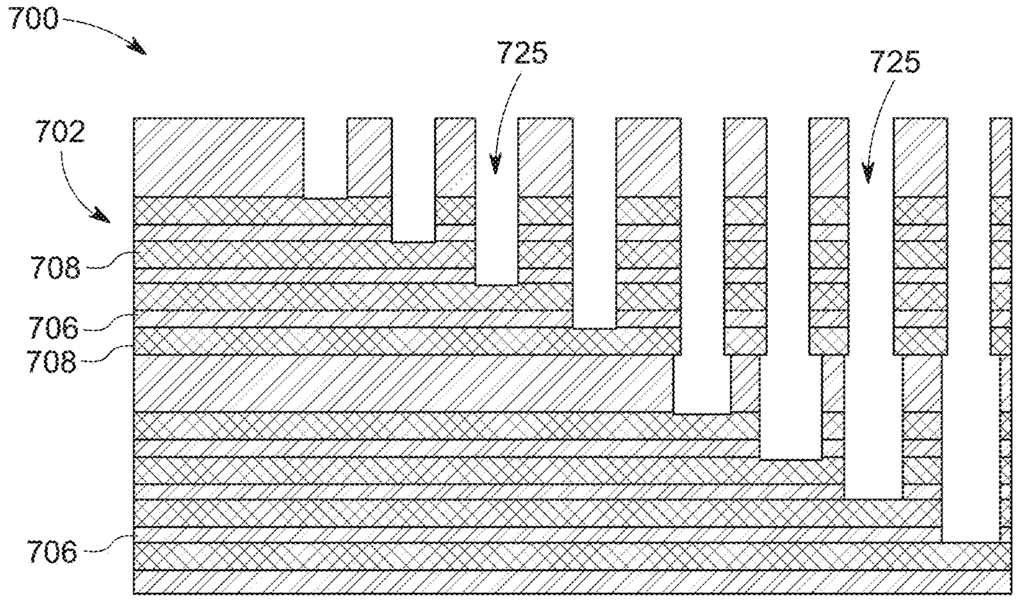
FIG. 7A illustrates a side view of a plurality of contact openings formed in a film stack, according to embodiments of the present disclosure.
Figure 7B:
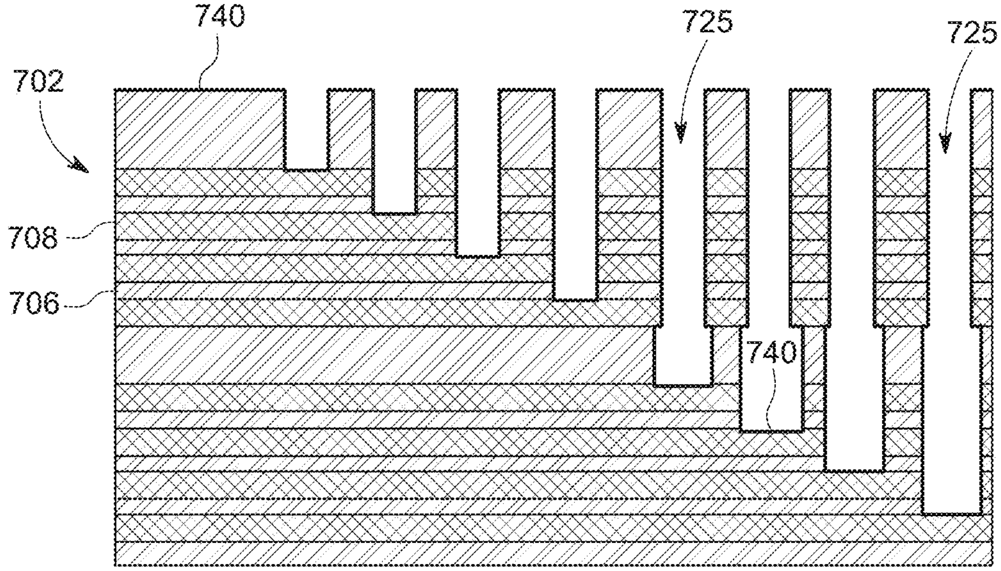
FIG. 7B illustrates a side view of a liner formed within a plurality of contact openings formed in a film stack, according to embodiments of the present disclosure.

After the contact openings described in one or more of the embodiments above are completed, a non-limiting process demonstrated in FIGS. 7A-7F may be carried out to form a plurality of wordlines in the device. As shown in FIG. 7A, the device 700 may include a film stack 702 having a plurality of first layers 706 alternating with a plurality of second layers 708. A sacrificial gapfill may be removed from one or more of contact openings 725, such as the four deepest contact openings, and a liner 740 may then be formed over the device 700, including within each of the contact openings 725, as shown in FIG. 7B. In some embodiments, the liner 740 may be an oxide layer (e.g., SiO, AlO, etc.), which is formed (e.g., via atomic layer deposition (ALD)) along all the exposed surfaces of the device 700.

Figure 7C:
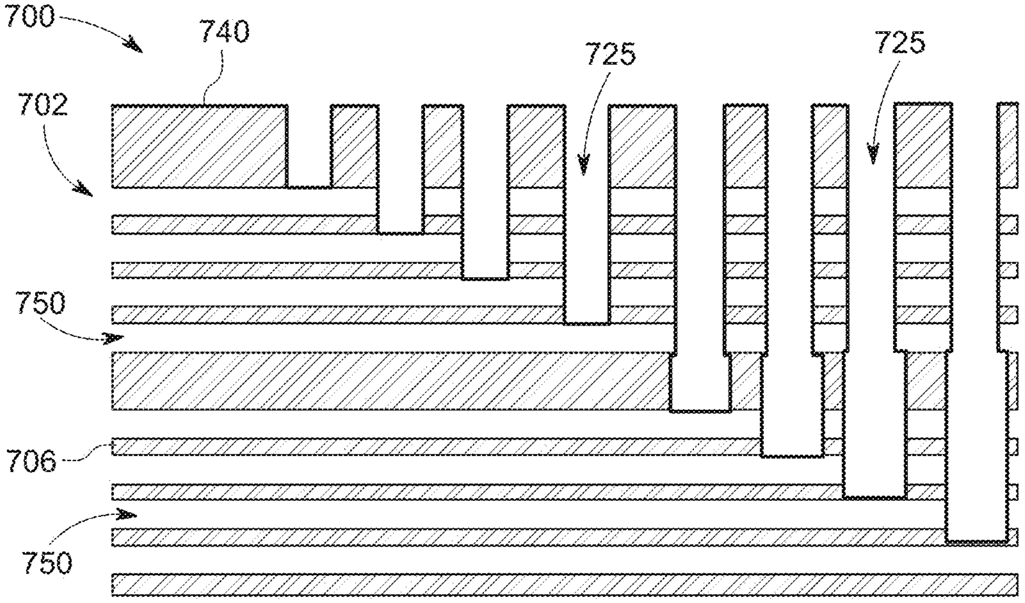
FIG. 7C illustrates a side view of a film stack following removal of a plurality of second layers from the film stack, according to embodiments of the present disclosure.

As demonstrated in FIG. 7C, the second layers 708 of the film stack 702 are removed, e.g., by a horizontal wet etch process, to form a plurality of wordline openings 750 in the device 700. The first layers 706 are generally unaffected by the wet etch, as is the liner 740, which remains within the contact openings 725.

Figure 7D:
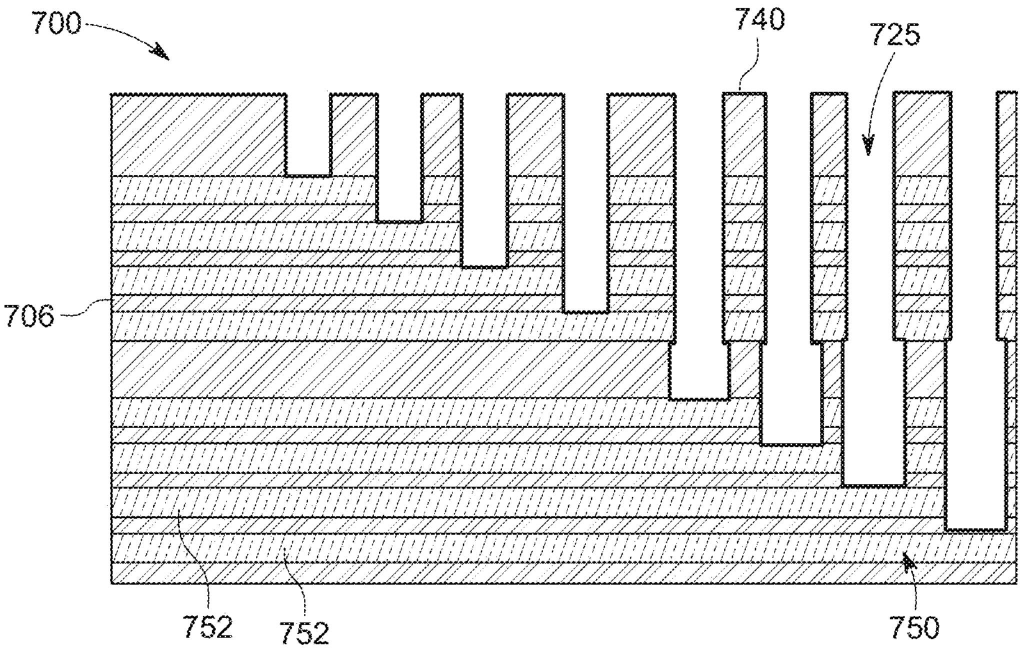
FIG. 7D illustrates a side view of a film stack following formation of a plurality of wordlines, according to embodiments of the present disclosure.
Figure 7E:
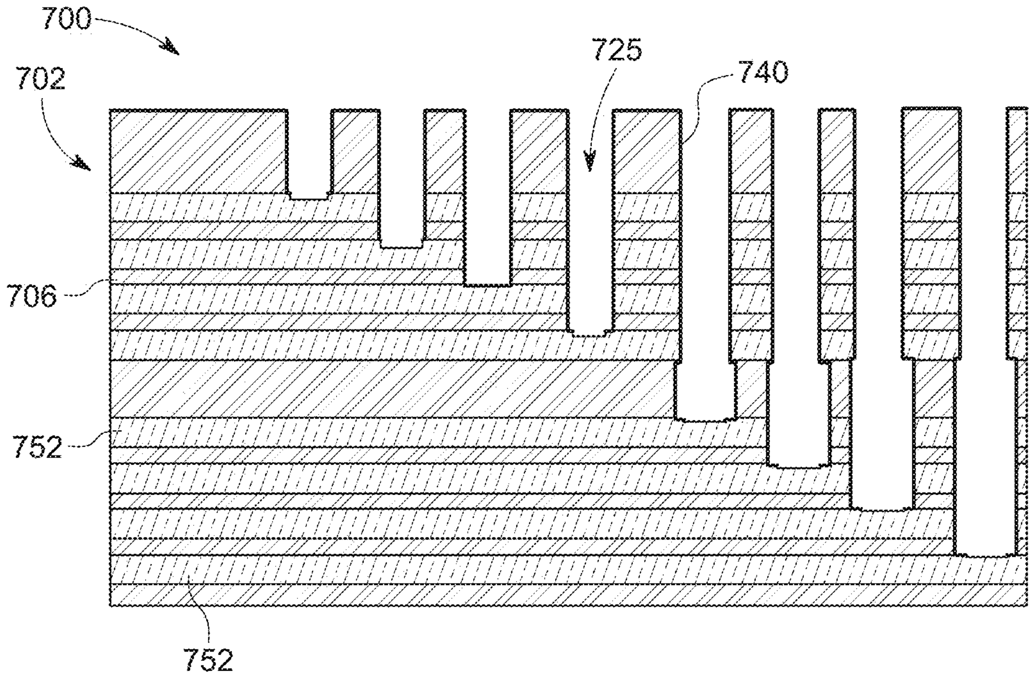
FIG. 7E illustrates a side view of a film stack following removal of a portion of a liner from within a plurality of contact openings, according to embodiments of the present disclosure.

A plurality of wordlines 752 may then be formed in the device 700, as demonstrated in FIG. 7D, by depositing a first conductive material (e.g., tungsten (W) or molybdenum (Mo)) within the plurality of wordline openings 750. The liner 740 may then be removed from the bottom of the contact openings 725, as shown in FIG. 7E. In some embodiments, the liner 740 may be vertically etched to expose an upper surface of one or more of the plurality of wordlines 752. As shown, the liner 740 remains along the sidewall of the contact openings 725. In some embodiments, the liner 740 is also removed from the upper surface of the second film stack 702.

Figure 7F:
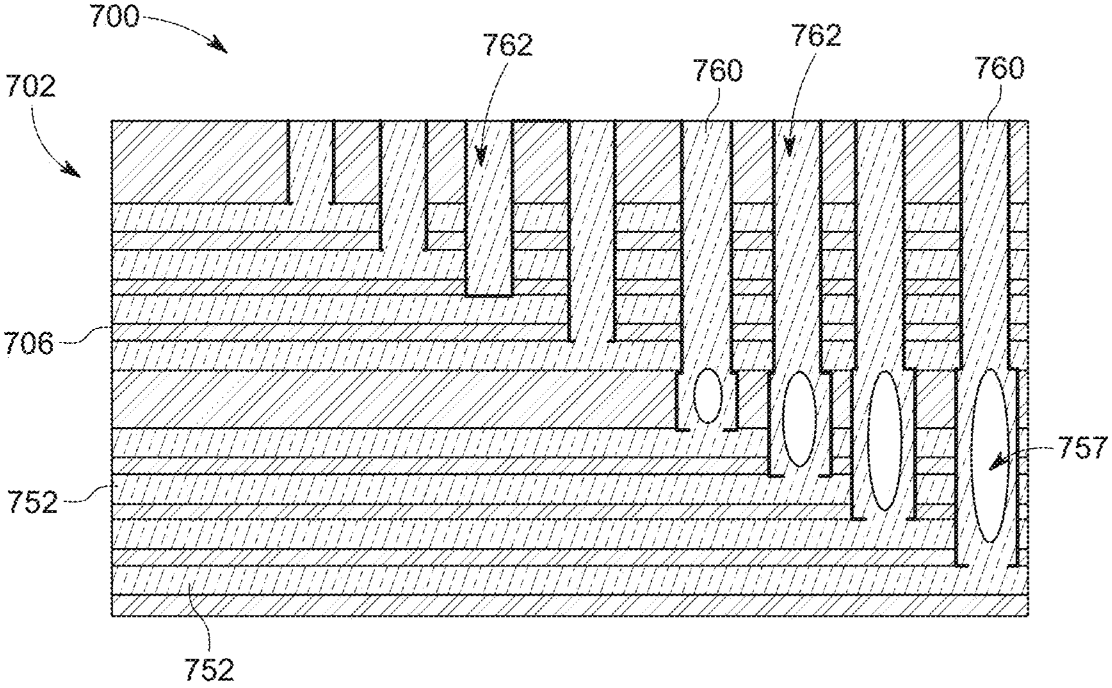
FIG. 7F illustrates a side view of a film stack following formation of a plurality of wordline contacts, according to embodiments of the present disclosure.

As demonstrated in FIG. 7F, a second conductive material 760 may be deposited within the contact openings 725 to form a plurality of wordline contacts 762. In some embodiments, the second conductive material 760 may be tungsten, which is deposited, e.g., via atomic layer deposition, together with titanium nitride (TiN), atop the upper surface of the plurality of wordlines 752. The second conductive material 760 may be separated from the first layers 706 by the liner 740 along the sidewall of the contact openings 725. In some embodiments, a void 757 in the second conductive material 760 may be present in one or more of the wordline contacts 762 due to the aspect ratio of these contact openings 725.

Figure 8:
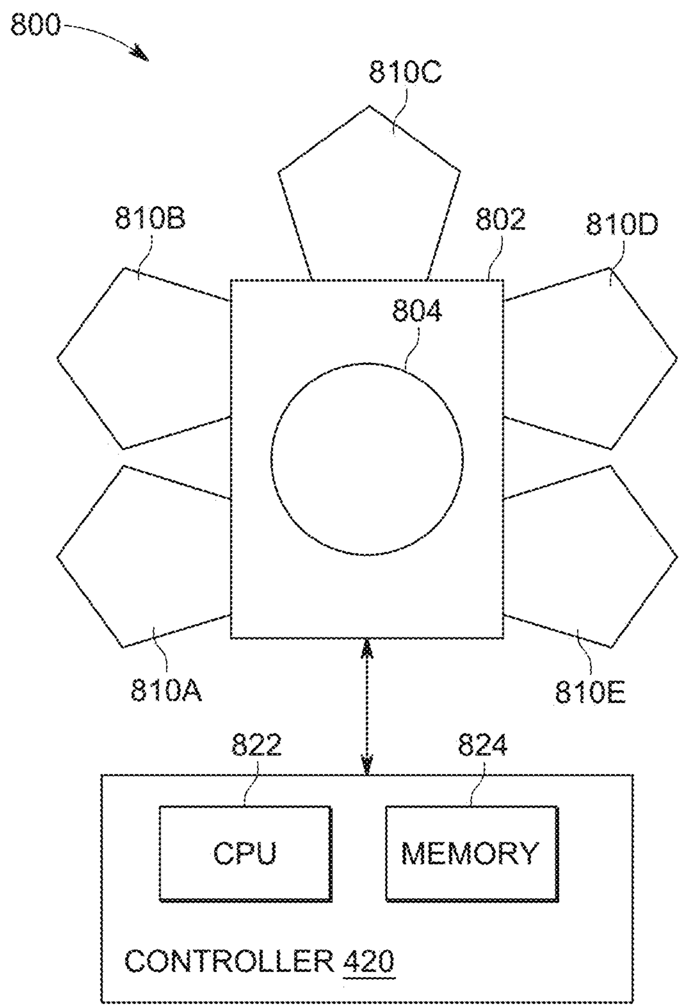
FIG. 8 is a schematic diagram of an example system according to embodiments of the present disclosure.

FIG. 8 shows a schematic of an example system/apparatus 800 according to embodiments of the disclosure. Operation of the system 800 will be described with reference to the devices 100-700 described herein. In some embodiments, the system 800 may be a cluster tool operable to perform processes necessary to form the devices. Although non-limiting, the system 800 may include at least one central transfer station/chamber 802 and one or more robots 804 within the transfer station/chamber 802, wherein the robot 804 is operable to move a robot blade and a wafer to and from each of a plurality of processing chambers 810A-810N connected with, or positioned adjacent to, the transfer station/chamber 802. In some embodiments, the system 800 may include any variety of suitable chambers including, but not limited to, a first deposition chamber 810A, a first etch chamber 810B, a second deposition chamber 810C, a second etch chamber 810D, and a third deposition chamber 810E. The first deposition chamber 810A, the second deposition chamber 810C, and the third deposition chamber 810E may include one or more of an atomic layer deposition chamber, a plasma enhanced atomic layer deposition chamber, a chemical vapor deposition chamber, a plasma enhanced chemical vapor deposition chamber, or a physical deposition. The particular arrangement of process chambers and components can be varied depending on the cluster tool, and should not be taken as limiting the scope of the disclosure. For example, in alternative embodiments, only a single deposition chamber and/or only a single etch chamber is present in the system 800. In another example, one or more of the deposition chambers may include multiple process regions within a same chamber, which permits a common supply of gases, common pressure control, and common process gas exhaust/pumping. Modular design of the system enables rapid conversion from one configuration to any other.

In some embodiments, the first deposition chamber 810A may be used to deposit film stacks 102-702 as alternating first and second layers. The first deposition chamber 810A may be further used to deposit the plurality of masking and lithography layers.

The first etch chamber 810B may be used to etch the plurality of masking layers and to form the plurality of contact openings in devices 100-700. The first etch chamber 810B may be further used to punch through the liner 740 along the bottom of each contact opening 725 of the device 700.

The second deposition chamber 810C may be used to deposit the liner 740 over the device 700, including within each contact opening 725, and to deposit the sacrificial gapfill within plurality of contact openings 725.

The second etch chamber 810D may be used to remove the first layers 706 and to form the plurality of wordline openings 750 in the film stack 703. In some embodiments, a wet etch process may be performed in the second etch chamber 810D.

The third deposition chamber 810E may be used to form the plurality of wordlines 752 by depositing the first conductive material 754 within the plurality of wordline openings 750. The third deposition chamber 810E (or another deposition chamber) may be further used to deposit the second conductive material 760 within the plurality of contact openings 725 to form the plurality of wordline contacts 762 within the device 700.

A system controller 820 is in communication with the robot 404, the transfer station/chamber 802, and the plurality of processing chambers 810A-810E. The system controller 820 can be any suitable component that can control the processing chambers 810A-810E and robot(s) 804, as well as the processes occurring within the process chambers 810A-810E. For example, the system controller 820 can be a computer including a central processor 822, memory 824, suitable circuits/logic/instructions, and storage.

Processes or instructions may generally be stored in the memory 824 of the system controller 820 as a software routine that, when executed by the processor 822, causes the processing chambers 810A-810N to perform processes of the present disclosure. The software routine may also be stored and/or executed by a second processor (not shown) that is remotely located from the hardware being controlled by the processor 822. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 822, transforms the general purpose computer into a specific purpose computer (controller) that controls the chamber operation such that the processes are performed.

Figure 9:
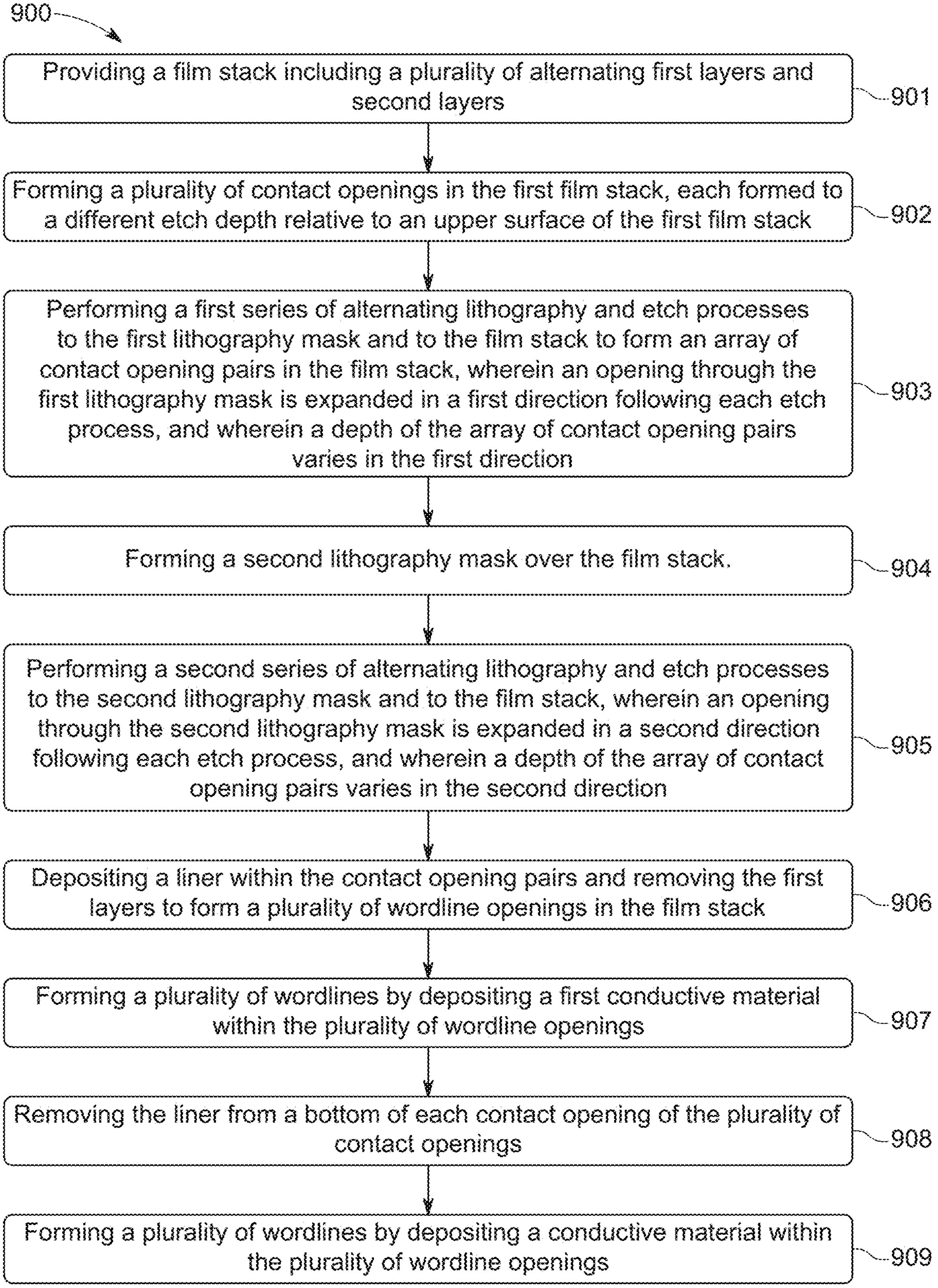
FIG. 9 depicts a process flow of a method for forming exemplary devices, according to embodiments of the present disclosure.

Turning now to FIG. 9, a process 900 according to embodiments of the present disclosure is shown. At block 901, the process 900 may include providing a film stack including a plurality of alternating first layers and second layers. Providing a film stack comprising a plurality of alternating first layers and second layers. In some embodiments, the first layers of the plurality of alternating first layers and second layers are a dielectric material, and the second layers of the plurality of alternating first layers and second layers are a dielectric material or a conductive material. In some embodiments, the first layers of the plurality of alternating first layers and second layers are silicon oxide, and the second layers of the plurality of alternating first layers and second layers are silicon nitride.

At block 902, the process 900 may include forming a first lithography mask over the film stack. In some embodiments, a hardmask may first be formed over the film stack. In some embodiments, the hardmask is a layer of tungsten formed directly atop an upper surface of the film stack. In some embodiments, a photoresist mask may then be formed over the hardmask, and a plurality of hardmask openings may be patterned (etched) though the photoresist mask to expose an upper surface of the hardmask. In some embodiments, the hardmask may then be etched through the hardmask openings of the photoresist mask to form a plurality of openings therethrough. In some embodiments, the first photoresist mask may then be formed over the device without being formed over a portion of the hardmask or over some of the openings.

At block 903, the process 900 may further include performing a first series of alternating lithography and etch processes to the first lithography mask and to the film stack to form an array of contact opening pairs in the film stack, wherein an opening through the first lithography mask is expanded in a first direction following each etch process, and wherein a depth of the array of contact opening pairs varies in the first direction.

At block 904, the process 900 may further include forming a second lithography mask over the film stack.

At block 905, the process 900 may further include performing a second series of alternating lithography and etch processes to the second lithography mask and to the film stack, wherein an opening through the second lithography mask is expanded in a second direction following each etch process of the second series of alternating lithography and etch processes, and wherein the depth of the array of contact opening pairs varies in the second direction.

At block 906, the process 900 may further include depositing a liner and removing the first layers to form a plurality of wordline openings in the film stack. In some embodiments, the first layers are removed using a horizontal wet etch process to selectively remove the first layers without removing the second layers.

At block 907, the process 900 may further include forming a plurality of wordlines by depositing a first conductive material within the plurality of wordline openings. In some embodiments, the first conductive material is W or Mo.

At block 908, the process 900 may include removing the liner from a bottom of each contact opening of the plurality of contact openings. In some embodiments, removing the liner from the bottom of each contact opening of the first and second plurality of contact openings exposes an upper surface of one or more of the plurality of wordlines. In some embodiments, the liner is removed from the bottom of each contact opening of the first and second plurality of contact openings without removing the liner from a sidewall of each contact opening of the first and second plurality of contact openings.

At block 909, the process 900 may include depositing a second conductive material within the first and second plurality of contact openings to form a plurality of wordline contacts. In some embodiments, the second conductive material may be W, which is deposited together with TiN, atop an upper surface of the plurality of wordlines.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

For the sake of convenience and clarity, terms such as “top,” “bottom,” “upper,” “lower,” “vertical,” “horizontal,” “lateral,” and “longitudinal” will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word “a” or “an” is to be understood as including plural elements or operations, until such exclusion is explicitly recited. Furthermore, references to “one embodiment” of the present disclosure are not intended as limiting. Additional embodiments may also incorporate the recited features.

Furthermore, the terms “substantial” or “substantially,” as well as the terms “approximate” or “approximately,” can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed “on,” “over” or “atop” another element, the element can be directly on the other element or intervening elements may also be present. In contrast, when an element is referred to as being “directly on,” “directly over” or “directly atop” another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:

forming a first lithography mask over a film stack comprising a plurality of alternating first layers and second layers;

forming an array of contact opening pairs in the film stack, wherein an opening through the first lithography mask is expanded in a first direction following each etch process of a first series of alternating lithography and etch processes, and wherein a depth of the array of contact opening pairs varies in the first direction;

forming a second lithography mask over the film stack; and expanding an opening through the second lithography mask in a second direction following each etch process of a second series of alternating lithography and etch processes, and wherein the depth of the array of contact opening pairs varies in the second direction.

2. The method of claim 1, further comprising defining the film stack by a first main side opposite a second main side, and a first end opposite a second end, wherein a central axis extends in the second direction between the first end and the second end, wherein a first contact opening of each contact opening pair of the array of contact opening pairs is located on a first side of the central axis, and wherein a second contact opening of each contact opening pair of the array of contact opening pairs is located on a second side of the central axis.

3. The method of claim 2, wherein forming the array of contact opening pairs comprises etching the first contact opening of each contact opening pair of the array of contact opening pairs to have a same depth as a corresponding second contact opening of each contact pair of the array of contact pairs.

4. The method of claim 2, wherein the depth, in the first direction, of the array of contact opening pairs is greatest directly adjacent the central axis.

5. The method of claim 1, further comprising:

forming a liner within each contact opening of the array of contact opening pairs;

removing the first layers to form a plurality of wordline openings in the film stack;

forming a plurality of wordlines by depositing a first conductive material within the plurality of wordline openings;

removing the liner from a bottom of each contact opening of the array of contact opening pairs; and depositing a second conductive material within the array of contact opening pairs to form a plurality of wordline contacts.

6. A method of forming a 3D NAND device, comprising:

forming a patterned hardmask and a first lithography mask over a film stack, wherein the film stack comprises a plurality of alternating first layers and second layers;

etching the film stack, through an opening of the first lithography mask, to form a first plurality of contact openings in the film stack;

expanding the opening of the first lithography mask in a first direction;

etching the film stack, through the opening of the first lithography mask, to form a second plurality of contact openings in the film stack, wherein a depth of the first plurality of contact openings increases as the second plurality of contact openings are formed;

forming a second lithography mask over the film stack;

forming an opening through the second lithography mask;

etching the film stack, through the opening of the second lithography mask, to increase a depth of a subset of the first plurality of contact openings and a subset of the second plurality of contact openings;

expanding the opening of the second lithography mask in a second direction, wherein the second direction is orthogonal to the first direction; and etching the film stack, through the opening of the second lithography mask, to increase a depth of a second subset of the first plurality of contact openings and a second subset of the second plurality of contact openings, wherein the depth of the first and second plurality of contact openings varies in the first direction and the second direction.

7. The method of claim 6, further comprising increasing the depth of the subset of the first plurality of contact openings and of the subset of the second plurality of contact openings as the depth of the second subset of the first plurality of contact openings and the depth of the second subset of the second plurality of contact openings is increased.

8. The method of claim 6, further comprising:

forming a third lithography mask over the film stack, wherein the third lithography mask has a plurality of openings to expose one or more first portions of first and second plurality of contact openings; and etching the film stack through the plurality of openings of the third lithography mask to further increase the etch depth of the one or more first portions of first and second plurality of contact openings.

9. The method of claim 8, further comprising:

forming a fourth lithography mask over the film stack, wherein the fourth lithography mask has a plurality of openings to expose one or more second portions of the first and second plurality of contact openings; and etching the film stack through the plurality of openings of the fourth lithography mask to further increase the etch depth of the one or more second portions of first and second plurality of contact openings.

10. The method of claim 9, wherein etching the film stack through the plurality of openings of the fourth lithography mask further increases the etch depth of the one or more first portions of first and second plurality of contact openings.

11. The method of claim 6, further comprising:

removing the first layers to form a plurality of wordline openings in the film stack;

forming a plurality of wordlines by depositing a first conductive material within the plurality of wordline openings;

removing a liner from a bottom of the first and second plurality of contact openings; and depositing a conductive material within the first and second plurality of contact openings to form a plurality of wordline contacts.

12. The method of claim 6, wherein forming the patterned hardmask comprises:

depositing a hardmask directly atop an upper surface of the film stack; and forming a plurality of openings through the hardmask to expose the upper surface of the film stack.

13. The method of claim 12, wherein forming the plurality of openings through the hardmask comprises:

forming a lithography mask over the hardmask;

etching a plurality of hardmask openings through the lithography mask to expose an upper surface of the hardmask; and etching through the plurality of hardmask openings to selectively expose the upper surface of the film stack.

14. The method of claim 6, wherein the hardmask is a tungsten hardmask.

15. A system, comprising:

a processor;

a memory storing instructions executable by the processor to:

form a patterned hardmask and a first lithography mask over a film stack, wherein the film stack comprises a plurality of alternating first layers and second layers;

etch the film stack, through an opening of the first lithography mask, to form a first plurality of contact openings in the film stack;

expanding the opening of the first lithography mask in a first direction;

etch the film stack, through the opening of the first lithography mask, to form a second plurality of contact openings in the film stack, wherein a depth of the first plurality of contact openings increases as the second plurality of contact openings are formed;

etch the film stack, through an opening of a second lithography mask formed over the film stack, to increase a depth of a subset of the first plurality of contact openings and a subset of the second plurality of contact openings;

expanding the opening of the second lithography mask in a second direction, wherein the second direction is orthogonal to the first direction; and etch the film stack, through the opening of the second lithography mask, to increase a depth of a second subset of the first plurality of contact openings and a second subset of the second plurality of contact openings, wherein the depth of the first and second plurality of contact openings varies in the first direction and the second direction.

16. The system of claim 15, further comprising instructions executable by the processor to increase the depth of the subset of the first plurality of contact openings and of the subset of the second plurality of contact openings as the depth of the second subset of the first plurality of contact openings and the depth of the second subset of the second plurality of contact openings is increased.

17. The system of claim 15, further comprising instructions executable by the processor to:

form a third lithography mask over the film stack, wherein the third lithography mask has a plurality of openings to expose one or more first portions of first and second plurality of contact openings; and etch the film stack through the plurality of openings of the third lithography mask to further increase the etch depth of the one or more first portions of first and second plurality of contact openings.

18. The system of claim 15, further comprising instructions executable by the processor to:

form a fourth lithography mask over the film stack, wherein the fourth lithography mask has a plurality of openings to expose one or more second portions of the first and second plurality of contact openings; and etch the film stack through the plurality of openings of the fourth lithography mask to further increase the etch depth of the one or more second portions of first and second plurality of contact openings.

19. The system of claim 18, wherein etching the film stack through the plurality of openings of the fourth lithography mask further increases the etch depth of the one or more first portions of first and second plurality of contact openings.

20. The system of claim 15, further comprising instructions executable by the processor to:

form a plurality of wordlines by depositing a first conductive material within a plurality of wordline openings;

remove a liner from a bottom of the first and second plurality of contact openings; and deposit a second conductive material within the first and second plurality of contact openings to form a plurality of wordline contacts.

* * * * *